US010505492B2

(12) United States Patent
Hudson et al.

(10) Patent No.: US 10,505,492 B2
(45) Date of Patent: Dec. 10, 2019

(54) BUILDING INTEGRATED PHOTOVOLTAIC ROOFING ASSEMBLIES AND ASSOCIATED SYSTEMS AND METHODS

(71) Applicant: SolarCity Corporation, San Mateo, CA (US)

(72) Inventors: Tyrus Hawkes Hudson, Petaluma, CA (US); Charles Almy, Berkeley, CA (US); Martin Seery, San Rafael, CA (US); Daniel Preston Flanigan, Petaluma, CA (US); Ryan Devine, Richmond, CA (US); River Broussard, Santa Rosa, CA (US)

(73) Assignee: SolarCity Corporation, San Mateo, CA (US)

( * ) Notice: Subject to any disclaimer, the term of this patent is extended or adjusted under 35 U.S.C. 154(b) by 335 days.

(21) Appl. No.: 15/246,486

(22) Filed: Aug. 24, 2016

(65) Prior Publication Data

US 2017/0237387 A1    Aug. 17, 2017

Related U.S. Application Data

(60) Provisional application No. 62/374,704, filed on Aug. 12, 2016, provisional application No. 62/357,329, (Continued)

(51) Int. Cl.
*H02S 20/23* (2014.01)
*H02S 20/25* (2014.01)
(Continued)

(52) U.S. Cl.
CPC ............... *H02S 20/23* (2014.12); *E04D 3/30* (2013.01); *E04D 3/36* (2013.01); *E04D 3/361* (2013.01);
(Continued)

(58) Field of Classification Search
CPC .......... H02S 20/23; H02S 20/25; F24S 20/67; F24S 25/40; E04D 3/36; E04D 3/361; E04D 3/364; E04D 3/366
See application file for complete search history.

(56) References Cited

U.S. PATENT DOCUMENTS 1,706,924 A    3/1929 Kane
2,408,557 A *  10/1946 Huntington ............. E04D 3/366
                                                         52/466
(Continued)

FOREIGN PATENT DOCUMENTS

AT      A326979 A    4/1980
AT      A466580 A    1/1982
(Continued)

OTHER PUBLICATIONS

Building-Integrated Photovoltaic Designs for Commercial and Institutional Structures, by Patrina Eiffert and Gregory J. Kiss, published by Diane Publishing Co., Feb. 2000, pp. 20-22 (available at https://www.nrel.gov/docs/fy00osti/25272.pdf, last accessed Nov. 26, 2018).*
(Continued)

*Primary Examiner* — Robert Canfield
*Assistant Examiner* — Charissa Ahmad
(74) *Attorney, Agent, or Firm* — Kilpatrick Townsend & Stockton LLP

(57) ABSTRACT

Building integrated photovoltaic (BIPV) systems provide for solar panel arrays that can be aesthetically pleasing and appear seamless to an observer. BIPV systems can be on-roof systems, elevated from the surface of a roof, being flush or forming a substantively uniform plane with roof panels or other panels mimicking a solar panel appearance. Pans supporting BIPV solar panels can be coupled by standing seams to other photovoltaic-supporting pans or pans supporting non-photovoltaic structures, having both functional and aesthetic advantages. In some configurations,
(Continued)

inverted seams can couple photovoltaic-supporting pans and non-photovoltaic structures, forming a substantively planar surface. In some configurations, the appearance of BIPV systems can be particularly aesthetically pleasing and generally seamless to an observer.

20 Claims, 45 Drawing Sheets

Related U.S. Application Data filed on Jun. 30, 2016, provisional application No. 62/354,599, filed on Jun. 24, 2016, provisional application No. 62/313,678, filed on Mar. 25, 2016, provisional application No. 62/308,828, filed on Mar. 15, 2016, provisional application No. 62/294,743, filed on Feb. 12, 2016.

(51) Int. Cl.

| | |
|---|---|
| *E04D 3/36* | (2006.01) |
| *E04D 3/361* | (2006.01) |
| *E04D 3/366* | (2006.01) |
| *F24S 20/67* | (2018.01) |
| *F24S 25/40* | (2018.01) |
| *H02S 30/10* | (2014.01) |
| *H01L 31/0443* | (2014.01) |
| *H02S 40/40* | (2014.01) |
| *H02S 40/42* | (2014.01) |
| *E04D 3/363* | (2006.01) |
| *E04D 3/367* | (2006.01) |
| *E04D 12/00* | (2006.01) |
| *E04D 13/17* | (2006.01) |
| *E04D 3/30* | (2006.01) |
| *E04D 3/40* | (2006.01) |

(52) U.S. Cl.
CPC ............ *E04D 3/363* (2013.01); *E04D 3/364* (2013.01); *E04D 3/366* (2013.01); *E04D 3/40* (2013.01); *E04D 12/004* (2013.01); *E04D 13/17* (2013.01); *F24S 20/67* (2018.05); *F24S 25/40* (2018.05); *H01L 31/0443* (2014.12); *H02S 20/25* (2014.12); *H02S 30/10* (2014.12); *H02S 40/40* (2014.12); *H02S 40/425* (2014.12); *Y02A 30/62* (2018.01); *Y02B 10/12* (2013.01); *Y02B 10/20* (2013.01); *Y02E 10/44* (2013.01); *Y02E 10/47* (2013.01); *Y02E 10/50* (2013.01)

(56) References Cited

U.S. PATENT DOCUMENTS

| | | | | |
|---|---|---|---|---|
| 2,855,871 | A * | 10/1958 | Huntington | E04D 3/366 52/461 |
| 2,997,142 | A * | 8/1961 | Engholm | E04B 9/04 52/392 |
| 3,111,788 | A * | 11/1963 | Ouellet | E04B 7/107 52/537 |
| 4,009,548 | A * | 3/1977 | Hicks | E04D 3/366 52/469 |
| 4,184,299 | A * | 1/1980 | East | E04D 3/361 52/463 |
| 4,189,881 | A * | 2/1980 | Hawley | E04D 3/366 52/91.3 |
| 4,213,282 | A * | 7/1980 | Heckelsberg | E04D 3/362 52/404.2 |
| 4,244,355 | A | 1/1981 | Stout | |
| 4,336,413 | A | 6/1982 | Tourneux | |
| 4,361,998 | A * | 12/1982 | Ellison | E04D 3/363 52/463 |
| 4,389,533 | A | 6/1983 | Ames | |
| 4,392,009 | A | 7/1983 | Napoli | |
| 4,433,200 | A | 2/1984 | Jester et al. | |
| 4,439,969 | A | 4/1984 | Bartlett | |
| 4,636,577 | A * | 1/1987 | Peterpaul | F24S 20/67 136/206 |
| 4,641,475 | A * | 2/1987 | Berridge | E04D 3/366 52/394 |
| 4,649,680 | A * | 3/1987 | Weisner | E04D 3/28 52/200 |
| 4,649,684 | A * | 3/1987 | Petree | E04D 3/366 52/395 |
| 4,860,511 | A * | 8/1989 | Weisner | E04D 3/28 52/200 |
| 5,092,939 | A | 3/1992 | Nath et al. | |
| 5,164,020 | A * | 11/1992 | Wagner | E04D 3/366 136/251 |
| 5,230,192 | A * | 7/1993 | Webb | E04D 13/172 52/302.3 |
| 5,232,518 | A * | 8/1993 | Nath | E04D 3/3605 136/251 |
| 5,295,340 | A | 3/1994 | Collins | |
| 5,363,624 | A | 11/1994 | Cotter | |
| 5,392,583 | A * | 2/1995 | Gregory | E04D 3/365 52/408 |
| 5,394,666 | A | 3/1995 | Zahner, III | |
| 5,409,549 | A | 4/1995 | Mori | |
| 5,479,753 | A * | 1/1996 | Williams | E04D 3/38 52/411 |
| 5,505,788 | A * | 4/1996 | Dinwoodie | H02S 20/23 136/246 |
| 5,571,338 | A * | 11/1996 | Kadonome | E04D 3/3608 136/251 |
| 5,589,006 | A * | 12/1996 | Itoyama | E04D 3/366 136/248 |
| 5,651,837 | A | 7/1997 | Ohtsuka et al. | |
| 5,697,192 | A | 12/1997 | Inoue | |
| 5,768,831 | A | 6/1998 | Melchior | |
| 5,935,343 | A * | 8/1999 | Hollick | H02S 20/23 136/246 |
| 5,968,287 | A * | 10/1999 | Nath | H01L 31/048 136/251 |
| 6,046,399 | A * | 4/2000 | Kapner | H02S 20/23 136/244 |
| 6,065,256 | A | 5/2000 | Joko | |
| 6,119,415 | A * | 9/2000 | Rinklake | E04D 12/00 52/173.3 |
| 6,201,179 | B1 * | 3/2001 | Dalacu | H01L 31/052 136/244 |
| 6,269,596 | B1 | 8/2001 | Ohtsuka et al. | |
| 6,354,045 | B1 * | 3/2002 | Boone | E04D 3/3608 52/395 |
| 6,365,824 | B1 | 4/2002 | Nakazima et al. | |
| 6,415,581 | B1 * | 7/2002 | Shipman | E04B 5/40 428/593 |
| 6,501,013 | B1 | 12/2002 | Dinwoodie | |
| 6,959,517 | B2 * | 11/2005 | Poddany | E06B 1/6015 52/173.3 |
| 7,210,273 | B2 | 5/2007 | Zahner, III | |
| 7,328,534 | B2 | 2/2008 | Dinwoodie | |
| 7,592,537 | B1 | 9/2009 | West | |
| 8,511,006 | B2 | 8/2013 | Reisdorf et al. | |
| 8,522,493 | B1 | 9/2013 | Rogers | |
| 8,555,569 | B2 | 10/2013 | Crasnianski | |
| 8,745,935 | B2 | 6/2014 | DuPont et al. | |
| 8,782,972 | B2 | 7/2014 | Grieco | |
| 8,833,005 | B1 | 9/2014 | Croft et al. | |
| 8,904,718 | B2 | 12/2014 | Schick et al. | |
| 8,910,433 | B2 | 12/2014 | Kacandes | |
| 8,991,116 | B2 | 3/2015 | Richardson | |
| 9,080,792 | B2 | 7/2015 | Patton et al. | |
| 9,169,646 | B2 | 10/2015 | Rodrigues et al. | |
| 9,184,325 | B2 | 11/2015 | Schulze et al. | |
| 9,273,885 | B2 | 3/2016 | Rodriguez et al. | |
| 9,294,032 | B2 * | 3/2016 | Richardson | H02S 20/23 |

(56) References Cited

U.S. PATENT DOCUMENTS

| | | | | |
|---|---|---|---|---|
| 9,541,308 | B2* | 1/2017 | Pierson | H02S 20/23 |
| 2005/0161074 | A1* | 7/2005 | Garvison | H01L 31/048 |
| | | | | 136/246 |
| 2007/0289243 | A1* | 12/2007 | Arguelles | E04D 1/045 |
| | | | | 52/518 |
| 2009/0044854 | A1* | 2/2009 | Placer | F24S 20/67 |
| | | | | 136/251 |
| 2010/0307085 | A1* | 12/2010 | Resso | E04D 3/366 |
| | | | | 52/302.1 |
| 2010/0313499 | A1 | 12/2010 | Gangemi | |
| 2010/0313501 | A1* | 12/2010 | Gangemi | F24S 25/40 |
| | | | | 52/173.3 |
| 2011/0203639 | A1* | 8/2011 | Elliott | H02S 20/23 |
| | | | | 136/246 |
| 2012/0024283 | A1* | 2/2012 | Skillman | F24J 2/50 |
| | | | | 126/708 |
| 2012/0234378 | A1* | 9/2012 | West | H02S 20/23 |
| | | | | 136/251 |
| 2012/0240490 | A1* | 9/2012 | Gangemi | F24S 25/40 |
| | | | | 52/173.3 |
| 2012/0298817 | A1* | 11/2012 | West | H02S 20/00 |
| | | | | 248/220.22 |
| 2012/0301661 | A1* | 11/2012 | West | H02S 20/00 |
| | | | | 428/99 |
| 2013/0167472 | A1 | 7/2013 | Jenkins et al. | |
| 2014/0020308 | A1 | 1/2014 | Heisler | |
| 2014/0102556 | A1* | 4/2014 | Malpas | H02S 20/23 |
| | | | | 137/360 |
| 2014/0130847 | A1* | 5/2014 | West | B23P 19/04 |
| | | | | 136/251 |
| 2014/0150843 | A1 | 6/2014 | Pearce et al. | |
| 2014/0366464 | A1* | 12/2014 | Rodrigues | H02S 40/32 |
| | | | | 52/173.3 |
| 2016/0308489 | A1* | 10/2016 | Hudson | H02S 40/34 |
| 2017/0237389 | A1 | 8/2017 | Hudson et al. | |
| 2017/0237390 | A1* | 8/2017 | Hudson | E04D 3/366 |
| | | | | 136/251 |

FOREIGN PATENT DOCUMENTS

| | | |
|---|---|---|
| AT | A474980 A | 1/1982 |
| AT | A14622003 A | 1/2005 |
| AT | 10588 U1 | 6/2009 |
| AT | 506953 A4 | 1/2010 |
| AT | 506959 A4 | 1/2010 |
| AT | 507681 A4 | 7/2010 |
| AU | PP558698 | 9/1998 |
| CA | 2230471 A1 | 8/1999 |
| CA | 2808649 A1 | 3/2012 |
| CA | 2836929 A1 | 6/2014 |
| CH | 701522 A2 | 1/2011 |
| CN | 101106167 A | 1/2008 |
| CN | 201460052 U | 5/2010 |
| CN | 101826562 A | 9/2010 |
| CN | 201594543 U | 9/2010 |
| CN | 102751356 A | 10/2012 |
| CN | 202644866 U | 1/2013 |
| CN | 202816967 U | 3/2013 |
| CN | 103485490 A | 1/2014 |
| DE | 1900069 A1 | 9/1970 |
| DE | 7438939 U | 11/1974 |
| DE | 7540889 U | 4/1976 |
| DE | 7628458 U1 | 1/1977 |
| DE | 2636533 A1 | 3/1977 |
| DE | 2755555 A1 | 8/1978 |
| DE | 2712446 A1 | 9/1978 |
| DE | 7829553 U1 | 1/1979 |
| DE | 2756316 A1 | 6/1979 |
| DE | 8001534 U1 | 5/1980 |
| DE | 8025959 U1 | 9/1980 |
| DE | 2920047 A1 | 11/1980 |
| DE | 3007843 A1 | 9/1981 |
| DE | 3015801 A1 | 10/1981 |
| DE | 3018701 A1 | 12/1981 |
| DE | 8200311 U1 | 8/1982 |
| DE | 8230951 U1 | 5/1983 |
| DE | 8236179 U1 | 6/1983 |
| DE | 3201618 A1 | 7/1983 |
| DE | 8011956 U1 | 1/1984 |
| DE | 3247029 A1 | 6/1984 |
| DE | 3247469 A1 | 7/1984 |
| DE | 3303359 A1 | 8/1984 |
| DE | 3404978 A1 | 3/1985 |
| DE | 8506165 U1 | 6/1985 |
| DE | 3346077 A1 | 7/1985 |
| DE | 3409232 A1 | 10/1985 |
| DE | 8511432 U1 | 1/1987 |
| DE | 3544080 A1 | 6/1987 |
| DE | 8704338 U1 | 7/1987 |
| DE | 8708492 U1 | 9/1987 |
| DE | 8709552 U1 | 11/1987 |
| DE | 8802500 U1 | 5/1988 |
| DE | 3801090 A1 | 6/1988 |
| DE | 8802322 U1 | 6/1988 |
| DE | 8803035 U1 | 6/1988 |
| DE | 3737183 A1 | 5/1989 |
| DE | 8913198 U1 | 6/1990 |
| DE | 9010951 U1 | 10/1990 |
| DE | 3916124 A1 | 11/1990 |
| DE | 4014200 A1 | 11/1990 |
| DE | 9010541 U1 | 11/1990 |
| DE | 8911484 U1 | 12/1990 |
| DE | 8914728 U1 | 4/1991 |
| DE | 3943405 A1 | 7/1991 |
| DE | 4002518 A1 | 8/1991 |
| DE | 9105778 U1 | 9/1991 |
| DE | 9109605 U1 | 9/1991 |
| DE | 4019149 A1 | 12/1991 |
| DE | 9111685 U1 | 12/1991 |
| DE | 9112913 U1 | 1/1992 |
| DE | 9113104 U1 | 2/1992 |
| DE | 9114949 U1 | 3/1992 |
| DE | 9202541 U1 | 4/1992 |
| DE | 9204018 U1 | 5/1992 |
| DE | 4104157 A1 | 8/1992 |
| DE | 4115605 A1 | 11/1992 |
| DE | 9211121 U1 | 11/1992 |
| DE | 4139753 A1 | 6/1993 |
| DE | 4140682 A1 | 6/1993 |
| DE | 4140683 A1 | 6/1993 |
| DE | 4140832 A1 | 6/1993 |
| DE | 9201385 U1 | 6/1993 |
| DE | 9301531 U1 | 6/1993 |
| DE | 9203721 U1 | 7/1993 |
| DE | 9306519 U1 | 7/1993 |
| DE | 4303055 A1 | 8/1993 |
| DE | 9310063 U1 | 8/1993 |
| DE | 9310064 U1 | 9/1993 |
| DE | 4230948 C1 | 11/1993 |
| DE | 9308022 U1 | 11/1993 |
| DE | 9311008 U1 | 11/1993 |
| DE | 4221633 A1 | 1/1994 |
| DE | 9401741 U1 | 4/1994 |
| DE | 4303156 A1 | 8/1994 |
| DE | 4317674 A1 | 12/1994 |
| DE | 4319027 A1 | 12/1994 |
| DE | 4323140 A1 | 12/1994 |
| DE | 4322653 A1 | 1/1995 |
| DE | 4324698 A1 | 1/1995 |
| DE | 9320648 U1 | 1/1995 |
| DE | 9415616 U1 | 1/1995 |
| DE | 4332873 A1 | 3/1995 |
| DE | 4334511 A1 | 4/1995 |
| DE | 4334581 A1 | 4/1995 |
| DE | 29500832 U1 | 4/1995 |
| DE | 29503314 U1 | 4/1995 |
| DE | 29503315 U1 | 4/1995 |
| DE | 4343514 A1 | 6/1995 |
| DE | 4414785 A1 | 6/1995 |
| DE | 29506785 U1 | 7/1995 |
| DE | 29506247 U1 | 8/1995 |
| DE | 29507271 U1 | 8/1995 |

(56) References Cited

FOREIGN PATENT DOCUMENTS

| | | |
|---|---|---|
| DE | 4416884 A1 | 11/1995 |
| DE | 9218903 U1 | 2/1996 |
| DE | 4430215 A1 | 3/1996 |
| DE | 29515687 U1 | 3/1996 |
| DE | 29601660 U1 | 5/1996 |
| DE | 29601715 U1 | 5/1996 |
| DE | 29602298 U1 | 5/1996 |
| DE | 29606547 U1 | 7/1996 |
| DE | 29609816 U1 | 8/1996 |
| DE | 29610516 U1 | 8/1996 |
| DE | 29618279 U1 | 12/1996 |
| DE | 19531744 A1 | 3/1997 |
| DE | 19531765 A1 | 3/1997 |
| DE | 29616947 U1 | 3/1997 |
| DE | 19600579 C1 | 4/1997 |
| DE | 29622346 U1 | 4/1997 |
| DE | 29700920 U1 | 6/1997 |
| DE | 29621380 U1 | 7/1997 |
| DE | 19704794 A1 | 8/1997 |
| DE | 29711263 U1 | 8/1997 |
| DE | 29711623 U1 | 9/1997 |
| DE | 19619369 A1 | 11/1997 |
| DE | 29703481 U1 | 11/1997 |
| DE | 29616015 U1 | 12/1997 |
| DE | 29617870 U1 | 1/1998 |
| DE | 29719645 U1 | 1/1998 |
| DE | 19705046 A1 | 2/1998 |
| DE | 29719513 U1 | 2/1998 |
| DE | 29804410 U1 | 6/1998 |
| DE | 19700873 A1 | 7/1998 |
| DE | 29804621 U1 | 8/1998 |
| DE | 19704255 A1 | 9/1998 |
| DE | 19808505 A1 | 9/1998 |
| DE | 19717996 A1 | 10/1998 |
| DE | 29809280 U1 | 10/1998 |
| DE | 29814403 U1 | 11/1998 |
| DE | 19725427 A1 | 12/1998 |
| DE | 29817311 U1 | 12/1998 |
| DE | 19726330 A1 | 2/1999 |
| DE | 29815134 U1 | 2/1999 |
| DE | 29817639 U1 | 2/1999 |
| DE | 19743574 A1 | 4/1999 |
| DE | 19748815 A1 | 5/1999 |
| DE | 19851230 A1 | 5/1999 |
| DE | 29818738 U1 | 5/1999 |
| DE | 29904479 U1 | 6/1999 |
| DE | 29905187 U1 | 6/1999 |
| DE | 19819679 C1 | 7/1999 |
| DE | 29904345 U1 | 7/1999 |
| DE | 19802997 A1 | 8/1999 |
| DE | 19806410 A1 | 8/1999 |
| DE | 19809883 A1 | 9/1999 |
| DE | 19811399 A1 | 9/1999 |
| DE | 29815978 U1 | 9/1999 |
| DE | 29912581 U1 | 12/1999 |
| DE | 29912699 U1 | 1/2000 |
| DE | 29912700 U1 | 1/2000 |
| DE | 29919145 U1 | 1/2000 |
| DE | 29919147 U1 | 1/2000 |
| DE | 29919148 U1 | 1/2000 |
| DE | 19847330 A1 | 4/2000 |
| DE | 19902650 A1 | 7/2000 |
| DE | 20006328 U1 | 7/2000 |
| DE | 20008441 U1 | 7/2000 |
| DE | 19906464 A1 | 8/2000 |
| DE | 19936630 A1 | 8/2000 |
| DE | 20006579 U1 | 8/2000 |
| DE | 20008509 U1 | 8/2000 |
| DE | 20008549 U1 | 8/2000 |
| DE | 20008556 U1 | 8/2000 |
| DE | 20009929 U1 | 8/2000 |
| DE | 19912743 A1 | 9/2000 |
| DE | 19913806 A1 | 9/2000 |
| DE | 19929078 C1 | 9/2000 |
| DE | 20001414 U1 | 9/2000 |
| DE | 20009930 U1 | 9/2000 |
| DE | 20009931 U1 | 9/2000 |
| DE | 20009932 U1 | 9/2000 |
| DE | 20010465 U1 | 9/2000 |
| DE | 20004800 U1 | 10/2000 |
| DE | 20009485 U1 | 11/2000 |
| DE | 20010299 U1 | 11/2000 |
| DE | 20014536 U1 | 11/2000 |
| DE | 20014763 U1 | 11/2000 |
| DE | 10022544 A1 | 12/2000 |
| DE | 19921044 A1 | 12/2000 |
| DE | 20010620 U1 | 12/2000 |
| DE | 20010821 U1 | 12/2000 |
| DE | 20013347 U1 | 12/2000 |
| DE | 20014058 U1 | 1/2001 |
| DE | 19934059 A1 | 2/2001 |
| DE | 20016216 U1 | 3/2001 |
| DE | 10018223 A1 | 4/2001 |
| DE | 10050021 A1 | 4/2001 |
| DE | 20103479 U1 | 5/2001 |
| DE | 10000106 A1 | 7/2001 |
| DE | 10000619 A1 | 7/2001 |
| DE | 10000742 A1 | 7/2001 |
| DE | 10005326 A1 | 8/2001 |
| DE | 10007872 A1 | 8/2001 |
| DE | 20106515 U1 | 8/2001 |
| DE | 10009635 A1 | 9/2001 |
| DE | 10010322 A1 | 9/2001 |
| DE | 10014924 U1 | 9/2001 |
| DE | 20110204 U1 | 9/2001 |
| DE | 20110459 U1 | 9/2001 |
| DE | 10017125 A1 | 10/2001 |
| DE | 10017502 A1 | 10/2001 |
| DE | 10019316 A1 | 10/2001 |
| DE | 20109943 U1 | 10/2001 |
| DE | 20112823 U1 | 10/2001 |
| DE | 20112824 U1 | 10/2001 |
| DE | 10010257 A1 | 11/2001 |
| DE | 10024882 A1 | 11/2001 |
| DE | 10025538 A1 | 11/2001 |
| DE | 20113359 U1 | 11/2001 |
| DE | 20114836 U1 | 11/2001 |
| DE | 10015465 A1 | 12/2001 |
| DE | 20013940 U1 | 12/2001 |
| DE | 20116551 U1 | 12/2001 |
| DE | 10031326 A1 | 1/2002 |
| DE | 10034655 A1 | 1/2002 |
| DE | 20117280 U1 | 1/2002 |
| DE | 10039556 A1 | 2/2002 |
| DE | 20117398 U1 | 2/2002 |
| DE | 20117399 U1 | 2/2002 |
| DE | 10037757 A1 | 3/2002 |
| DE | 10115035 A1 | 3/2002 |
| DE | 20117716 U1 | 3/2002 |
| DE | 20119629 U1 | 3/2002 |
| DE | 10046126 A1 | 4/2002 |
| DE | 10046134 A1 | 4/2002 |
| DE | 10049159 A1 | 4/2002 |
| DE | 20103650 U1 | 4/2002 |
| DE | 20119478 U1 | 4/2002 |
| DE | 20120983 U1 | 4/2002 |
| DE | 20200644 U1 | 4/2002 |
| DE | 10049304 C1 | 5/2002 |
| DE | 10050613 A1 | 5/2002 |
| DE | 10054349 A1 | 5/2002 |
| DE | 20204146 U1 | 5/2002 |
| DE | 20204148 U1 | 5/2002 |
| DE | 10055617 A1 | 6/2002 |
| DE | 10059721 A1 | 6/2002 |
| DE | 10132557 A1 | 6/2002 |
| DE | 20200672 U1 | 6/2002 |
| DE | 10062697 A1 | 7/2002 |
| DE | 20200735 U1 | 7/2002 |
| DE | 10103835 A1 | 8/2002 |
| DE | 10105718 A1 | 8/2002 |
| DE | 20204963 U1 | 8/2002 |
| DE | 20205349 U1 | 8/2002 |
| DE | 20205403 U1 | 8/2002 |
| DE | 20207855 U1 | 8/2002 |

(56) References Cited

FOREIGN PATENT DOCUMENTS

| | | |
|---|---|---|
| DE | 20209032 U1 | 8/2002 |
| DE | 10116782 A1 | 10/2002 |
| DE | 10116783 A1 | 10/2002 |
| DE | 20209218 U1 | 10/2002 |
| DE | 20209892 U1 | 10/2002 |
| DE | 20209940 U1 | 10/2002 |
| DE | 10124048 A1 | 11/2002 |
| DE | 20121297 A1 | 11/2002 |
| DE | 10128237 A1 | 12/2002 |
| DE | 10128797 A1 | 12/2002 |
| DE | 20211268 U1 | 1/2003 |
| DE | 20212593 U1 | 1/2003 |
| DE | 20214483 U1 | 2/2003 |
| DE | 20215462 U1 | 2/2003 |
| DE | 20217489 U1 | 2/2003 |
| DE | 20218424 U1 | 2/2003 |
| DE | 10114867 A1 | 5/2003 |
| DE | 10145393 C1 | 5/2003 |
| DE | 10152354 C1 | 5/2003 |
| DE | 10200438 A1 | 5/2003 |
| DE | 20303310 U1 | 5/2003 |
| DE | 20217981 U1 | 6/2003 |
| DE | 20303257 U1 | 6/2003 |
| DE | 20303431 U1 | 6/2003 |
| DE | 20303622 U1 | 6/2003 |
| DE | 20304676 U1 | 6/2003 |
| DE | 20302045 U1 | 7/2003 |
| DE | 20303471 U1 | 7/2003 |
| DE | 20303661 U1 | 7/2003 |
| DE | 20307139 U1 | 7/2003 |
| DE | 10059504 A1 | 8/2003 |
| DE | 20303756 U1 | 8/2003 |
| DE | 10305163 A1 | 9/2003 |
| DE | 20308205 U1 | 9/2003 |
| DE | 10225863 C1 | 10/2003 |
| DE | 20311967 U1 | 10/2003 |
| DE | 10204585 A1 | 11/2003 |
| DE | 10216899 A1 | 11/2003 |
| DE | 20311989 U1 | 11/2003 |
| DE | 10224437 A1 | 12/2003 |
| DE | 10233973 A1 | 2/2004 |
| DE | 20215867 U1 | 2/2004 |
| DE | 20219173 U1 | 2/2004 |
| DE | 20315867 U1 | 2/2004 |
| DE | 20301389 U1 | 3/2004 |
| DE | 20318118 U1 | 3/2004 |
| DE | 10245925 A1 | 4/2004 |
| DE | 10309445 B3 | 4/2004 |
| DE | 10344202 A1 | 4/2004 |
| DE | 20319217 U1 | 5/2004 |
| DE | 202004001642 U1 | 5/2004 |
| DE | 20319908 U1 | 6/2004 |
| DE | 202004003001 U1 | 6/2004 |
| DE | 202004005224 U1 | 6/2004 |
| DE | 10246935 A1 | 7/2004 |
| DE | 202004006224 U1 | 7/2004 |
| DE | 20310760 U1 | 9/2004 |
| DE | 202004008911 U1 | 9/2004 |
| DE | 202004010304 U1 | 12/2004 |
| DE | 202004015811 U1 | 12/2004 |
| DE | 10337410 B3 | 1/2005 |
| DE | 10358851 A1 | 1/2005 |
| DE | 202004014940 U1 | 2/2005 |
| DE | 10336145 A1 | 3/2005 |
| DE | 202004015314 U1 | 3/2005 |
| DE | 202004018587 U1 | 3/2005 |
| DE | 202004019681 U1 | 3/2005 |
| DE | 202004019952 U1 | 3/2005 |
| DE | 202005001469 U1 | 4/2005 |
| DE | 202005000484 U1 | 5/2005 |
| DE | 202005000485 U1 | 5/2005 |
| DE | 202005001195 U1 | 6/2005 |
| DE | 202005002523 U1 | 6/2005 |
| DE | 202005003717 U1 | 6/2005 |
| DE | 202005006951 U1 | 8/2005 |
| DE | 202005007855 U1 | 8/2005 |
| DE | 102004007381 A1 | 9/2005 |
| DE | 202005009672 U1 | 9/2005 |
| DE | 202005009883 U1 | 9/2005 |
| DE | 202005009884 U1 | 9/2005 |
| DE | 102004018151 A1 | 10/2005 |
| DE | 202005009764 U1 | 10/2005 |
| DE | 202004009932 U1 | 11/2005 |
| DE | 202005012798 U1 | 11/2005 |
| DE | 102004026786 A1 | 12/2005 |
| DE | 202004015261 U1 | 2/2006 |
| DE | 102004041533 A1 | 3/2006 |
| DE | 102004044181 A1 | 3/2006 |
| DE | 102004049595 B3 | 3/2006 |
| DE | 202005019628 U1 | 3/2006 |
| DE | 202005019897 U1 | 3/2006 |
| DE | 202006000056 U1 | 3/2006 |
| DE | 202006000073 U1 | 3/2006 |
| DE | 202006000177 U1 | 4/2006 |
| DE | 202006001527 U1 | 4/2006 |
| DE | 202006001782 U1 | 4/2006 |
| DE | 102004055187 A1 | 5/2006 |
| DE | 202005012844 U1 | 5/2006 |
| DE | 202005015128 U1 | 5/2006 |
| DE | 202006003475 U1 | 6/2006 |
| DE | 202006007066 U1 | 7/2006 |
| DE | 102005001653 B3 | 8/2006 |
| DE | 202006002401 U1 | 8/2006 |
| DE | 202006007613 U1 | 8/2006 |
| DE | 202006007948 U1 | 8/2006 |
| DE | 202006009100 U1 | 8/2006 |
| DE | 202006009765 U1 | 8/2006 |
| DE | 202006009884 U1 | 8/2006 |
| DE | 202006009907 U1 | 8/2006 |
| DE | 102005012054 A1 | 9/2006 |
| DE | 102005012055 B3 | 9/2006 |
| DE | 202005008164 U1 | 9/2006 |
| DE | 202006009678 U1 | 9/2006 |
| DE | 102005015346 A1 | 10/2006 |
| DE | 202005009936 U1 | 10/2006 |
| DE | 202005009937 U1 | 10/2006 |
| DE | 202006006144 U1 | 10/2006 |
| DE | 202006012784 U1 | 10/2006 |
| DE | 202006013251 U1 | 10/2006 |
| DE | 102005023236 A1 | 11/2006 |
| DE | 102005023971 A1 | 11/2006 |
| DE | 102005058065 A1 | 11/2006 |
| DE | 102006007648 A1 | 11/2006 |
| DE | 202006009674 U1 | 11/2006 |
| DE | 202006009871 U1 | 11/2006 |
| DE | 202006012495 U1 | 11/2006 |
| DE | 202006013261 U1 | 11/2006 |
| DE | 202006014048 U1 | 11/2006 |
| DE | 202006014733 U1 | 12/2006 |
| DE | 202006015336 U1 | 12/2006 |
| DE | 102005030039 A1 | 1/2007 |
| DE | 102005032826 A1 | 1/2007 |
| DE | 202006013662 U1 | 1/2007 |
| DE | 202006014469 U1 | 1/2007 |
| DE | 202006014470 U1 | 1/2007 |
| DE | 202006015045 U1 | 1/2007 |
| DE | 102005043957 B3 | 2/2007 |
| DE | 202005015455 U1 | 2/2007 |
| DE | 202005019814 U1 | 2/2007 |
| DE | 202006008867 U1 | 2/2007 |
| DE | 202006018426 U1 | 2/2007 |
| DE | 102005039495 A1 | 3/2007 |
| DE | 102005039952 A1 | 3/2007 |
| DE | 102005040368 A1 | 3/2007 |
| DE | 202006018586 U1 | 3/2007 |
| DE | 202007000526 U1 | 3/2007 |
| DE | 102005032859 B3 | 4/2007 |
| DE | 102005050883 A1 | 4/2007 |
| DE | 202006018592 U1 | 4/2007 |
| DE | 202006019837 U1 | 4/2007 |
| DE | 102005053639 A1 | 5/2007 |
| DE | 202007001982 U1 | 5/2007 |
| DE | 102005058529 A1 | 6/2007 |
| DE | 202007001054 U1 | 6/2007 |

(56) References Cited

FOREIGN PATENT DOCUMENTS

| | | |
|---|---|---|
| DE | 202007005995 U1 | 6/2007 |
| DE | 102005059487 A1 | 7/2007 |
| DE | 202007004894 U1 | 7/2007 |
| DE | 202007005745 U1 | 7/2007 |
| DE | 202007006009 U1 | 7/2007 |
| DE | 202007006154 U1 | 7/2007 |
| DE | 102006006455 A1 | 8/2007 |
| DE | 102006009194 A1 | 8/2007 |
| DE | 202007008614 U1 | 8/2007 |
| DE | 202007008659 U1 | 8/2007 |
| DE | 102006012254 A1 | 9/2007 |
| DE | 102006012276 A1 | 9/2007 |
| DE | 102006022870 A1 | 9/2007 |
| DE | 202007007207 U1 | 9/2007 |
| DE | 202007009680 U1 | 9/2007 |
| DE | 102006005240 A1 | 10/2007 |
| DE | 102006016333 A1 | 10/2007 |
| DE | 102006019753 A1 | 10/2007 |
| DE | 202007007051 U1 | 10/2007 |
| DE | 202007010520 U1 | 10/2007 |
| DE | 102006020585 A1 | 11/2007 |
| DE | 202007008284 U1 | 11/2007 |
| DE | 202007010973 U1 | 11/2007 |
| DE | 202007012608 U1 | 11/2007 |
| DE | 202007013325 U1 | 11/2007 |
| DE | 102006008573 A1 | 12/2007 |
| DE | 102006029029 A1 | 12/2007 |
| DE | 202007007976 U1 | 12/2007 |
| DE | 202007008150 U1 | 12/2007 |
| DE | 102006028494 A1 | 1/2008 |
| DE | 102006040446 B3 | 1/2008 |
| DE | 202007010999 U1 | 1/2008 |
| DE | 202007012020 U1 | 1/2008 |
| DE | 202007012570 U1 | 1/2008 |
| DE | 102006037793 A1 | 2/2008 |
| DE | 102006053830 B3 | 2/2008 |
| DE | 202006016301 U1 | 2/2008 |
| DE | 202007012149 U1 | 2/2008 |
| DE | 202007015887 U1 | 2/2008 |
| DE | 202007016367 U1 | 2/2008 |
| DE | 202007016715 U1 | 2/2008 |
| DE | 202007016716 U1 | 2/2008 |
| DE | 202007017031 U1 | 2/2008 |
| DE | 102006042092 A1 | 3/2008 |
| DE | 202007014258 U1 | 3/2008 |
| DE | 202007016366 U1 | 3/2008 |
| DE | 202008000528 U1 | 3/2008 |
| DE | 102006050456 A1 | 4/2008 |
| DE | 202007006153 U1 | 4/2008 |
| DE | 202007016011 U1 | 4/2008 |
| DE | 202008002346 U1 | 4/2008 |
| DE | 102006053573 A1 | 5/2008 |
| DE | 102006053831 A1 | 5/2008 |
| DE | 202008000997 U1 | 5/2008 |
| DE | 202008002264 U1 | 5/2008 |
| DE | 202008004055 U1 | 6/2008 |
| DE | 202007011725 U1 | 7/2008 |
| DE | 202007018367 U1 | 7/2008 |
| DE | 202007010330 U1 | 8/2008 |
| DE | 202008004664 U1 | 8/2008 |
| DE | 202008006529 U1 | 8/2008 |
| DE | 202008006549 U1 | 8/2008 |
| DE | 202007006094 U1 | 9/2008 |
| DE | 202008006347 U1 | 9/2008 |
| DE | 202008007549 U1 | 9/2008 |
| DE | 202008007705 U1 | 9/2008 |
| DE | 202008007837 U1 | 9/2008 |
| DE | 202008007838 U1 | 9/2008 |
| DE | 102007018212 A1 | 10/2008 |
| DE | 202007018497 U1 | 10/2008 |
| DE | 202008009758 U1 | 10/2008 |
| DE | 202008009864 U1 | 10/2008 |
| DE | 102007021889 B3 | 11/2008 |
| DE | 102007022964 A1 | 11/2008 |
| DE | 202008003011 U1 | 11/2008 |
| DE | 202008009134 U1 | 11/2008 |
| DE | 202008011670 U1 | 11/2008 |
| DE | 202008008794 U1 | 12/2008 |
| DE | 202008008819 U1 | 12/2008 |
| DE | 102008028489 A1 | 1/2009 |
| DE | 202008011312 U1 | 1/2009 |
| DE | 202008011501 U1 | 1/2009 |
| DE | 202008012152 U1 | 1/2009 |
| DE | 102007022681 A1 | 2/2009 |
| DE | 102007036206 A1 | 2/2009 |
| DE | 102007039755 A1 | 2/2009 |
| DE | 202007012888 U1 | 2/2009 |
| DE | 202008015077 U1 | 2/2009 |
| DE | 202008015304 U1 | 2/2009 |
| DE | 202008015916 U1 | 2/2009 |
| DE | 102007040735 A1 | 3/2009 |
| DE | 202008013755 U1 | 3/2009 |
| DE | 202008013819 U1 | 3/2009 |
| DE | 202008014436 U1 | 3/2009 |
| DE | 202008014676 U1 | 3/2009 |
| DE | 102007036713 A1 | 4/2009 |
| DE | 102007043688 A1 | 4/2009 |
| DE | 102007048914 A1 | 4/2009 |
| DE | 202009000030 U1 | 4/2009 |
| DE | 202009000844 U1 | 4/2009 |
| DE | 202009000916 U1 | 4/2009 |
| DE | 202009001278 U1 | 4/2009 |
| DE | 202009001810 U1 | 4/2009 |
| DE | 202009002440 U1 | 4/2009 |
| DE | 102007052407 A1 | 5/2009 |
| DE | 102007053373 A1 | 5/2009 |
| DE | 102007053376 A1 | 5/2009 |
| DE | 102007053556 A1 | 5/2009 |
| DE | 202009000960 U1 | 5/2009 |
| DE | 202009003123 U1 | 5/2009 |
| DE | 202009003124 U1 | 5/2009 |
| DE | 202009003126 U1 | 5/2009 |
| DE | 102007057516 A1 | 6/2009 |
| DE | 102007060920 A1 | 6/2009 |
| DE | 102007063197 A1 | 6/2009 |
| DE | 202009002133 U1 | 6/2009 |
| DE | 202009002134 U1 | 6/2009 |
| DE | 202009002672 U1 | 6/2009 |
| DE | 202009002830 U1 | 6/2009 |
| DE | 202009003830 U1 | 6/2009 |
| DE | 202009003862 U1 | 6/2009 |
| DE | 202009004269 U1 | 6/2009 |
| DE | 202009004286 U1 | 6/2009 |
| DE | 202008000678 U1 | 7/2009 |
| DE | 202008003413 U1 | 7/2009 |
| DE | 202009001025 U1 | 7/2009 |
| DE | 202009003667 U1 | 7/2009 |
| DE | 202009004619 U1 | 7/2009 |
| DE | 202009004746 U1 | 7/2009 |
| DE | 202009005353 U1 | 7/2009 |
| DE | 202009006096 U1 | 7/2009 |
| DE | 102008007586 A1 | 8/2009 |
| DE | 102008008253 A1 | 8/2009 |
| DE | 102008009633 A1 | 8/2009 |
| DE | 102008009703 A1 | 8/2009 |
| DE | 202008003157 U1 | 8/2009 |
| DE | 202009003745 U1 | 8/2009 |
| DE | 202009004905 U1 | 8/2009 |
| DE | 202009007418 U1 | 8/2009 |
| DE | 202009007490 U1 | 8/2009 |
| DE | 202009007587 U1 | 8/2009 |
| DE | 202009007986 U1 | 8/2009 |
| DE | 102008012248 A1 | 9/2009 |
| DE | 102008012717 A1 | 9/2009 |
| DE | 102008014561 A1 | 9/2009 |
| DE | 202009005855 U1 | 9/2009 |
| DE | 202009007525 U1 | 9/2009 |
| DE | 102008009608 A1 | 10/2009 |
| DE | 102008027451 A1 | 10/2009 |
| DE | 102008027452 A1 | 10/2009 |
| DE | 202008007792 U1 | 10/2009 |
| DE | 202009006691 U1 | 10/2009 |
| DE | 202009007408 U1 | 10/2009 |
| DE | 202009007409 U1 | 10/2009 |

(56) References Cited

FOREIGN PATENT DOCUMENTS

| | | |
|---|---|---|
| DE | 202009007516 U1 | 10/2009 |
| DE | 202009007808 U1 | 10/2009 |
| DE | 202009009079 U1 | 10/2009 |
| DE | 202009010660 U1 | 10/2009 |
| DE | 202009010823 U1 | 10/2009 |
| DE | 102008022018 A1 | 11/2009 |
| DE | 102008022128 A1 | 11/2009 |
| DE | 202008008743 U1 | 11/2009 |
| DE | 202009005202 U1 | 11/2009 |
| DE | 202009007588 U1 | 11/2009 |
| DE | 202009009244 U1 | 11/2009 |
| DE | 202009010434 U1 | 11/2009 |
| DE | 202009011317 U1 | 11/2009 |
| DE | 102008027300 A1 | 12/2009 |
| DE | 102008027301 A1 | 12/2009 |
| DE | 102008027302 A1 | 12/2009 |
| DE | 102008027401 A1 | 12/2009 |
| DE | 102008027603 A1 | 12/2009 |
| DE | 102008027852 A1 | 12/2009 |
| DE | 202009005123 U1 | 12/2009 |
| DE | 202009005309 U1 | 12/2009 |
| DE | 202009006728 U1 | 12/2009 |
| DE | 202009007517 U1 | 12/2009 |
| DE | 202009009210 U1 | 12/2009 |
| DE | 202009010984 U1 | 12/2009 |
| DE | 202009011549 U1 | 12/2009 |
| DE | 202009012507 U1 | 12/2009 |
| DE | 202009013142 U1 | 12/2009 |
| DE | 202009013344 U1 | 12/2009 |
| DE | 102008031453 A1 | 1/2010 |
| DE | 202008011590 U1 | 1/2010 |
| DE | 202009012870 U1 | 1/2010 |
| DE | 102008035345 A1 | 2/2010 |
| DE | 102008039352 A1 | 2/2010 |
| DE | 102008041473 A1 | 2/2010 |
| DE | 202008013005 U1 | 2/2010 |
| DE | 202009011009 U1 | 2/2010 |
| DE | 202009011708 U1 | 2/2010 |
| DE | 202009012669 U1 | 2/2010 |
| DE | 202009013691 U1 | 2/2010 |
| DE | 202009014048 U1 | 2/2010 |
| DE | 202009015593 U1 | 2/2010 |
| DE | 202009015639 U1 | 2/2010 |
| DE | 102008046850 A1 | 3/2010 |
| DE | 102008046899 A1 | 3/2010 |
| DE | 202009011109 U1 | 3/2010 |
| DE | 202009014816 U1 | 3/2010 |
| DE | 202009014818 U1 | 3/2010 |
| DE | 202009015056 U1 | 3/2010 |
| DE | 202009015122 U1 | 3/2010 |
| DE | 202009015208 U1 | 3/2010 |
| DE | 202009015787 U1 | 3/2010 |
| DE | 202009016197 U1 | 3/2010 |
| DE | 202009016269 U1 | 3/2010 |
| DE | 202009017451 U1 | 3/2010 |
| DE | 102008050833 A1 | 4/2010 |
| DE | 102008051426 A1 | 4/2010 |
| DE | 102008051717 A1 | 4/2010 |
| DE | 102008051902 A1 | 4/2010 |
| DE | 102008052368 A1 | 4/2010 |
| DE | 102008052418 A1 | 4/2010 |
| DE | 102008052600 A1 | 4/2010 |
| DE | 102009004677 B3 | 4/2010 |
| DE | 202009011880 U1 | 4/2010 |
| DE | 202009012226 U1 | 4/2010 |
| DE | 202009013609 U1 | 4/2010 |
| DE | 202009015289 U1 | 4/2010 |
| DE | 202009015905 U1 | 4/2010 |
| DE | 202009016295 U1 | 4/2010 |
| DE | 202009016504 U1 | 4/2010 |
| DE | 202009016612 U1 | 4/2010 |
| DE | 202009016762 U1 | 4/2010 |
| DE | 202009016872 U1 | 4/2010 |
| DE | 202010000940 U1 | 4/2010 |
| DE | 202010001175 U1 | 4/2010 |
| DE | 202010001238 U1 | 4/2010 |
| DE | 102008055937 A1 | 5/2010 |
| DE | 202008017085 U1 | 5/2010 |
| DE | 202008017560 U1 | 5/2010 |
| DE | 202010000227 U1 | 5/2010 |
| DE | 202010001763 U1 | 5/2010 |
| DE | 202010003257 U1 | 5/2010 |
| DE | 102009043810 A1 | 6/2010 |
| DE | 202009016873 U1 | 6/2010 |
| DE | 202009017288 U1 | 6/2010 |
| DE | 202010000121 U1 | 6/2010 |
| DE | 202010001001 U1 | 6/2010 |
| DE | 202010002687 U1 | 6/2010 |
| DE | 202010002942 U1 | 6/2010 |
| DE | 202010005135 U1 | 6/2010 |
| DE | 102008055561 A1 | 7/2010 |
| DE | 102008064313 A1 | 7/2010 |
| DE | 102008064554 A1 | 7/2010 |
| DE | 102009004260 A1 | 7/2010 |
| DE | 102009005823 A1 | 7/2010 |
| DE | 102009005939 A1 | 7/2010 |
| DE | 202009002079 U1 | 7/2010 |
| DE | 202009002209 U1 | 7/2010 |
| DE | 202009017738 U1 | 7/2010 |
| DE | 202009017846 U1 | 7/2010 |
| DE | 202010001142 U1 | 7/2010 |
| DE | 202010002902 U1 | 7/2010 |
| DE | 202010003428 U1 | 7/2010 |
| DE | 202010003483 U1 | 7/2010 |
| DE | 202010003802 U1 | 7/2010 |
| DE | 202010005003 U1 | 7/2010 |
| DE | 202010005490 U1 | 7/2010 |
| DE | 202010005996 U1 | 7/2010 |
| DE | 102009008067 A1 | 8/2010 |
| DE | 202010004809 U1 | 8/2010 |
| DE | 202010005491 U1 | 8/2010 |
| DE | 202010005505 U1 | 8/2010 |
| DE | 202010005531 U1 | 8/2010 |
| DE | 202010006377 U1 | 8/2010 |
| DE | 202010006410 U1 | 8/2010 |
| DE | 202010006461 U1 | 8/2010 |
| DE | 202010006877 U1 | 8/2010 |
| DE | 202010006879 U1 | 8/2010 |
| DE | 202010007537 U1 | 8/2010 |
| DE | 202010007658 U1 | 8/2010 |
| DE | 202010007741 U1 | 8/2010 |
| DE | 102009011318 A1 | 9/2010 |
| DE | 102009012026 A1 | 9/2010 |
| DE | 102009012203 A1 | 9/2010 |
| DE | 102009018782 B3 | 9/2010 |
| DE | 202009005090 U1 | 9/2010 |
| DE | 202009006085 U1 | 9/2010 |
| DE | 202009006367 U1 | 9/2010 |
| DE | 202010001854 U1 | 9/2010 |
| DE | 202010005004 U1 | 9/2010 |
| DE | 202010005492 U1 | 9/2010 |
| DE | 202010005547 U1 | 9/2010 |
| DE | 202010005563 U1 | 9/2010 |
| DE | 202010005612 U1 | 9/2010 |
| DE | 202010005914 U1 | 9/2010 |
| DE | 202010007000 U1 | 9/2010 |
| DE | 202010007139 U1 | 9/2010 |
| DE | 202010007392 U1 | 9/2010 |
| DE | 102009002504 A1 | 10/2010 |
| DE | 102009016072 A1 | 10/2010 |
| DE | 102009016923 A1 | 10/2010 |
| DE | 102009017337 A1 | 10/2010 |
| DE | 202009007481 U1 | 10/2010 |
| DE | 202009011434 U1 | 10/2010 |
| DE | 202010007543 U1 | 10/2010 |
| DE | 202010010024 U1 | 10/2010 |
| DE | 202010010129 U1 | 10/2010 |
| DE | 202010010597 U1 | 10/2010 |
| DE | 202010010858 U1 | 10/2010 |
| DE | 202010010969 U1 | 10/2010 |
| DE | 202010011235 U1 | 10/2010 |
| DE | 102009019548 A1 | 11/2010 |
| DE | 102009019829 A1 | 11/2010 |
| DE | 102009020256 A1 | 11/2010 |

(56) References Cited

FOREIGN PATENT DOCUMENTS

| | | |
|---|---|---|
| DE | 102009020446 A1 | 11/2010 |
| DE | 102009020620 A1 | 11/2010 |
| DE | 102009022201 A1 | 11/2010 |
| DE | 102009022641 A1 | 11/2010 |
| DE | 102009035996 A1 | 11/2010 |
| DE | 202010007256 U1 | 11/2010 |
| DE | 202010007783 U1 | 11/2010 |
| DE | 202010008482 U1 | 11/2010 |
| DE | 202010008570 U1 | 11/2010 |
| DE | 202010008656 U1 | 11/2010 |
| DE | 202010009958 U1 | 11/2010 |
| DE | 102009022161 A1 | 12/2010 |
| DE | 102009022670 A1 | 12/2010 |
| DE | 102009022718 A1 | 12/2010 |
| DE | 102009022780 A1 | 12/2010 |
| DE | 102009049886 A1 | 12/2010 |
| DE | 102010004652 A1 | 12/2010 |
| DE | 202010007578 U1 | 12/2010 |
| DE | 202010012559 U1 | 12/2010 |
| DE | 202010013976 U1 | 12/2010 |
| DE | 102009027752 A1 | 1/2011 |
| DE | 102009030836 A1 | 1/2011 |
| DE | 102009033039 A1 | 1/2011 |
| DE | 102009033409 A1 | 1/2011 |
| DE | 102009033416 B3 | 1/2011 |
| DE | 102009051755 A1 | 1/2011 |
| DE | 102009051756 A1 | 1/2011 |
| DE | 202010010648 U1 | 1/2011 |
| DE | 202010014035 U1 | 1/2011 |
| DE | 202010015119 U1 | 1/2011 |
| DE | 202010015122 U1 | 1/2011 |
| DE | 102009055948 A1 | 2/2011 |
| DE | 202009012001 U1 | 2/2011 |
| DE | 202010012475 U1 | 2/2011 |
| DE | 202010012937 U1 | 2/2011 |
| DE | 202010013477 U1 | 2/2011 |
| DE | 202010015435 U1 | 2/2011 |
| DE | 202010015817 U1 | 2/2011 |
| DE | 202010015833 U1 | 2/2011 |
| DE | 202010016914 U1 | 2/2011 |
| DE | 202011106127 U1 | 2/2011 |
| DE | 102009029611 A1 | 3/2011 |
| DE | 102009040671 A1 | 3/2011 |
| DE | 202010016104 U1 | 3/2011 |
| DE | 202010016159 U1 | 3/2011 |
| DE | 202011001411 U1 | 3/2011 |
| DE | 102009033771 A1 | 4/2011 |
| DE | 102009048097 A1 | 4/2011 |
| DE | 102009048855 A1 | 4/2011 |
| DE | 202009015518 U1 | 4/2011 |
| DE | 202009016371 U1 | 4/2011 |
| DE | 202009016388 U1 | 4/2011 |
| DE | 202009018151 U1 | 4/2011 |
| DE | 202011001333 U1 | 4/2011 |
| DE | 202011001761 U1 | 4/2011 |
| DE | 102009047152 A1 | 5/2011 |
| DE | 102009051973 A1 | 5/2011 |
| DE | 102009052264 A1 | 5/2011 |
| DE | 102009052442 A1 | 5/2011 |
| DE | 102009053335 A1 | 5/2011 |
| DE | 102009053698 A1 | 5/2011 |
| DE | 202010017250 U1 | 5/2011 |
| DE | 202011001320 U1 | 5/2011 |
| DE | 202011001943 U1 | 5/2011 |
| DE | 202011002283 U1 | 5/2011 |
| DE | 202011003174 U1 | 5/2011 |
| DE | 202011003490 U1 | 5/2011 |
| DE | 202011003534 U1 | 5/2011 |
| DE | 202011003913 U1 | 5/2011 |
| DE | 102009044804 A1 | 6/2011 |
| DE | 102009055722 A1 | 6/2011 |
| DE | 102009056318 A1 | 6/2011 |
| DE | 102009056958 A1 | 6/2011 |
| DE | 102009057937 A1 | 6/2011 |
| DE | 102009059914 A1 | 6/2011 |
| DE | 102010022556 B3 | 6/2011 |
| DE | 102010051105 A1 | 6/2011 |
| DE | 202011000383 U1 | 6/2011 |
| DE | 202011000411 U1 | 6/2011 |
| DE | 202011000935 U1 | 6/2011 |
| DE | 202011000969 U1 | 6/2011 |
| DE | 202011100322 U1 | 6/2011 |
| DE | 102010004117 A1 | 7/2011 |
| DE | 102010004456 A1 | 7/2011 |
| DE | 102010004647 A1 | 7/2011 |
| DE | 202010015110 U1 | 7/2011 |
| DE | 202011005489 U1 | 7/2011 |
| DE | 202011005591 U1 | 7/2011 |
| DE | 102010006566 A1 | 8/2011 |
| DE | 102010006567 A1 | 8/2011 |
| DE | 102010007016 A1 | 8/2011 |
| DE | 102010008600 A1 | 8/2011 |
| DE | 202011000928 U1 | 8/2011 |
| DE | 202011050330 U1 | 8/2011 |
| DE | 202011050343 U1 | 8/2011 |
| DE | 202011101999 U1 | 8/2011 |
| DE | 202011102615 U1 | 8/2011 |
| DE | 102010002751 A1 | 9/2011 |
| DE | 102010009595 A1 | 9/2011 |
| DE | 102010010249 A1 | 9/2011 |
| DE | 102010015983 A1 | 9/2011 |
| DE | 102010016163 A1 | 9/2011 |
| DE | 202010006733 U1 | 9/2011 |
| DE | 202010006800 U1 | 9/2011 |
| DE | 202011005287 U1 | 9/2011 |
| DE | 202011050810 U1 | 9/2011 |
| DE | 202011102672 U1 | 9/2011 |
| DE | 102010003466 A1 | 10/2011 |
| DE | 102010008867 A1 | 10/2011 |
| DE | 102010013369 A1 | 10/2011 |
| DE | 102010013673 A1 | 10/2011 |
| DE | 102010014859 A1 | 10/2011 |
| DE | 202007016966 U1 | 10/2011 |
| DE | 202010007234 U1 | 10/2011 |
| DE | 202010009344 U1 | 10/2011 |
| DE | 202011100947 U1 | 10/2011 |
| DE | 202011101436 U1 | 10/2011 |
| DE | 202011101562 U1 | 10/2011 |
| DE | 202011103491 U1 | 10/2011 |
| DE | 202011104978 U1 | 10/2011 |
| DE | 202011105904 U1 | 10/2011 |
| DE | 102010016676 A1 | 11/2011 |
| DE | 102010016677 A1 | 11/2011 |
| DE | 102010019158 A1 | 11/2011 |
| DE | 102010020196 A1 | 11/2011 |
| DE | 102010029003 A1 | 11/2011 |
| DE | 102010029004 A1 | 11/2011 |
| DE | 102010029006 A1 | 11/2011 |
| DE | 202010008691 U1 | 11/2011 |
| DE | 202010017422 U1 | 11/2011 |
| DE | 202011050621 U1 | 11/2011 |
| DE | 202011102319 U1 | 11/2011 |
| DE | 202011103057 U1 | 11/2011 |
| DE | 202011103448 U1 | 11/2011 |
| DE | 202011104734 U1 | 11/2011 |
| DE | 202011105402 U1 | 11/2011 |
| DE | 202011105896 U1 | 11/2011 |
| DE | 102009051302 A1 | 12/2011 |
| DE | 102010022358 A1 | 12/2011 |
| DE | 102010022472 A1 | 12/2011 |
| DE | 102010022914 A1 | 12/2011 |
| DE | 102010023217 A1 | 12/2011 |
| DE | 102010023237 A1 | 12/2011 |
| DE | 102010023773 A1 | 12/2011 |
| DE | 102010024514 A1 | 12/2011 |
| DE | 102010029739 A1 | 12/2011 |
| DE | 202010008417 U1 | 12/2011 |
| DE | 202010008421 U1 | 12/2011 |
| DE | 202011003262 U1 | 12/2011 |
| DE | 202011106117 U1 | 12/2011 |
| DE | 102010021271 A1 | 1/2012 |
| DE | 102010025825 A1 | 1/2012 |
| DE | 102010027046 A1 | 1/2012 |
| DE | 102010027437 A1 | 1/2012 |

(56) References Cited

FOREIGN PATENT DOCUMENTS

| | | |
|---|---|---|
| DE | 102010032019 A1 | 1/2012 |
| DE | 102011104376 A1 | 1/2012 |
| DE | 202009018566 U1 | 1/2012 |
| DE | 202010013933 U1 | 1/2012 |
| DE | 202010014172 U1 | 1/2012 |
| DE | 202010017510 U1 | 1/2012 |
| DE | 202010017511 U1 | 1/2012 |
| DE | 202011051943 U1 | 1/2012 |
| DE | 202011102438 U1 | 1/2012 |
| DE | 202011102733 U1 | 1/2012 |
| DE | 202011102734 U1 | 1/2012 |
| DE | 202011102735 U1 | 1/2012 |
| DE | 202011102736 U1 | 1/2012 |
| DE | 202011104329 U1 | 1/2012 |
| DE | 102010018522 A1 | 2/2012 |
| DE | 102010033560 A1 | 2/2012 |
| DE | 102010034730 A1 | 2/2012 |
| DE | 102010039083 A1 | 2/2012 |
| DE | 102010039610 A1 | 2/2012 |
| DE | 202010014945 U1 | 2/2012 |
| DE | 202011106955 U1 | 2/2012 |
| DE | 202012000203 U1 | 2/2012 |
| DE | 202012000369 U1 | 2/2012 |
| DE | 102010035610 A1 | 3/2012 |
| DE | 102010035804 A1 | 3/2012 |
| DE | 102010037418 A1 | 3/2012 |
| DE | 102010037487 A1 | 3/2012 |
| DE | 102010040050 A1 | 3/2012 |
| DE | 102010041134 A1 | 3/2012 |
| DE | 102010041161 A1 | 3/2012 |
| DE | 102010045493 A1 | 3/2012 |
| DE | 102010045864 A1 | 3/2012 |
| DE | 102010045865 A1 | 3/2012 |
| DE | 102010052505 B3 | 3/2012 |
| DE | 102011017467 B3 | 3/2012 |
| DE | 202011050815 U1 | 3/2012 |
| DE | 102010049256 A1 | 4/2012 |
| DE | 102010060154 A1 | 4/2012 |
| DE | 202011000078 U1 | 4/2012 |
| DE | 202011106764 U1 | 4/2012 |
| DE | 202012002547 U1 | 4/2012 |
| DE | 202012003649 U1 | 4/2012 |
| DE | 102010050321 A1 | 5/2012 |
| DE | 102010050866 A1 | 5/2012 |
| DE | 102010052580 A1 | 5/2012 |
| DE | 102010060666 A1 | 5/2012 |
| DE | 102010062026 A1 | 5/2012 |
| DE | 202012004135 U1 | 5/2012 |
| DE | 202012004423 U1 | 5/2012 |
| DE | 202012101572 U1 | 5/2012 |
| DE | 202012101747 U1 | 5/2012 |
| DE | 102009061089 A1 | 6/2012 |
| DE | 102010053330 A1 | 6/2012 |
| DE | 202011052119 U1 | 6/2012 |
| DE | 202012001171 U1 | 6/2012 |
| DE | 102010056591 A1 | 7/2012 |
| DE | 102011000039 A1 | 7/2012 |
| DE | 102011008025 A1 | 7/2012 |
| DE | 102011009239 A1 | 7/2012 |
| DE | 202011004843 U1 | 7/2012 |
| DE | 202011004844 U1 | 7/2012 |
| DE | 202012005162 U1 | 7/2012 |
| DE | 202012005663 U1 | 7/2012 |
| DE | 202012005671 U1 | 7/2012 |
| DE | 202012005673 U1 | 7/2012 |
| DE | 202012101578 U1 | 7/2012 |
| DE | 102011000867 A1 | 8/2012 |
| DE | 102011008591 A1 | 8/2012 |
| DE | 102011010148 A1 | 8/2012 |
| DE | 102011012600 A1 | 8/2012 |
| DE | 202011107266 U1 | 8/2012 |
| DE | 202012101633 U1 | 8/2012 |
| DE | 202012102185 U1 | 8/2012 |
| DE | 202011100337 U1 | 9/2012 |
| DE | 202011101834 U1 | 9/2012 |
| DE | 202012008644 U1 | 9/2012 |
| DE | 202012102863 U1 | 9/2012 |
| DE | 202012103392 U1 | 9/2012 |
| DE | 102011007519 A1 | 10/2012 |
| DE | 102011007521 A1 | 10/2012 |
| DE | 102011116094 A1 | 10/2012 |
| DE | 202011050556 U1 | 10/2012 |
| DE | 202011102960 U1 | 10/2012 |
| DE | 202011105218 U1 | 10/2012 |
| DE | 202012007291 U1 | 10/2012 |
| DE | 202012102861 U1 | 10/2012 |
| DE | 102011101029 A1 | 11/2012 |
| DE | 102011121135 A1 | 11/2012 |
| DE | 202012009700 U1 | 11/2012 |
| DE | 202012104090 U1 | 11/2012 |
| DE | 202012104142 U1 | 11/2012 |
| DE | 102011050756 A1 | 12/2012 |
| DE | 102011050856 A1 | 12/2012 |
| DE | 102011051283 A1 | 12/2012 |
| DE | 102011076971 A1 | 12/2012 |
| DE | 102011103276 A1 | 12/2012 |
| DE | 102011103507 A1 | 12/2012 |
| DE | 102011103724 A1 | 12/2012 |
| DE | 102011104918 A1 | 12/2012 |
| DE | 102011105463 A1 | 12/2012 |
| DE | 102011105511 A1 | 12/2012 |
| DE | 202012010803 U1 | 12/2012 |
| DE | 202012103903 U1 | 12/2012 |
| DE | 102011079498 A1 | 1/2013 |
| DE | 102011088153 B3 | 1/2013 |
| DE | 102011106462 A1 | 1/2013 |
| DE | 102011107671 A1 | 1/2013 |
| DE | 102011108087 A1 | 1/2013 |
| DE | 102011108326 A1 | 1/2013 |
| DE | 202010017744 U1 | 1/2013 |
| DE | 202012008488 U1 | 1/2013 |
| DE | 202012011438 U1 | 1/2013 |
| DE | 202012012290 U1 | 1/2013 |
| DE | 202013100078 U1 | 1/2013 |
| DE | 102011110467 A1 | 2/2013 |
| DE | 102011116926 B3 | 2/2013 |
| DE | 102012102214 B3 | 2/2013 |
| DE | 202011107554 U1 | 2/2013 |
| DE | 202012007641 U1 | 2/2013 |
| DE | 202012010882 U1 | 2/2013 |
| DE | 202012012469 U1 | 2/2013 |
| DE | 102011113289 A1 | 3/2013 |
| DE | 102011117291 B3 | 3/2013 |
| DE | 202011052481 U1 | 3/2013 |
| DE | 202011108518 U1 | 3/2013 |
| DE | 202011109417 U1 | 3/2013 |
| DE | 202013000211 U1 | 3/2013 |
| DE | 202013100874 U1 | 3/2013 |
| DE | 102011085120 A1 | 4/2013 |
| DE | 102011115435 A1 | 4/2013 |
| DE | 102011115524 A1 | 4/2013 |
| DE | 102011115923 A1 | 4/2013 |
| DE | 202013002774 U1 | 4/2013 |
| DE | 202013101192 U1 | 4/2013 |
| DE | 102011055323 A1 | 5/2013 |
| DE | 102011086921 A1 | 5/2013 |
| DE | 102011117342 A1 | 5/2013 |
| DE | 102011119175 A1 | 5/2013 |
| DE | 102012022286 A1 | 5/2013 |
| DE | 202012001078 U1 | 5/2013 |
| DE | 202012001833 U1 | 5/2013 |
| DE | 202013101890 U1 | 5/2013 |
| DE | 102011055904 A1 | 6/2013 |
| DE | 102011055951 A1 | 6/2013 |
| DE | 102011057028 A1 | 6/2013 |
| DE | 102011119995 A1 | 6/2013 |
| DE | 102011122126 A1 | 6/2013 |
| DE | 202013001818 U1 | 6/2013 |
| DE | 202013003029 U1 | 6/2013 |
| DE | 202013004877 U1 | 6/2013 |
| DE | 102012001195 A1 | 7/2013 |
| DE | 202013000507 U1 | 7/2013 |
| DE | 202013004372 U1 | 7/2013 |
| DE | 202013102571 U1 | 7/2013 |

(56) References Cited

FOREIGN PATENT DOCUMENTS

| | | |
|---|---|---|
| DE | 102012003374 A1 | 8/2013 |
| DE | 202013005255 U1 | 8/2013 |
| DE | 202013103076 U1 | 8/2013 |
| DE | 102012004773 A1 | 9/2013 |
| DE | 102012005251 A1 | 9/2013 |
| DE | 102012102243 A1 | 9/2013 |
| DE | 202012005413 U1 | 9/2013 |
| DE | 102012006033 A1 | 10/2013 |
| DE | 102012007060 A1 | 10/2013 |
| DE | 102012007535 A1 | 10/2013 |
| DE | 102012007682 A1 | 10/2013 |
| DE | 102012025601 A1 | 10/2013 |
| DE | 102012204989 A1 | 10/2013 |
| DE | 102012206165 A1 | 10/2013 |
| DE | 202013007425 U1 | 10/2013 |
| DE | 202013008940 U1 | 11/2013 |
| DE | 102012011434 A1 | 12/2013 |
| DE | 102012012137 A1 | 12/2013 |
| DE | 102012104630 A1 | 12/2013 |
| DE | 102012104702 A1 | 12/2013 |
| DE | 102012105050 A1 | 12/2013 |
| DE | 102012105053 A1 | 12/2013 |
| DE | 102013005441 A1 | 12/2013 |
| DE | 202013010199 U1 | 12/2013 |
| DE | 202013009777 U1 | 1/2014 |
| DE | 102012015883 A1 | 2/2014 |
| DE | 102012020649 A1 | 2/2014 |
| DE | 202012104361 U1 | 2/2014 |
| DE | 202013009100 U1 | 2/2014 |
| DE | 102012017382 A1 | 3/2014 |
| DE | 102012018825 A1 | 3/2014 |
| DE | 102012111884 A1 | 3/2014 |
| DE | 102013100001 A1 | 3/2014 |
| DE | 202013005015 U1 | 3/2014 |
| DE | 202013104950 U1 | 3/2014 |
| DE | 202014100961 U1 | 3/2014 |
| DE | 102012020355 A1 | 4/2014 |
| DE | 102012022738 A1 | 5/2014 |
| DE | 102012022939 A1 | 5/2014 |
| DE | 202013001670 U1 | 5/2014 |
| DE | 202013011512 U1 | 5/2014 |
| DE | 202014101153 U1 | 5/2014 |
| DE | 102012025517 A1 | 6/2014 |
| DE | 202013001904 U1 | 6/2014 |
| DE | 102012224528 A1 | 7/2014 |
| DE | 102013000135 A1 | 7/2014 |
| DE | 102013002113 A1 | 8/2014 |
| DE | 102013201940 A1 | 8/2014 |
| DE | 102014102746 A1 | 8/2014 |
| DE | 102013003785 A1 | 9/2014 |
| DE | 102013004914 A1 | 9/2014 |
| DE | 102013204196 A1 | 9/2014 |
| DE | 102013204947 A1 | 9/2014 |
| DE | 102013204954 A1 | 9/2014 |
| DE | 202013005357 U1 | 9/2014 |
| DE | 202013005668 U1 | 9/2014 |
| DE | 202013011887 U1 | 9/2014 |
| DE | 202014006599 U1 | 9/2014 |
| DE | 202014104212 U1 | 9/2014 |
| DE | 102013103185 A1 | 10/2014 |
| DE | 102014105862 A1 | 10/2014 |
| DE | 202014007017 U1 | 10/2014 |
| DE | 202014103977 U1 | 10/2014 |
| DE | 202014008000 U1 | 11/2014 |
| DE | 102013009530 A1 | 12/2014 |
| DE | 102013009734 A1 | 12/2014 |
| DE | 102013009834 A1 | 12/2014 |
| DE | 102013009944 A1 | 12/2014 |
| DE | 102013211167 A1 | 12/2014 |
| DE | 102013211682 A1 | 12/2014 |
| DE | 202014008488 U1 | 12/2014 |
| DE | 202014009489 U1 | 12/2014 |
| DE | 202014105615 U1 | 1/2015 |
| DE | 102013216173 A1 | 2/2015 |
| DE | 102014111926 A1 | 2/2015 |
| DE | 202013104917 U1 | 2/2015 |
| DE | 202014009173 U1 | 2/2015 |
| DE | 202015000200 U1 | 2/2015 |
| DE | 202015101348 U1 | 3/2015 |
| DE | 102013111514 A1 | 4/2015 |
| DE | 202015002312 U1 | 4/2015 |
| DE | 102013018418 A1 | 5/2015 |
| DE | 102013112085 A1 | 5/2015 |
| DE | 202014009488 U1 | 5/2015 |
| DE | 202015102013 U1 | 5/2015 |
| DE | 202015102294 U1 | 5/2015 |
| DE | 102013225173 A1 | 6/2015 |
| DE | 202015002866 U1 | 6/2015 |
| DE | 202015101589 U1 | 6/2015 |
| DE | 202015102577 U1 | 6/2015 |
| DE | 102014000277 A1 | 7/2015 |
| DE | 102014100596 A1 | 7/2015 |
| DE | 202015102941 U1 | 7/2015 |
| DE | 202015102947 U1 | 7/2015 |
| DE | 102014106800 A1 | 8/2015 |
| DE | 102014003746 A1 | 9/2015 |
| DE | 102014003971 A1 | 9/2015 |
| DE | 102014102729 A1 | 9/2015 |
| DE | 102014103782 A1 | 9/2015 |
| DE | 202014004487 U1 | 9/2015 |
| DE | 102014005140 A1 | 10/2015 |
| DE | 102014007089 A1 | 11/2015 |
| DE | 102014014697 B3 | 11/2015 |
| DE | 102014106964 A1 | 11/2015 |
| DE | 102014208303 A1 | 11/2015 |
| DE | 202015007194 U1 | 11/2015 |
| DE | 102014007971 A1 | 12/2015 |
| DE | 102014012339 A1 | 12/2015 |
| DE | 202014008329 U1 | 1/2016 |
| DE | 202015008137 U1 | 1/2016 |
| DE | 202016100046 U1 | 1/2016 |
| DE | 102014011705 A1 | 2/2016 |
| DE | 102014012995 A1 | 3/2016 |
| DE | 102014113216 A1 | 3/2016 |
| DE | 202014009503 U1 | 3/2016 |
| DE | 202014009504 U1 | 3/2016 |
| DE | 202016100661 U1 | 3/2016 |
| DE | 202016100753 U1 | 3/2016 |
| DE | 202015000209 U1 | 4/2016 |
| DE | 202016001119 U1 | 4/2016 |
| DE | 202016002486 U1 | 4/2016 |
| DE | 102014225631 A1 | 6/2016 |
| DE | 102015202596 B3 | 6/2016 |
| DE | 102016100559 B3 | 6/2016 |
| DE | 202015009011 U1 | 6/2016 |
| DE | 202016003333 U1 | 6/2016 |
| DE | 202016102906 U1 | 6/2016 |
| DE | 102015006717 B3 | 7/2016 |
| DK | 613787 | 11/1987 |
| EP | 199233 A1 | 10/1986 |
| EP | 0230227 A2 | 7/1987 |
| EP | 321441 A1 | 6/1989 |
| EP | 421727 A * | 4/1991 ............... E04D 1/34 |
| EP | 0549560 A1 | 6/1993 |
| EP | 866288 A2 | 9/1998 |
| EP | 0890688 A1 | 1/1999 |
| EP | 1020930 A2 | 7/2000 |
| EP | 1035591 A1 | 9/2000 |
| EP | 1039549 A1 | 9/2000 |
| EP | 1079442 A1 | 2/2001 |
| EP | 1296382 A1 | 3/2003 |
| EP | 1 310 747 A1 | 5/2003 |
| EP | 1310747 A1 * | 5/2003 ............. H02S 20/23 |
| EP | 1348915 A2 | 10/2003 |
| EP | 1389708 A2 | 2/2004 |
| EP | 1447494 A2 | 8/2004 |
| EP | 1619727 A2 | 1/2006 |
| EP | 1666680 A1 * | 6/2006 |
| EP | 1677363 A1 | 7/2006 |
| EP | 1717384 A1 | 11/2006 |
| EP | 1734588 A2 | 12/2006 |
| EP | 1755170 A2 | 2/2007 |
| EP | 1764454 A2 | 3/2007 |
| EP | 1767719 A2 | 3/2007 |

(56) References Cited

FOREIGN PATENT DOCUMENTS

| | | | |
|---|---|---|---|
| EP | 1783440 | A2 | 5/2007 |
| EP | 1786041 | A2 | 5/2007 |
| EP | 1788322 | A1 | 5/2007 |
| EP | 1798357 | A1 | 6/2007 |
| EP | 1804008 | A1 | 7/2007 |
| EP | 1826504 | A2 | 8/2007 |
| EP | 1826507 | A2 | 8/2007 |
| EP | 1878864 | A2 | 1/2008 |
| EP | 1947402 | A1 | 7/2008 |
| EP | 1970966 | A2 | 9/2008 |
| EP | 1985944 | A1 | 10/2008 |
| EP | 2012365 | A1 | 1/2009 |
| EP | 2017554 | A2 | 1/2009 |
| EP | 2023059 | A1 | 2/2009 |
| EP | 2031324 | A2 | 3/2009 |
| EP | 2034249 | A1 | 3/2009 |
| EP | 2040014 | A2 | 3/2009 |
| EP | 2058606 | A1 | 5/2009 |
| EP | 2080965 | A2 | 7/2009 |
| EP | 2086019 | A1 | 8/2009 |
| EP | 2088386 | A2 | 8/2009 |
| EP | 2101119 | | 9/2009 |
| EP | 2109153 | A2 | 10/2009 |
| EP | 2116794 | A2 | 11/2009 |
| EP | 2136412 | A2 | 12/2009 |
| EP | 2146160 | A1 | 1/2010 |
| EP | 2149648 | A1 | 2/2010 |
| EP | 2159847 | A2 | 3/2010 |
| EP | 2184418 | A1 | 5/2010 |
| EP | 2187146 | A1 | 5/2010 |
| EP | 2190030 | A2 | 5/2010 |
| EP | 2211391 | A1 | 7/2010 |
| EP | 2218845 | A2 | 8/2010 |
| EP | 2218981 | A2 | 8/2010 |
| EP | 2219228 | A1 | 8/2010 |
| EP | 2228502 | A1 | 9/2010 |
| EP | 2239388 | A1 | 10/2010 |
| EP | 2256353 | A2 | 12/2010 |
| EP | 2256431 | A1 | 12/2010 |
| EP | 2256821 | A2 | 12/2010 |
| EP | 2262003 | A1 | 12/2010 |
| EP | 2267378 | A2 | 12/2010 |
| EP | 2290302 | A2 | 3/2011 |
| EP | 2293346 | A2 | 3/2011 |
| EP | 2295893 | A1 | 3/2011 |
| EP | 2296190 | A2 | 3/2011 |
| EP | 2299204 | A2 | 3/2011 |
| EP | 2302694 | A1 | 3/2011 |
| EP | 2306032 | A2 | 4/2011 |
| EP | 2309203 | A1 | 4/2011 |
| EP | 2309549 | A2 | 4/2011 |
| EP | 2309552 | A1 | 4/2011 |
| EP | 2312080 | A2 | 4/2011 |
| EP | 2320155 | A1 | 5/2011 |
| EP | 2322872 | A1 | 5/2011 |
| EP | 2323175 | A1 | 5/2011 |
| EP | 2327942 | A2 | 6/2011 |
| EP | 2333454 | A1 | 6/2011 |
| EP | 2339087 | A1 | 6/2011 |
| EP | 2346089 | A1 | 7/2011 |
| EP | 2352177 | A1 | 8/2011 |
| EP | 2360740 | A1 | 8/2011 |
| EP | 2362034 | A2 | 8/2011 |
| EP | 2362162 | A1 | 8/2011 |
| EP | 2372785 | A1 | 10/2011 |
| EP | 2381188 | A2 | 10/2011 |
| EP | 2388830 | A1 | 11/2011 |
| EP | 2395555 | A2 | 12/2011 |
| EP | 2395559 | A1 | 12/2011 |
| EP | 2398059 | A1 | 12/2011 |
| EP | 2405068 | A2 | 1/2012 |
| EP | 2410572 | A1 | 1/2012 |
| EP | 2423620 | A2 | 2/2012 |
| EP | 2423621 | A2 | 2/2012 |
| EP | 2431546 | A1 | 3/2012 |
| EP | 2439464 | A2 | 4/2012 |
| EP | 2442049 | A2 | 4/2012 |
| EP | 2458646 | A2 | 5/2012 |
| EP | 2463914 | A1 | 6/2012 |
| EP | 2466227 | A1 | 6/2012 |
| EP | 2476972 | A1 | 7/2012 |
| EP | 2479514 | A2 | 7/2012 |
| EP | 2487726 | A1 | 8/2012 |
| EP | 2487727 | A1 | 8/2012 |
| EP | 2495507 | A1 | 9/2012 |
| EP | 2498023 | A1 | 9/2012 |
| EP | 2503259 | A1 | 9/2012 |
| EP | 2503600 | A2 | 9/2012 |
| EP | 2511625 | A2 | 10/2012 |
| EP | 2520876 | A1 | 11/2012 |
| EP | 2522926 | A2 | 11/2012 |
| EP | 2523224 | A2 | 11/2012 |
| EP | 2525164 | A1 | 11/2012 |
| EP | 2527759 | A2 | 11/2012 |
| EP | 2527763 | A2 | 11/2012 |
| EP | 2528107 | A1 | 11/2012 |
| EP | 2530404 | A2 | 12/2012 |
| EP | 2533300 | A2 | 12/2012 |
| EP | 2535661 | A1 | 12/2012 |
| EP | 2541163 | A1 | 1/2013 |
| EP | 2546584 | A1 | 1/2013 |
| EP | 2549552 | A2 | 1/2013 |
| EP | 2551421 | A1 | 1/2013 |
| EP | 2551608 | A1 | 1/2013 |
| EP | 2565341 | A2 | 3/2013 |
| EP | 2575182 | A1 | 4/2013 |
| EP | 2578964 | A1 | 4/2013 |
| EP | 2581683 | A1 | 4/2013 |
| EP | 2584284 | A2 | 4/2013 |
| EP | 2590225 | A1 | 5/2013 |
| EP | 2592364 | A1 | 5/2013 |
| EP | 2599626 | A1 | 6/2013 |
| EP | 2600078 | A2 | 6/2013 |
| EP | 2600415 | A1 | 6/2013 |
| EP | 2600423 | A1 | 6/2013 |
| EP | 2600424 | A1 | 6/2013 |
| EP | 2600425 | A1 | 6/2013 |
| EP | 2604949 | A1 | 6/2013 |
| EP | 2607813 | A1 | 6/2013 |
| EP | 2607816 | A1 | 6/2013 |
| EP | 2615390 | A1 | 7/2013 |
| EP | 2626649 | A1 | 8/2013 |
| EP | 2626651 | A1 | 8/2013 |
| EP | 2639528 | A1 | 9/2013 |
| EP | 2653633 | A1 | 10/2013 |
| EP | 2657986 | A1 | 10/2013 |
| EP | 2669451 | A2 | 12/2013 |
| EP | 2674987 | A1 | 12/2013 |
| EP | 2698828 | A1 | 2/2014 |
| EP | 2704210 | A1 | 3/2014 |
| EP | 2719974 | A1 | 4/2014 |
| EP | 2728627 | A1 | 5/2014 |
| EP | 2738318 | A1 | 6/2014 |
| EP | 2741026 | A1 | 6/2014 |
| EP | 2757592 | A1 | 7/2014 |
| EP | 2767778 | A1 | 8/2014 |
| EP | 2789932 | A1 | 10/2014 |
| EP | 2790232 | A1 | 10/2014 |
| EP | 2348263 | A3 | 12/2014 |
| EP | 2811239 | A1 | 12/2014 |
| EP | 2830102 | A1 | 1/2015 |
| EP | 2838121 | A1 | 2/2015 |
| EP | 2866268 | A1 | 4/2015 |
| EP | 2871299 | A1 | 5/2015 |
| EP | 2886761 | A2 | 6/2015 |
| EP | 2886973 | A1 | 6/2015 |
| EP | 2921799 | A1 | 9/2015 |
| EP | 2921800 | A1 | 9/2015 |
| EP | 2952827 | A1 | 12/2015 |
| ES | 1068955 | U | 1/2009 |
| ES | 1070956 | U | 11/2009 |
| ES | 1071742 | U | 3/2010 |
| ES | 1075498 | U | 10/2011 |
| FI | 20080020 | | 1/2008 |

(56) References Cited

FOREIGN PATENT DOCUMENTS

| | | | |
|---|---|---|---|
| FI | 20125426 | A | 10/2013 |
| FR | 2349702 | A1 | 11/1977 |
| FR | 2417606 | A1 | 9/1979 |
| FR | 2461332 | A1 | 1/1981 |
| FR | 2489397 | A1 | 3/1982 |
| FR | 2503223 | A1 | 10/1982 |
| FR | 2516964 | A1 | 5/1983 |
| FR | 2526528 | A1 | 11/1983 |
| FR | 2540921 | A1 | 8/1984 |
| FR | 2558577 | A1 | 7/1985 |
| FR | 2613066 | A1 | 9/1988 |
| FR | 2618946 | A1 | 2/1989 |
| FR | 2651030 | A1 | 2/1991 |
| FR | 2680817 | A1 | 3/1993 |
| FR | 2692944 | A3 | 12/1993 |
| FR | 2754840 | U1 | 4/1998 |
| FR | 2831247 | A1 | 4/2003 |
| FR | 2846019 | A1 | 4/2004 |
| FR | 2857437 | A1 | 1/2005 |
| FR | 2857997 | A1 | 1/2005 |
| FR | 2870079 | A1 | 11/2005 |
| FR | 2876840 | A1 | 4/2006 |
| FR | 2883587 | A1 | 9/2006 |
| FR | 2890725 | A1 | 3/2007 |
| FR | 2899922 | A1 | 10/2007 |
| FR | 2902815 | A1 | 12/2007 |
| FR | 2905751 | A1 | 3/2008 |
| FR | 2914785 | A1 | 10/2008 |
| FR | 2917417 | A1 | 12/2008 |
| FR | 2919640 | A1 | 2/2009 |
| FR | 2920452 | A1 | 3/2009 |
| FR | 2921397 | A1 | 3/2009 |
| FR | 2923082 | A1 | 5/2009 |
| FR | 2925950 | A1 | 7/2009 |
| FR | 2929301 | A1 | 10/2009 |
| FR | 2930304 | A1 | 10/2009 |
| FR | 2931181 | A1 | 11/2009 |
| FR | 2931856 | A1 | 12/2009 |
| FR | 2932831 | A1 | 12/2009 |
| FR | 2932832 | A1 | 12/2009 |
| FR | 2933999 | A1 | 1/2010 |
| FR | 2934616 | A1 | 2/2010 |
| FR | 2934619 | A3 | 2/2010 |
| FR | 2934620 | A3 | 2/2010 |
| FR | 2934623 | A1 | 2/2010 |
| FR | 2935410 | A1 | 3/2010 |
| FR | 2938567 | A1 | 5/2010 |
| FR | 2938698 | A1 | 5/2010 |
| FR | 2938699 | A3 | 5/2010 |
| FR | 2938859 | A1 | 5/2010 |
| FR | 2939242 | A1 | 6/2010 |
| FR | 2940523 | A1 | 6/2010 |
| FR | 2940664 | A1 | 7/2010 |
| FR | 2940810 | A1 | 7/2010 |
| FR | 2940884 | A1 | 7/2010 |
| FR | 2941726 | A1 | 8/2010 |
| FR | 2942254 | A1 | 8/2010 |
| FR | 2942486 | A1 | 8/2010 |
| FR | 2942918 | A1 | 9/2010 |
| FR | 2943767 | A1 | 10/2010 |
| FR | 2944037 | A1 | 10/2010 |
| FR | 2944038 | A1 | 10/2010 |
| FR | 2944042 | A1 | 10/2010 |
| FR | 2944304 | A1 | 10/2010 |
| FR | 2944568 | A1 | 10/2010 |
| FR | 2944817 | A1 | 10/2010 |
| FR | 2944818 | A1 | 10/2010 |
| FR | 2944819 | A1 | 10/2010 |
| FR | 2945561 | A1 | 11/2010 |
| FR | 2947017 | A1 | 12/2010 |
| FR | 2948136 | A1 | 1/2011 |
| FR | 2948710 | A1 | 2/2011 |
| FR | 2949132 | A1 | 2/2011 |
| FR | 2949147 | A1 | 2/2011 |
| FR | 2949493 | A1 | 3/2011 |
| FR | 2949770 | A1 | 3/2011 |
| FR | 2950911 | A1 | 4/2011 |
| FR | 2951478 | A1 | 4/2011 |
| FR | 2951479 | A1 | 4/2011 |
| FR | 2951480 | A1 | 4/2011 |
| FR | 2951481 | A1 | 4/2011 |
| FR | 2951508 | A1 | 4/2011 |
| FR | 2951529 | A1 | 4/2011 |
| FR | 2951757 | A1 | 4/2011 |
| FR | 2951758 | A1 | 4/2011 |
| FR | 2951761 | A1 | 4/2011 |
| FR | 2952093 | A1 | 5/2011 |
| FR | 2952694 | A1 | 5/2011 |
| FR | 2952755 | A1 | 5/2011 |
| FR | 2953237 | A1 | 6/2011 |
| FR | 2953541 | A1 | 6/2011 |
| FR | 2953912 | A1 | 6/2011 |
| FR | 2954791 | A1 | 7/2011 |
| FR | 2955130 | A1 | 7/2011 |
| FR | 2955131 | A1 | 7/2011 |
| FR | 2956198 | A1 | 8/2011 |
| FR | 2956199 | A1 | 8/2011 |
| FR | 2956679 | A1 | 8/2011 |
| FR | 2956680 | A1 | 8/2011 |
| FR | 2956681 | A1 | 8/2011 |
| FR | 2956682 | A1 | 8/2011 |
| FR | 2957405 | A1 | 9/2011 |
| FR | 2957618 | A1 | 9/2011 |
| FR | 2957619 | A1 | 9/2011 |
| FR | 2958023 | A1 | 9/2011 |
| FR | 2958024 | A1 | 9/2011 |
| FR | 2958378 | A1 | 10/2011 |
| FR | 2958382 | A1 | 10/2011 |
| FR | 2958453 | A1 | 10/2011 |
| FR | 2958454 | A1 | 10/2011 |
| FR | 2958732 | A3 | 10/2011 |
| FR | 2959063 | A1 | 10/2011 |
| FR | 2959520 | A1 | 11/2011 |
| FR | 2959556 | A1 | 11/2011 |
| FR | 2959800 | A1 | 11/2011 |
| FR | 2960626 | A1 | 12/2011 |
| FR | 2960627 | A1 | 12/2011 |
| FR | 2961235 | A1 | 12/2011 |
| FR | 2961276 | A1 | 12/2011 |
| FR | 2961277 | A1 | 12/2011 |
| FR | 2961298 | A1 | 12/2011 |
| FR | 2961299 | A1 | 12/2011 |
| FR | 2962796 | A1 | 1/2012 |
| FR | 2962797 | A1 | 1/2012 |
| FR | 2962798 | A1 | 1/2012 |
| FR | 2963412 | A1 | 2/2012 |
| FR | 2963801 | A1 | 2/2012 |
| FR | 2964129 | A1 | 3/2012 |
| FR | 2964399 | A1 | 3/2012 |
| FR | 2964730 | A1 | 3/2012 |
| FR | 2965025 | A1 | 3/2012 |
| FR | 2965095 | A1 | 3/2012 |
| FR | 2965664 | A1 | 4/2012 |
| FR | 2965671 | A1 | 4/2012 |
| FR | 2968069 | A1 | 6/2012 |
| FR | 2968322 | A1 | 6/2012 |
| FR | 2968323 | A1 | 6/2012 |
| FR | 2968376 | A1 | 6/2012 |
| FR | 2968387 | A1 | 6/2012 |
| FR | 2969191 | A1 | 6/2012 |
| FR | 2969261 | A1 | 6/2012 |
| FR | 2969744 | A1 | 6/2012 |
| FR | 2970016 | A1 | 7/2012 |
| FR | 2970988 | A1 | 8/2012 |
| FR | 2970989 | A1 | 8/2012 |
| FR | 2971577 | A1 | 8/2012 |
| FR | 2971838 | A1 | 8/2012 |
| FR | 2974129 | A1 | 10/2012 |
| FR | 2974375 | A1 | 10/2012 |
| FR | 2975174 | A1 | 11/2012 |
| FR | 2976134 | A1 | 12/2012 |
| FR | 2976655 | A1 | 12/2012 |
| FR | 2977009 | A1 | 12/2012 |
| FR | 2977395 | A1 | 1/2013 |

(56) References Cited

FOREIGN PATENT DOCUMENTS

| | | |
|---|---|---|
| FR | 2981681 A1 | 4/2013 |
| FR | 2982352 A1 | 5/2013 |
| FR | 2983502 A1 | 6/2013 |
| FR | 2983890 A1 | 6/2013 |
| FR | 2984025 A1 | 6/2013 |
| FR | 2985376 A1 | 7/2013 |
| FR | 2986862 A1 | 8/2013 |
| FR | 2988164 A1 | 9/2013 |
| FR | 2989153 A1 | 10/2013 |
| FR | 2990971 A1 | 11/2013 |
| FR | 2993292 A1 | 1/2014 |
| FR | 2996384 A1 | 4/2014 |
| FR | 2997740 A1 | 5/2014 |
| FR | 2999626 A1 | 6/2014 |
| FR | 3001479 A1 | 8/2014 |
| FR | 3001480 A1 | 8/2014 |
| FR | 3002620 A1 | 8/2014 |
| FR | 3004242 A1 | 10/2014 |
| FR | 3004741 A1 | 10/2014 |
| FR | 3009572 A1 | 2/2015 |
| FR | 3012581 A1 | 5/2015 |
| FR | 3015148 A1 | 6/2015 |
| FR | 3017260 A1 | 8/2015 |
| FR | 3018406 A1 | 9/2015 |
| FR | 3020648 A1 | 11/2015 |
| FR | 3027321 A1 | 4/2016 |
| FR | 3028014 A1 | 5/2016 |
| GB | 9817967 | 10/1998 |
| GB | 0502120 | 3/2005 |
| GB | 0620931 A | 11/2006 |
| GB | 0820227 A | 12/2008 |
| IT | 7823541 | 5/1978 |
| IT | 8221456 | 5/1982 |
| IT | UD20010149 A1 | 3/2003 |
| IT | TO20070348 A1 | 11/2008 |
| IT | MI20071222 A1 | 12/2008 |
| IT | PD20080086 A1 | 9/2009 |
| IT | UD20080146 A1 | 12/2009 |
| IT | PZ20080003 A1 | 4/2010 |
| IT | RM20080638 A1 | 6/2010 |
| IT | CR20090009 A1 | 9/2010 |
| IT | MI20090771 A1 | 11/2010 |
| IT | BZ20090039 A1 | 3/2011 |
| IT | AN20100002 U1 | 7/2011 |
| IT | BO20100565 A1 | 12/2011 |
| IT | AN20100155 A1 | 3/2012 |
| IT | BO20100575 A1 | 3/2012 |
| IT | MI20101893 A1 | 4/2012 |
| IT | MO20100347 A1 | 4/2012 |
| IT | MI20102230 A1 | 6/2012 |
| IT | RM20110227 | 11/2012 |
| IT | VI20110120 A1 | 11/2012 |
| IT | PD20110218 A1 | 12/2012 |
| IT | MI20111347 A1 | 1/2013 |
| IT | RM20110362 A1 | 1/2013 |
| IT | TO20120086 A1 | 8/2013 |
| IT | AN20120028 A1 | 9/2013 |
| IT | MI20120496 A1 | 9/2013 |
| IT | PS20120008 A1 | 11/2013 |
| IT | RE20120034 A1 | 11/2013 |
| IT | VI20120205 A1 | 2/2014 |
| IT | BO20120575 A1 | 4/2014 |
| JP | H11 107472 A | 4/1999 |
| JP | 2002-013266 A | 1/2002 |
| JP | 2002-294955 A | 10/2002 |
| JP | 2011058358 A * | 3/2011 ............... E04D 1/34 |
| JP | 2014-214429 A | 11/2014 |
| JP | 5838308 B2 | 1/2016 |
| LU | 92047 A1 | 1/2014 |
| NL | 1008846 A1 | 2/1999 |
| NL | 1014089 A1 | 7/2000 |
| NL | 1014321 C2 | 8/2001 |
| NL | 1015654 C2 | 1/2002 |
| NL | 1017314 C2 | 8/2002 |
| NL | 1020620 C2 | 11/2003 |
| NL | 1021630 C2 | 4/2004 |
| NL | 1031317 C2 | 9/2007 |
| NL | 2001380 C2 | 9/2009 |
| NL | 2002779 C | 10/2010 |
| NL | 2004561 C | 10/2011 |
| NL | 2009921 C | 6/2014 |
| PL | 384565 A1 | 8/2009 |
| PL | 384659 A1 | 9/2009 |
| PT | 104408 A | 8/2010 |
| SE | 1250216 A1 | 9/2013 |
| TW | 201122192 A | 7/2011 |
| TW | M498861 U | 4/2015 |
| TW | M517914 U | 2/2016 |
| WO | 9314525 A1 | 7/1993 |
| WO | 9609651 A1 | 3/1996 |
| WO | 9624013 A1 | 8/1996 |
| WO | 9711320 A1 | 3/1997 |
| WO | 0002256 A1 | 1/2000 |
| WO | 0169688 A1 | 9/2001 |
| WO | 0188312 A1 | 11/2001 |
| WO | 0216707 A1 | 2/2002 |
| WO | 02073703 A1 | 9/2002 |
| WO | 03044299 A2 | 5/2003 |
| WO | 03100869 A2 | 12/2003 |
| WO | 2004048862 A2 | 6/2004 |
| WO | 2004079775 A2 | 9/2004 |
| WO | 2005068917 A1 | 7/2005 |
| WO | 2006076719 A2 | 7/2006 |
| WO | 2007095894 A2 | 8/2007 |
| WO | 2007128401 A1 | 11/2007 |
| WO | 2007131566 A1 | 11/2007 |
| WO | 2007137199 A2 | 11/2007 |
| WO | 2008025234 A1 | 3/2008 |
| WO | 2008125340 A2 | 10/2008 |
| WO | 2009013607 A2 | 1/2009 |
| WO | 2009018016 A2 | 2/2009 |
| WO | 2009074135 A2 | 6/2009 |
| WO | 2009086803 A2 | 7/2009 |
| WO | 2009105186 | 8/2009 |
| WO | 2009106698 A1 | 9/2009 |
| WO | 2009112933 A2 | 9/2009 |
| WO | 2009138868 A2 | 11/2009 |
| WO | 2010031484 A1 | 3/2010 |
| WO | 2010034856 A1 | 4/2010 |
| WO | 2010051999 A2 | 5/2010 |
| WO | 2010054617 A2 | 5/2010 |
| WO | 2010054839 A1 | 5/2010 |
| WO | 2010054840 A1 | 5/2010 |
| WO | 2010063815 A2 | 6/2010 |
| WO | 2010074701 A1 | 7/2010 |
| WO | 2010085357 A2 | 7/2010 |
| WO | 2010089469 A1 | 8/2010 |
| WO | 2010091670 A2 | 8/2010 |
| WO | 2010100375 A1 | 9/2010 |
| WO | 2010100376 A1 | 9/2010 |
| WO | 2010112049 A1 | 10/2010 |
| WO | 2010127876 A2 | 11/2010 |
| WO | 2010128081 A2 | 11/2010 |
| WO | 2010130720 A2 | 11/2010 |
| WO | 2010132638 A1 | 11/2010 |
| WO | 2010136021 A1 | 12/2010 |
| WO | 2011000358 A2 | 1/2011 |
| WO | 2011023898 A1 | 3/2011 |
| WO | 2011031248 A2 | 3/2011 |
| WO | 2011047484 A1 | 4/2011 |
| WO | 2011068528 A1 | 6/2011 |
| WO | 2011073612 A2 | 6/2011 |
| WO | 2011101439 A2 | 8/2011 |
| WO | 2011104397 A1 | 9/2011 |
| WO | 2011144546 A1 | 11/2011 |
| WO | 2011147542 A2 | 12/2011 |
| WO | 2011148107 A2 | 12/2011 |
| WO | 2011157967 A1 | 12/2011 |
| WO | 2011157969 A1 | 12/2011 |
| WO | 2011160851 A1 | 12/2011 |
| WO | 2012001162 A2 | 1/2012 |
| WO | 2012001332 A1 | 1/2012 |
| WO | 2012076970 A1 | 6/2012 |
| WO | 2012096297 A1 | 7/2012 |

(56) References Cited

FOREIGN PATENT DOCUMENTS

| | | | |
|---|---|---|---|
| WO | 2012104423 | A1 | 8/2012 |
| WO | 2012113887 | A2 | 8/2012 |
| WO | 2012116121 | A1 | 8/2012 |
| WO | 2012116306 | A1 | 8/2012 |
| WO | 2012120208 | A2 | 9/2012 |
| WO | 2012167775 | A2 | 12/2012 |
| WO | 2012168384 | A1 | 12/2012 |
| WO | 2012168627 | A2 | 12/2012 |
| WO | 2013050147 | A1 | 4/2013 |
| WO | 2013075257 | A2 | 5/2013 |
| WO | 2013163667 | A1 | 11/2013 |
| WO | 2013164441 | A1 | 11/2013 |
| WO | 2013182716 | A1 | 12/2013 |
| WO | 2014004279 | A1 | 1/2014 |
| WO | 2014086503 | A1 | 1/2014 |
| WO | 2014020006 | A1 | 2/2014 |
| WO | 2014029499 | A1 | 2/2014 |
| WO | 2014030045 | A1 | 2/2014 |
| WO | 2014067623 | A2 | 5/2014 |
| WO | 2014074956 | A1 | 5/2014 |
| WO | 2014093081 | A2 | 6/2014 |
| WO | 2014114845 | A1 | 7/2014 |
| WO | 2014202231 | A1 | 12/2014 |
| WO | 2015016987 | A1 | 2/2015 |
| WO | 2015052285 | A1 | 4/2015 |
| WO | 2015055714 | A1 | 4/2015 |
| WO | 2015107293 | A1 | 7/2015 |
| WO | 2015173505 | A1 | 11/2015 |
| WO | 2017139040 | A1 | 8/2017 |
| WO | 2017139041 | A1 | 8/2017 |

OTHER PUBLICATIONS

Comparison of PV Laminates and Crystalline Solar Panels for Metal Roofs Finds Both have Benefits, by Rich Small, Jul. 31, 2014 (verified by Examiner on Nov. 26, 2018 by Internet Archive Wayback Machine), available at https://designandbuildwithmetal.com/featured-articles/2010/09/21/comparison-of-pv-laminates-and-crystal.*
Abstract from Derwent for AU 2013204716 A1 by Aldridge et al. (Year: 2014).*
Drexel Metals, "FW1 Flush Profile", retrieved from the internet on Feb. 1, 2017 at: http://drexmet.com/product-list/fw1-flush-profile, Drexel Metals Inc., Louisville, KY, 2 pages.
International Search Report and Written Opinion dated Apr. 6, 2017, for related International Application PCT/US2016/069104, 12 pages.
International Search Report and Written Opinion, dated Jun. 6, 2017, for related International Application PCT/US2016/069010, 20 pages.
International Application No. PCT/US2016/069010, International Search Report and Written Opinion dated Jun. 6, 2017, 22 pages.
Invitation to Pay Fees and Partial International Search Report, dated Apr. 6, 2017, for corresponding International Patent Application PCT/US2016/069010, 8 pages.

* cited by examiner

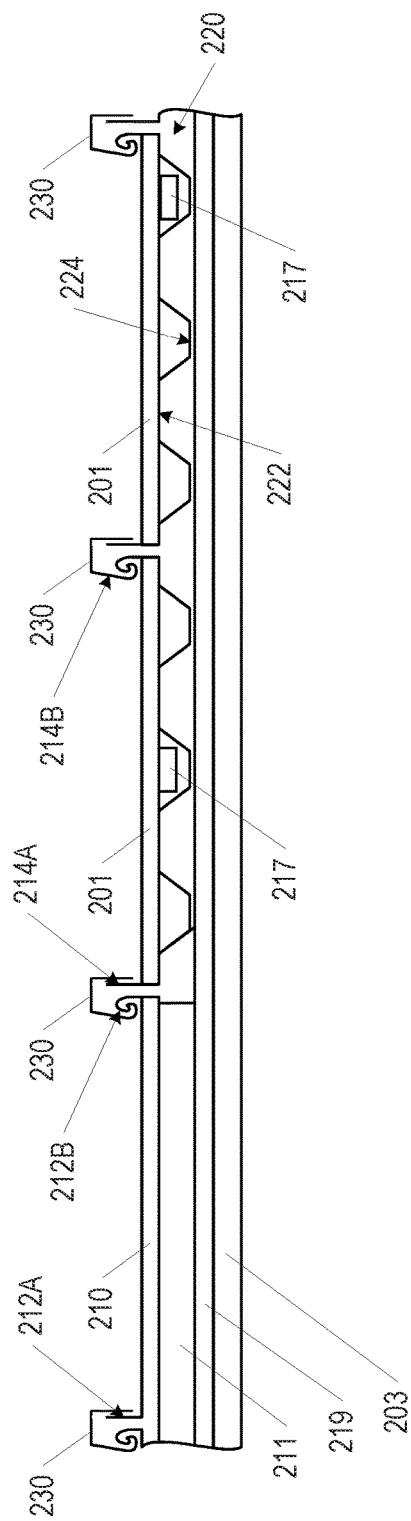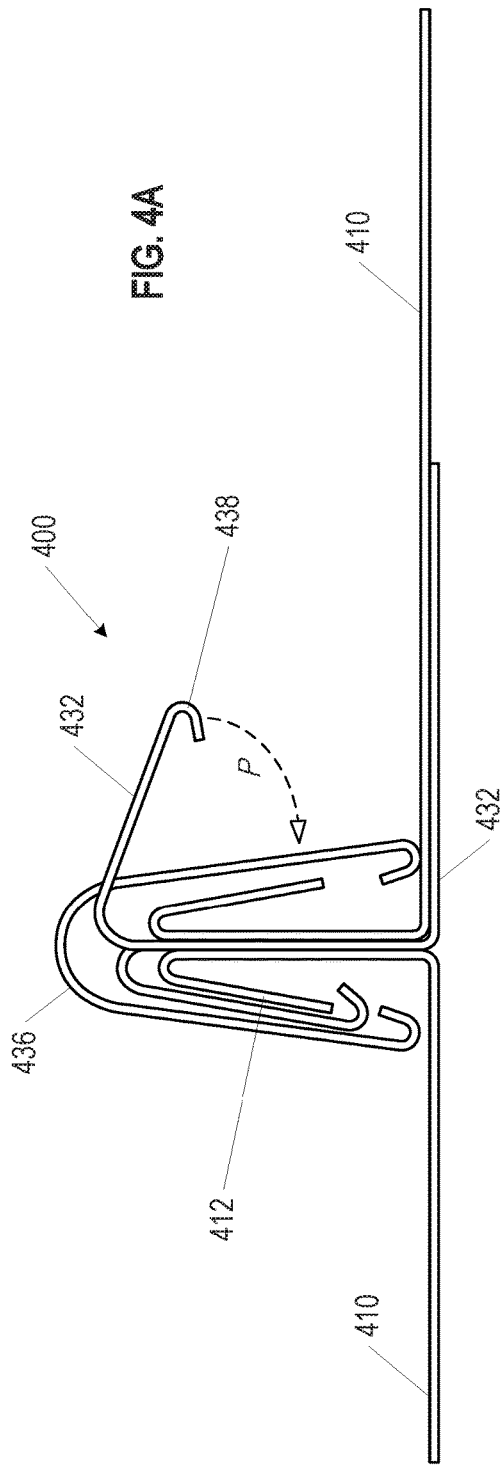

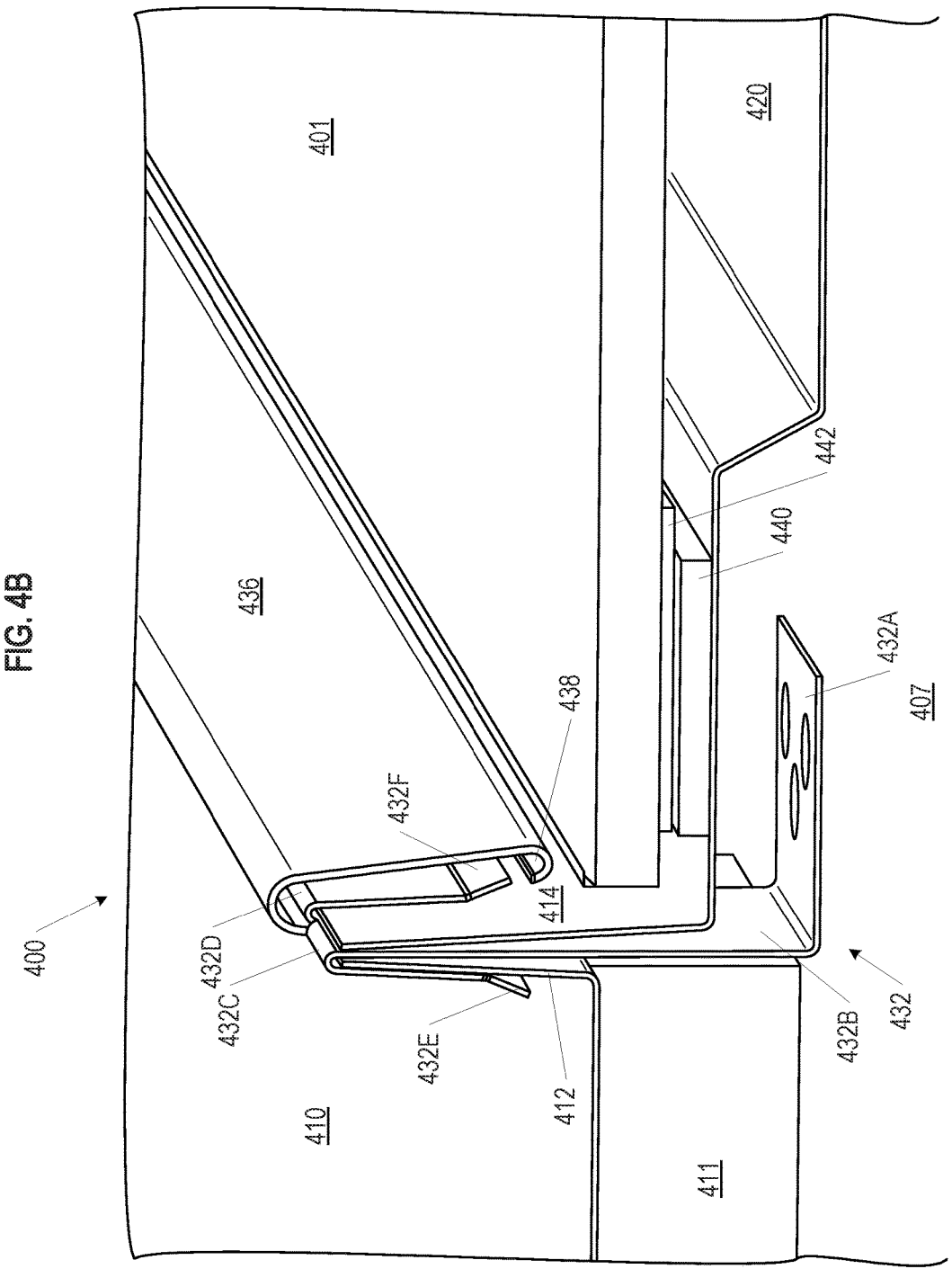

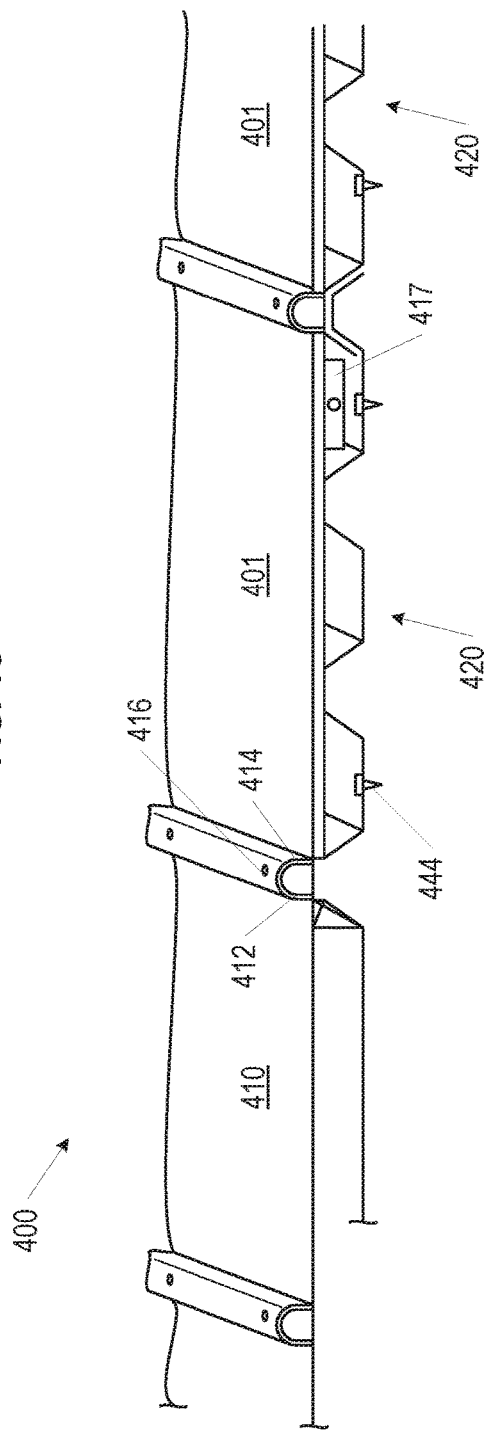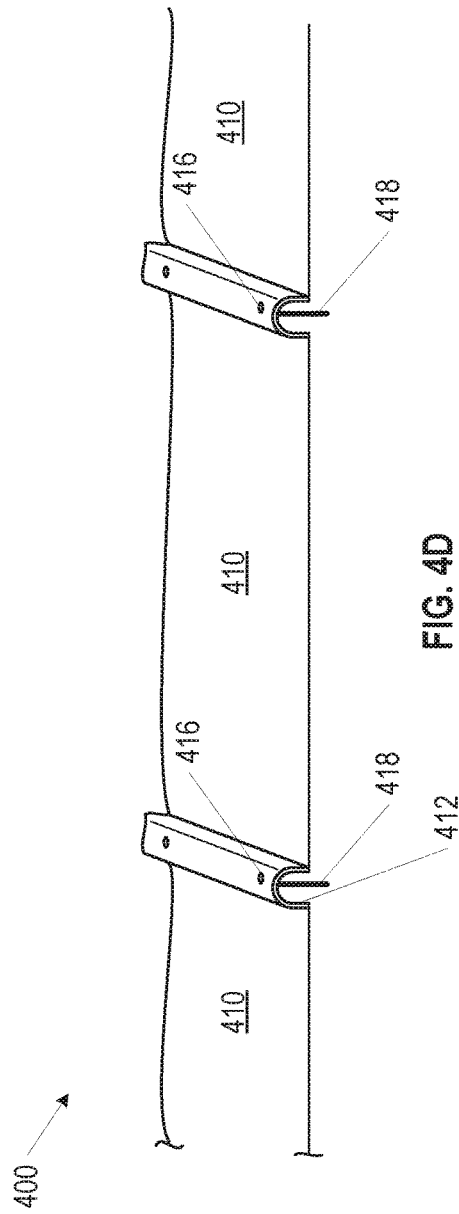

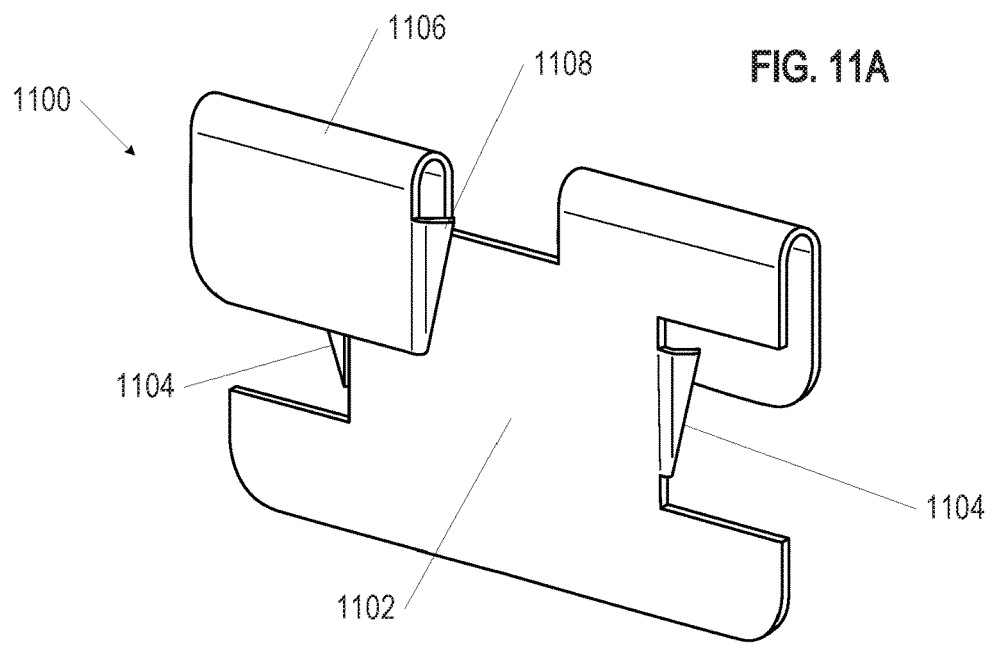
FIG. 11A
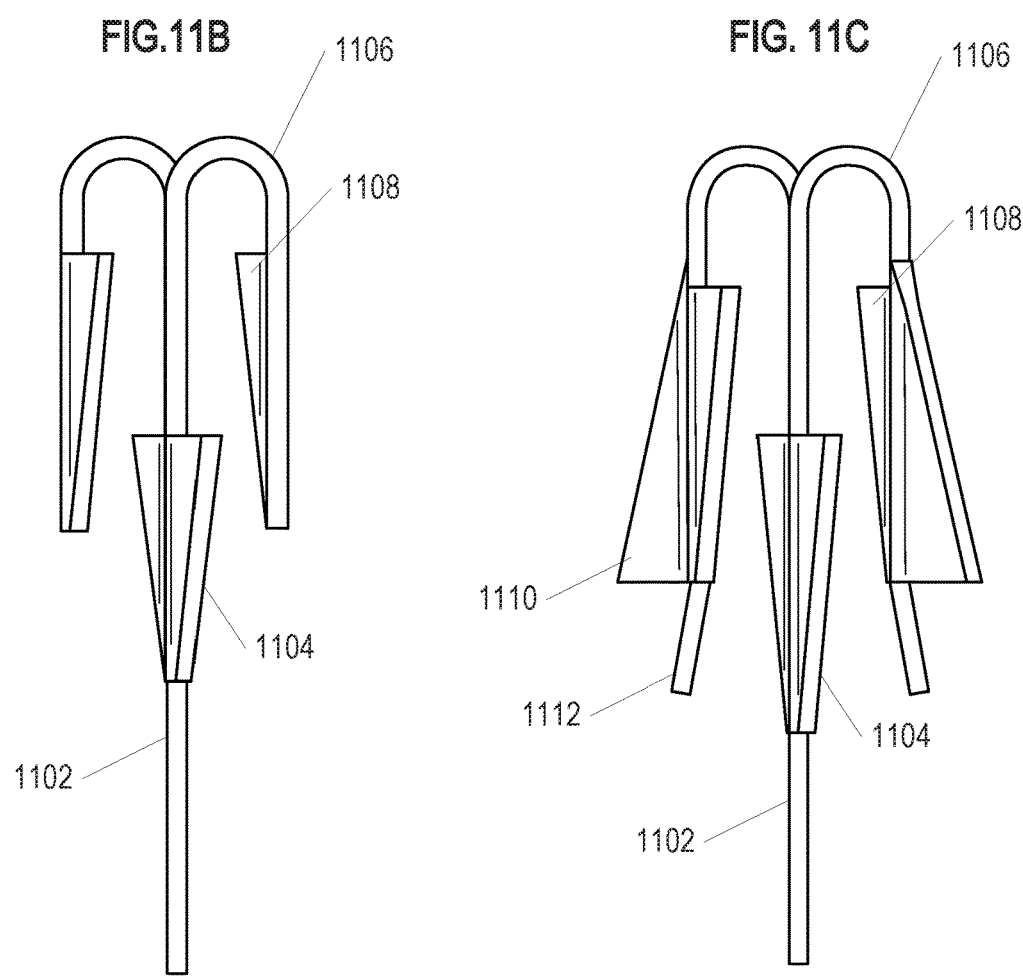
FIG. 11B
FIG. 11C

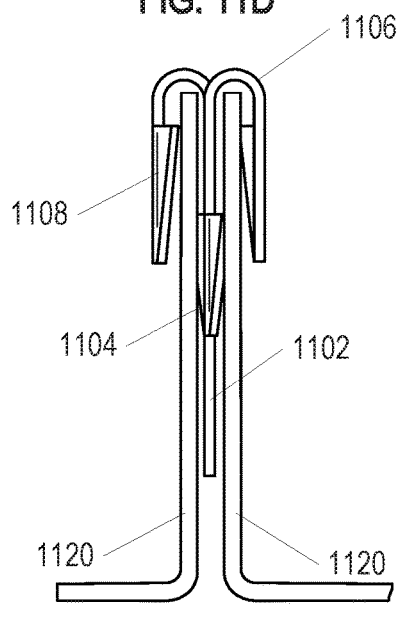
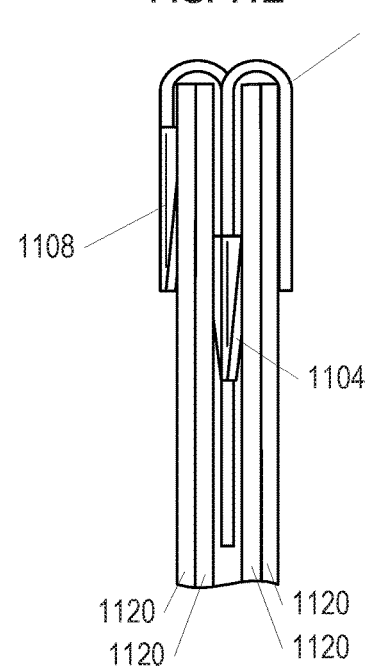
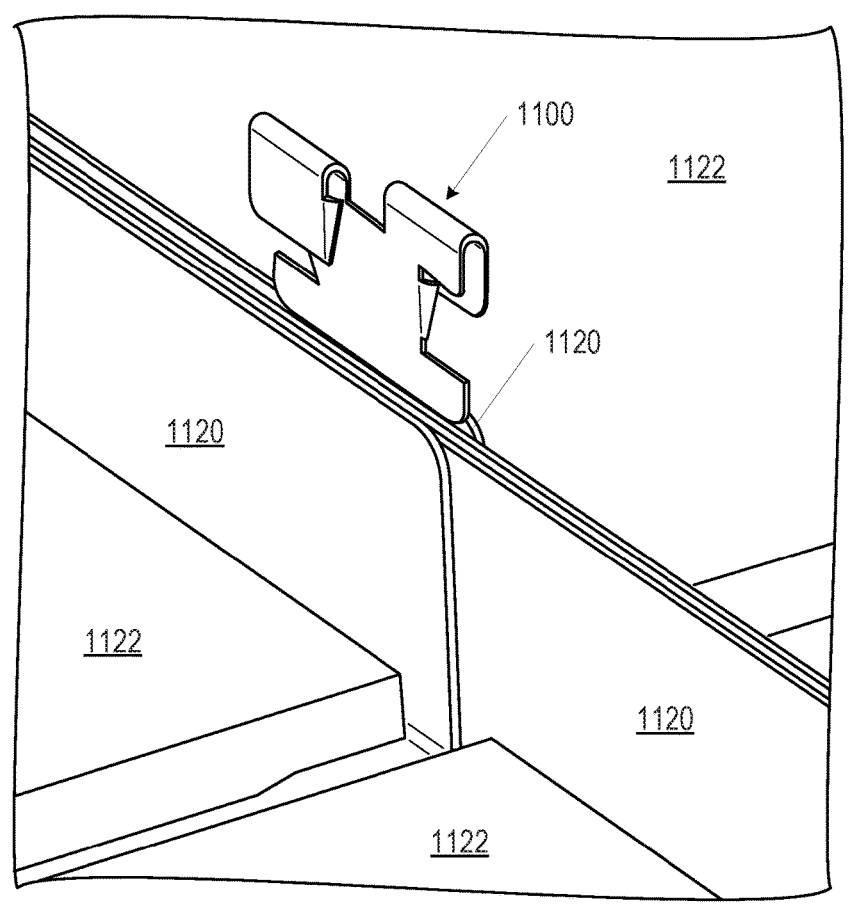

FIG. 11G
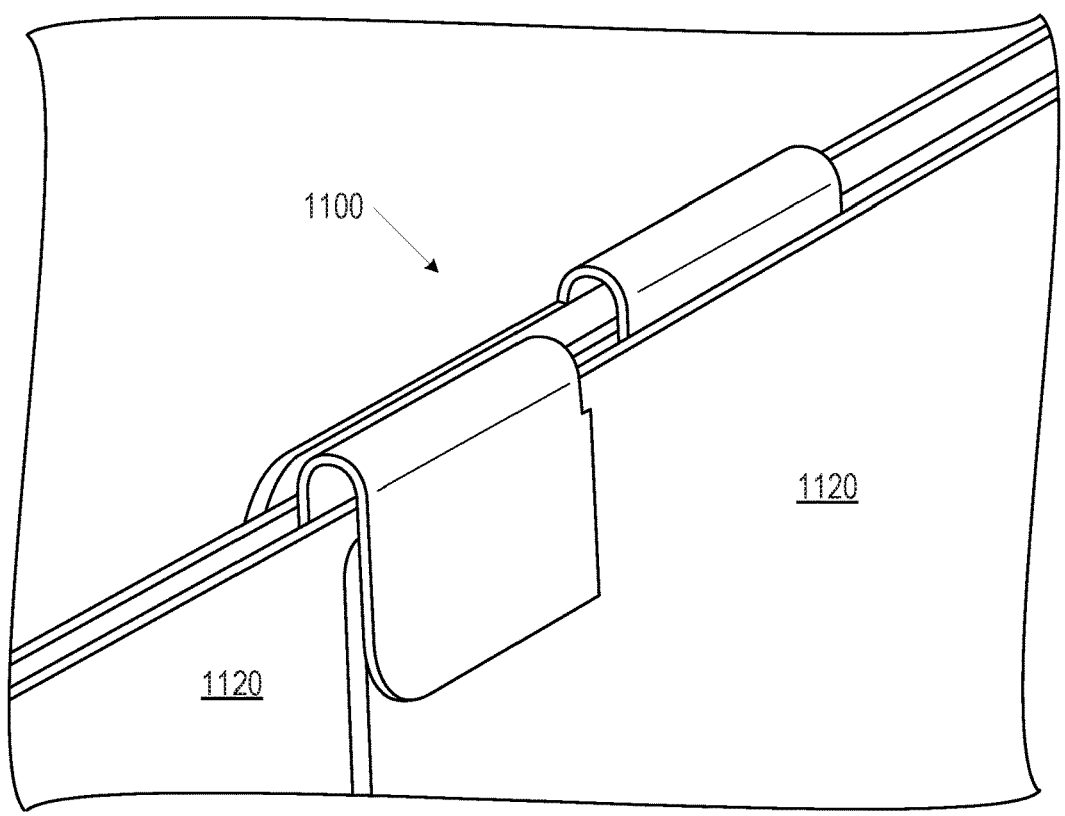
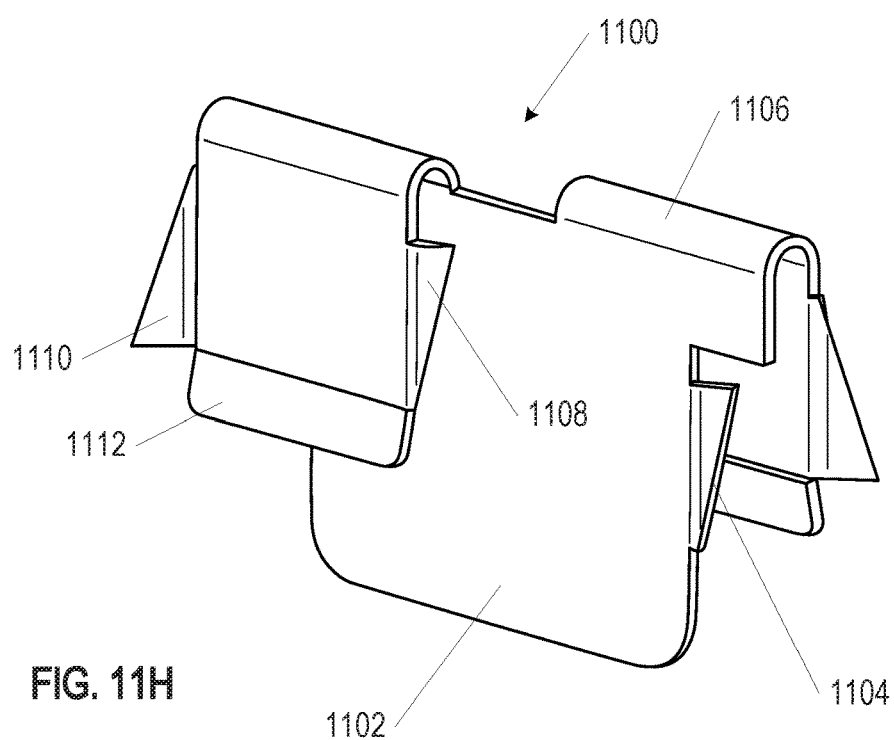
FIG. 11H

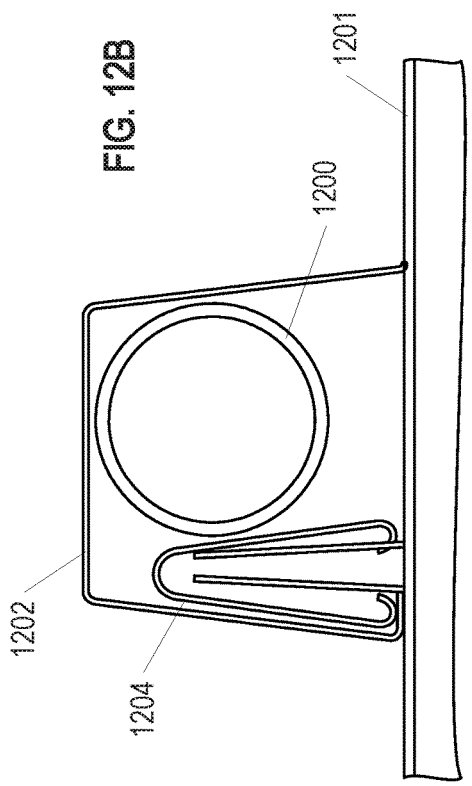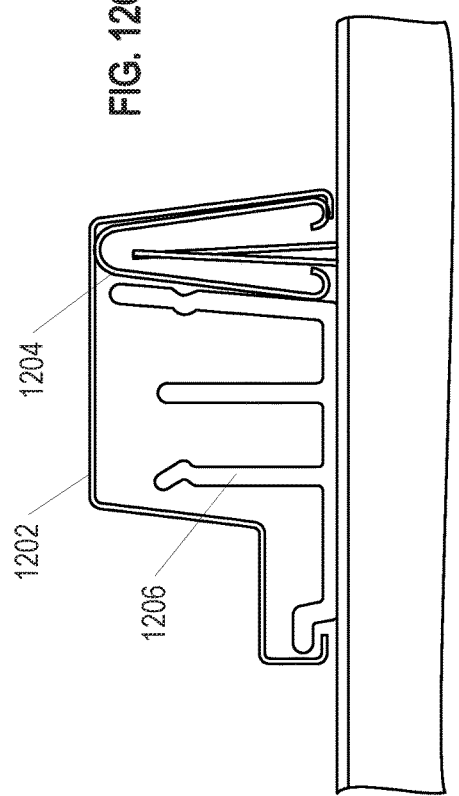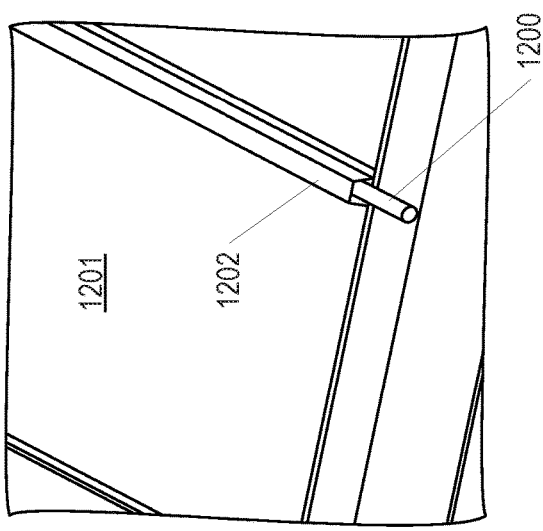

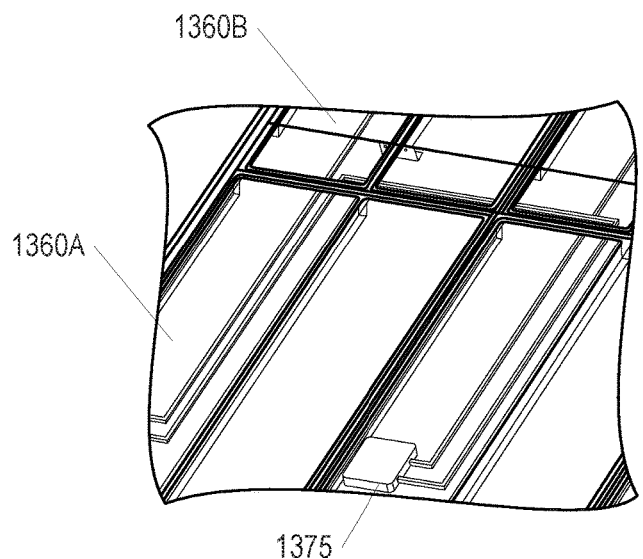
FIG. 13C
FIG. 13D
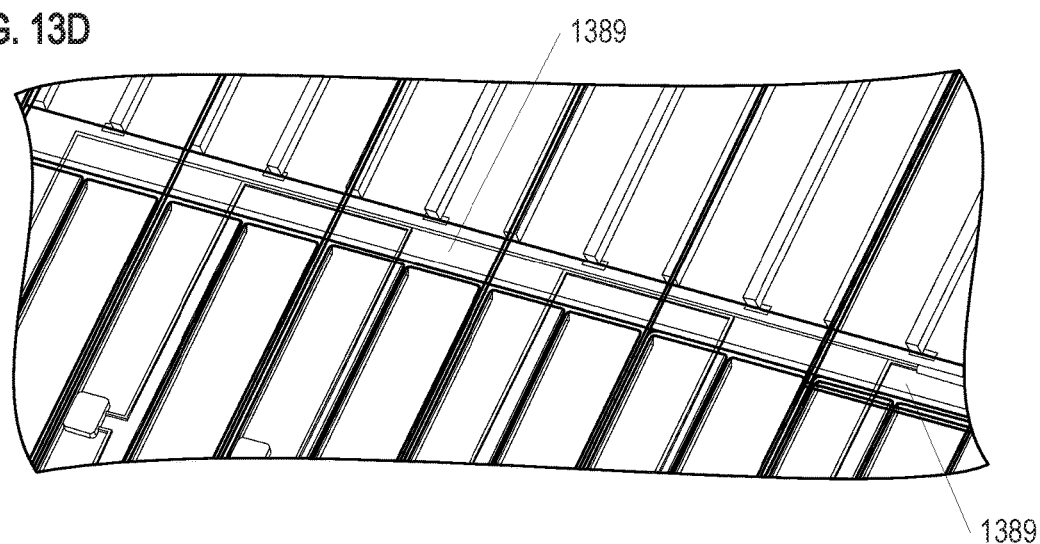
FIG. 13E
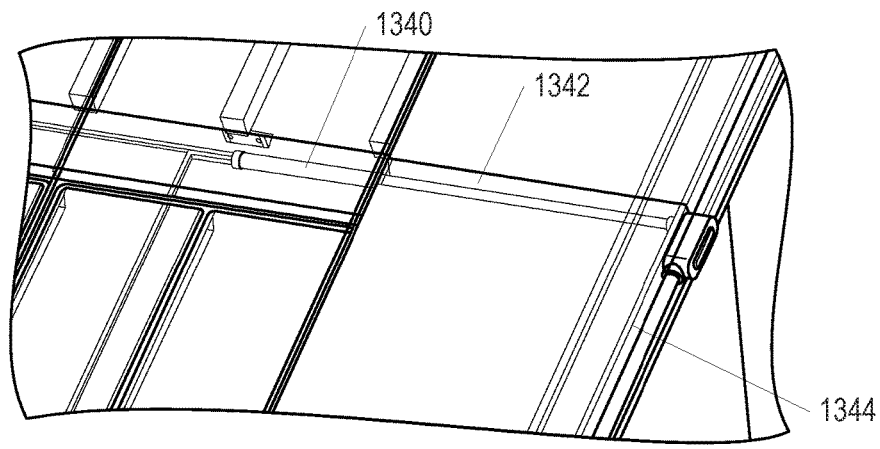

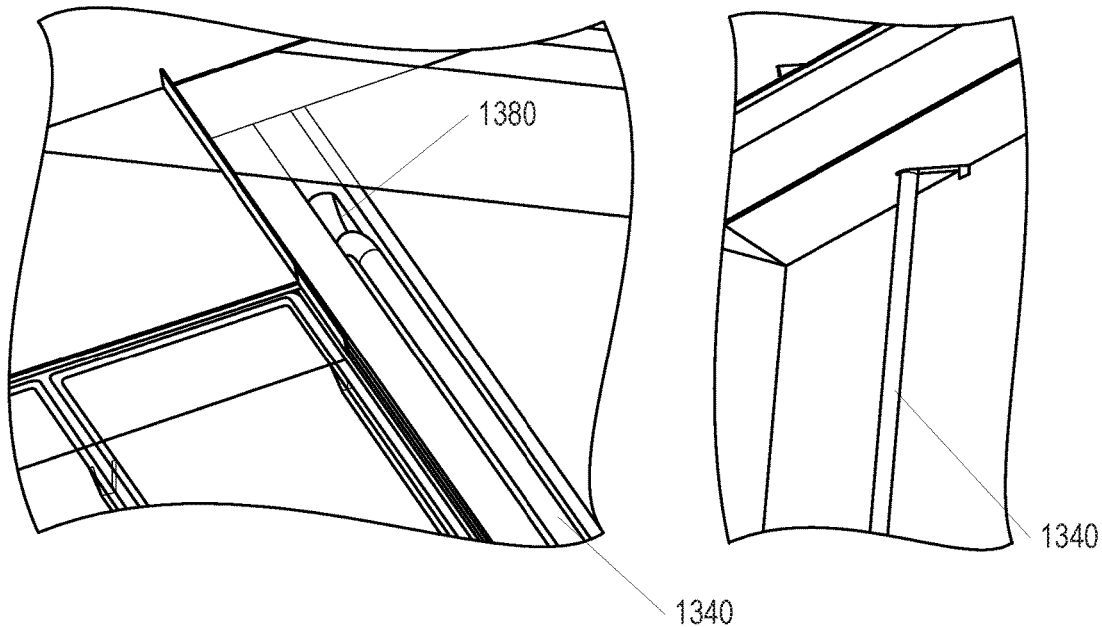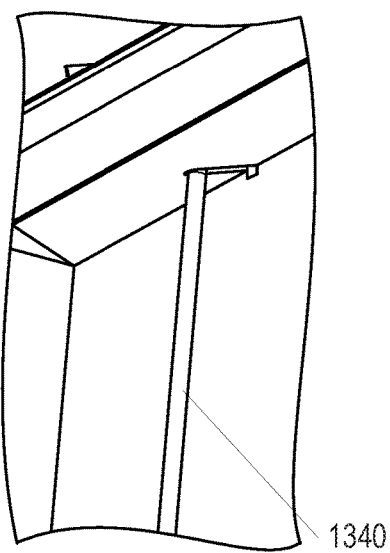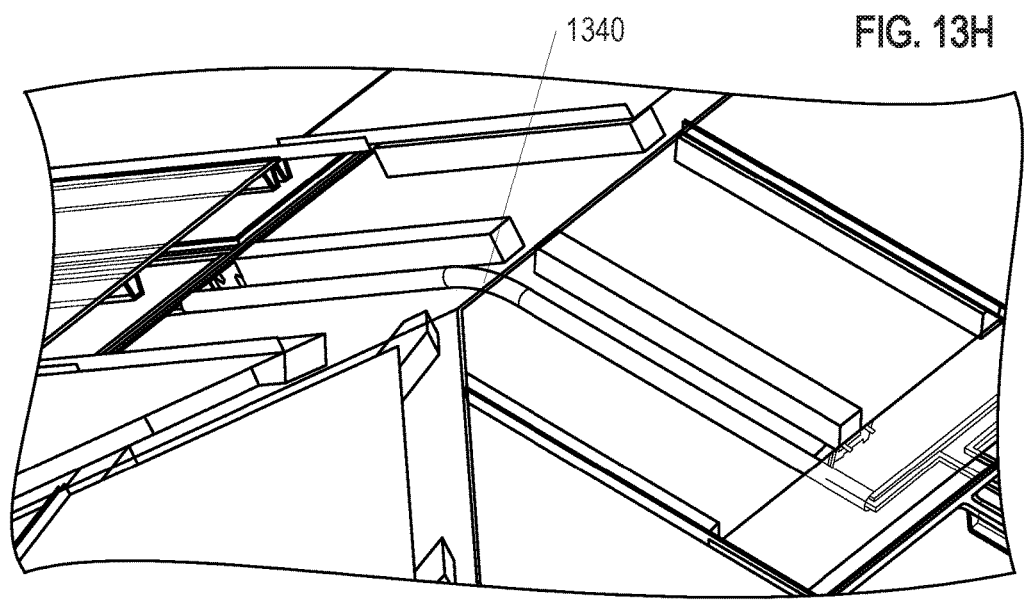

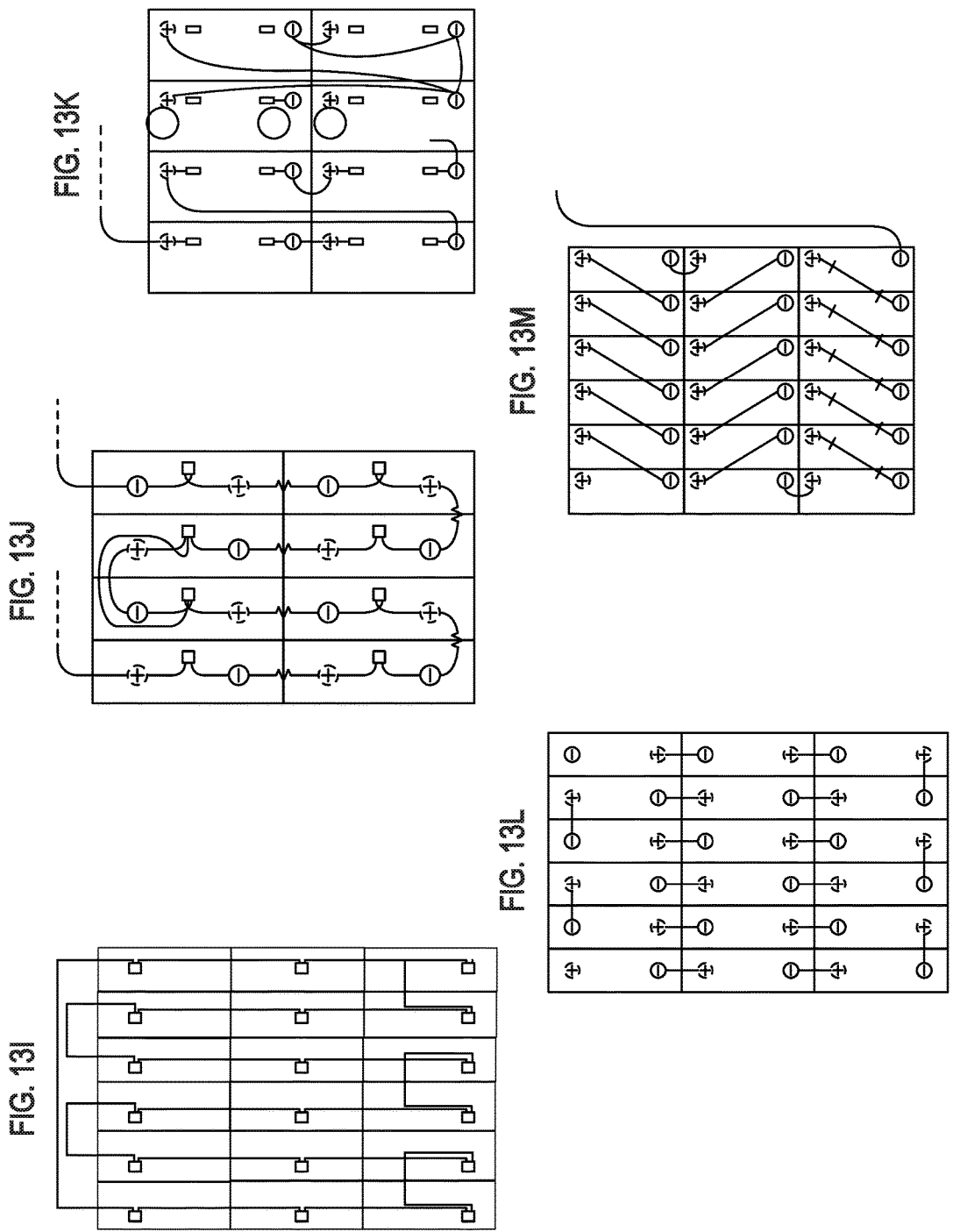

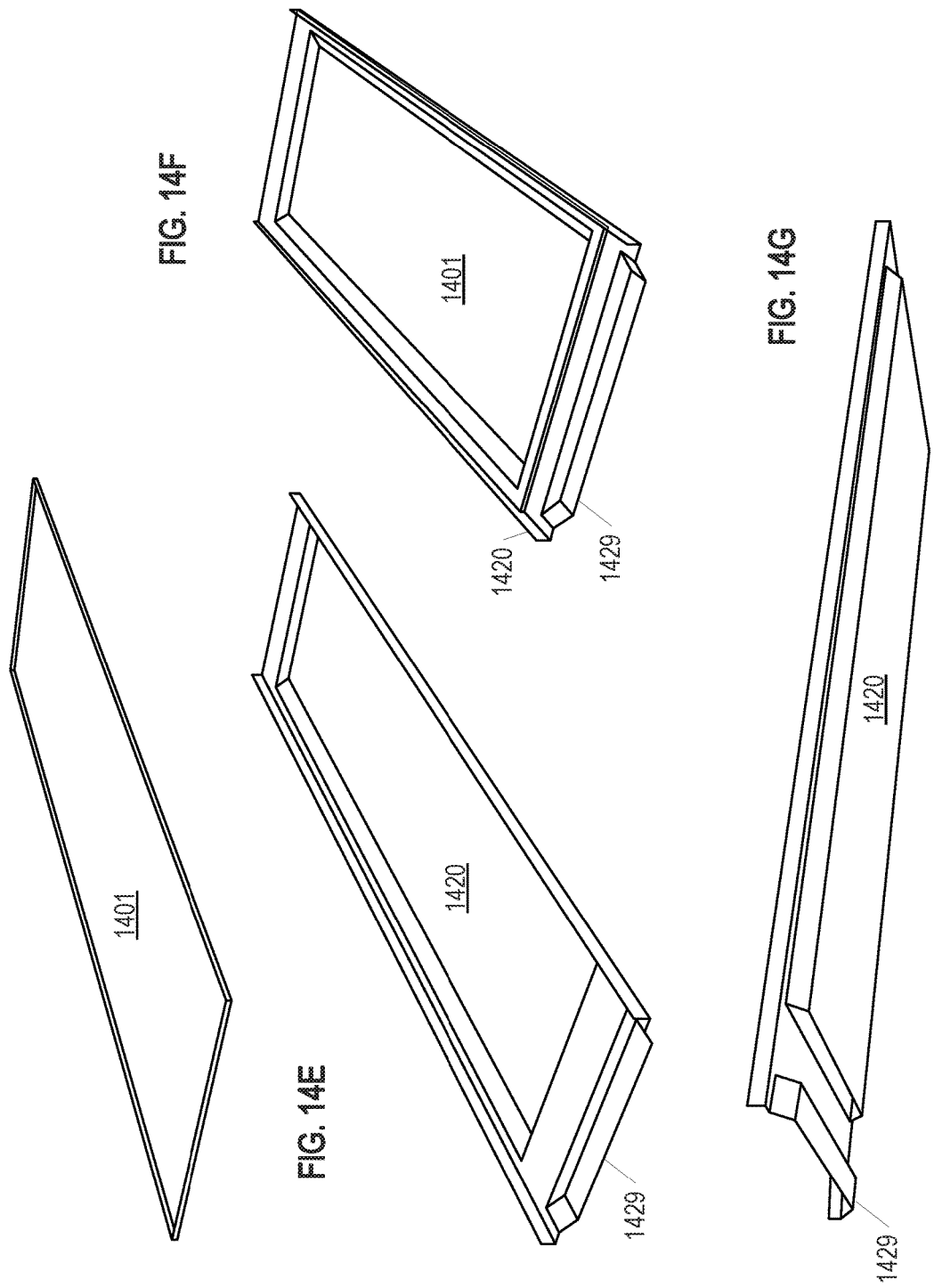

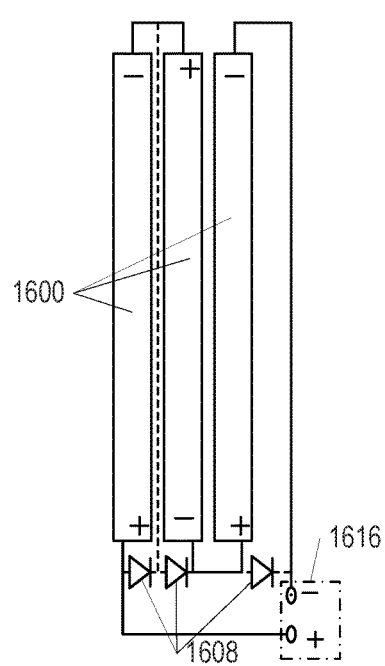
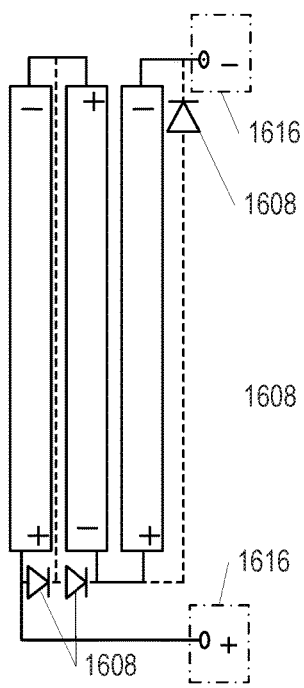
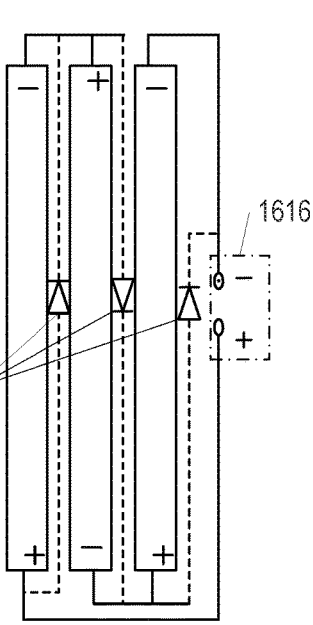
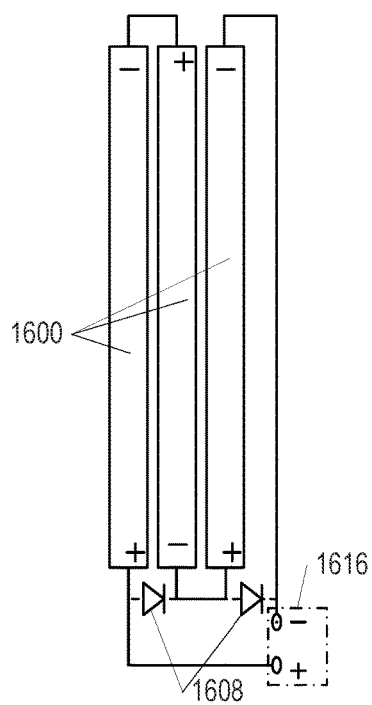
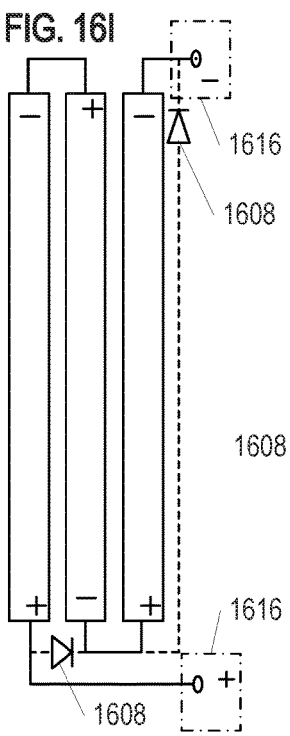
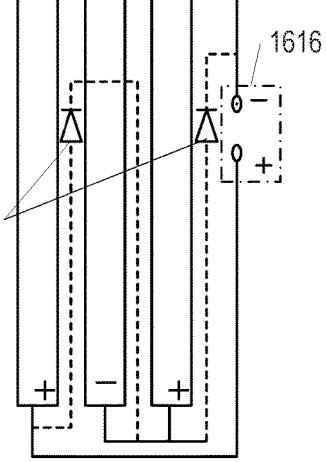

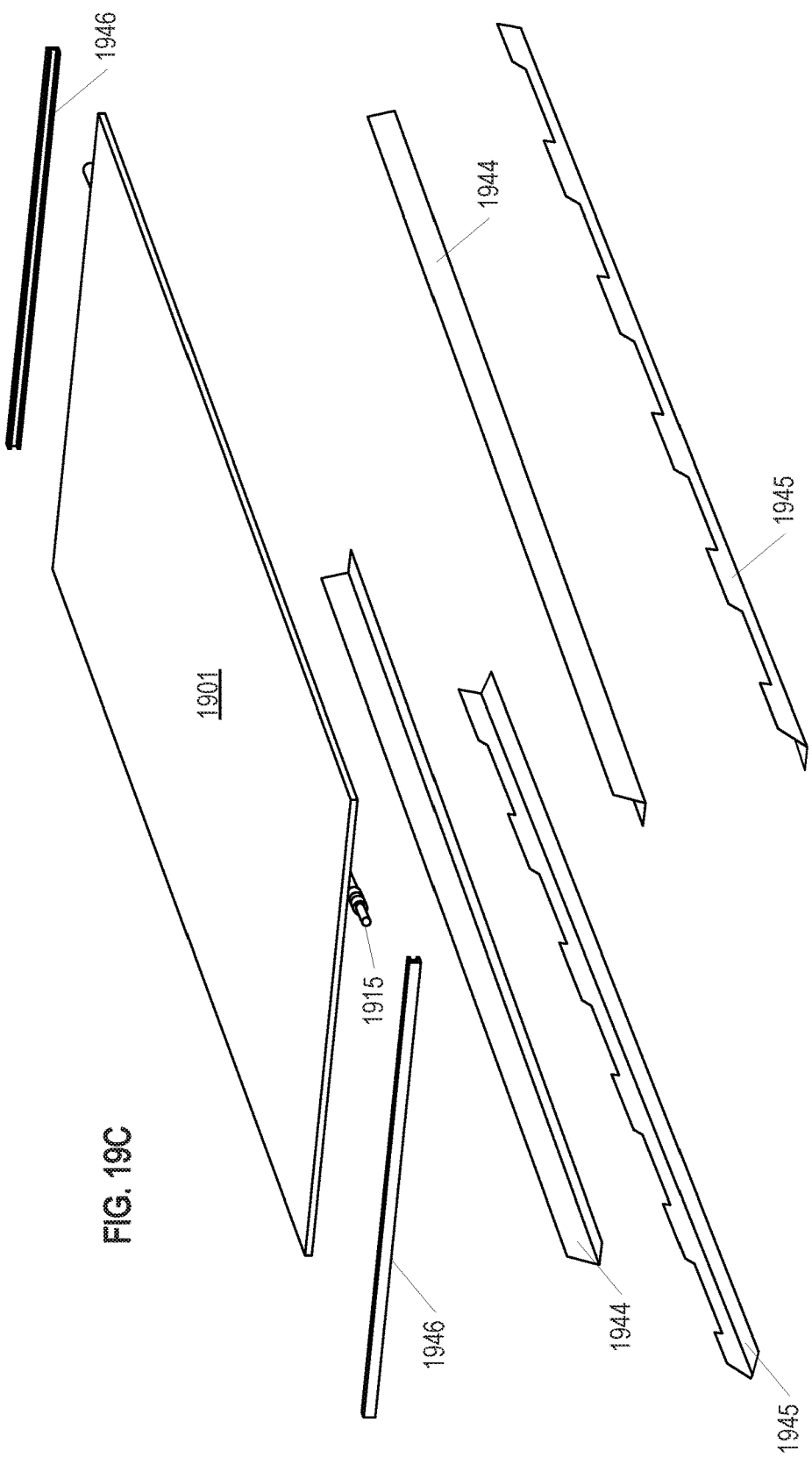

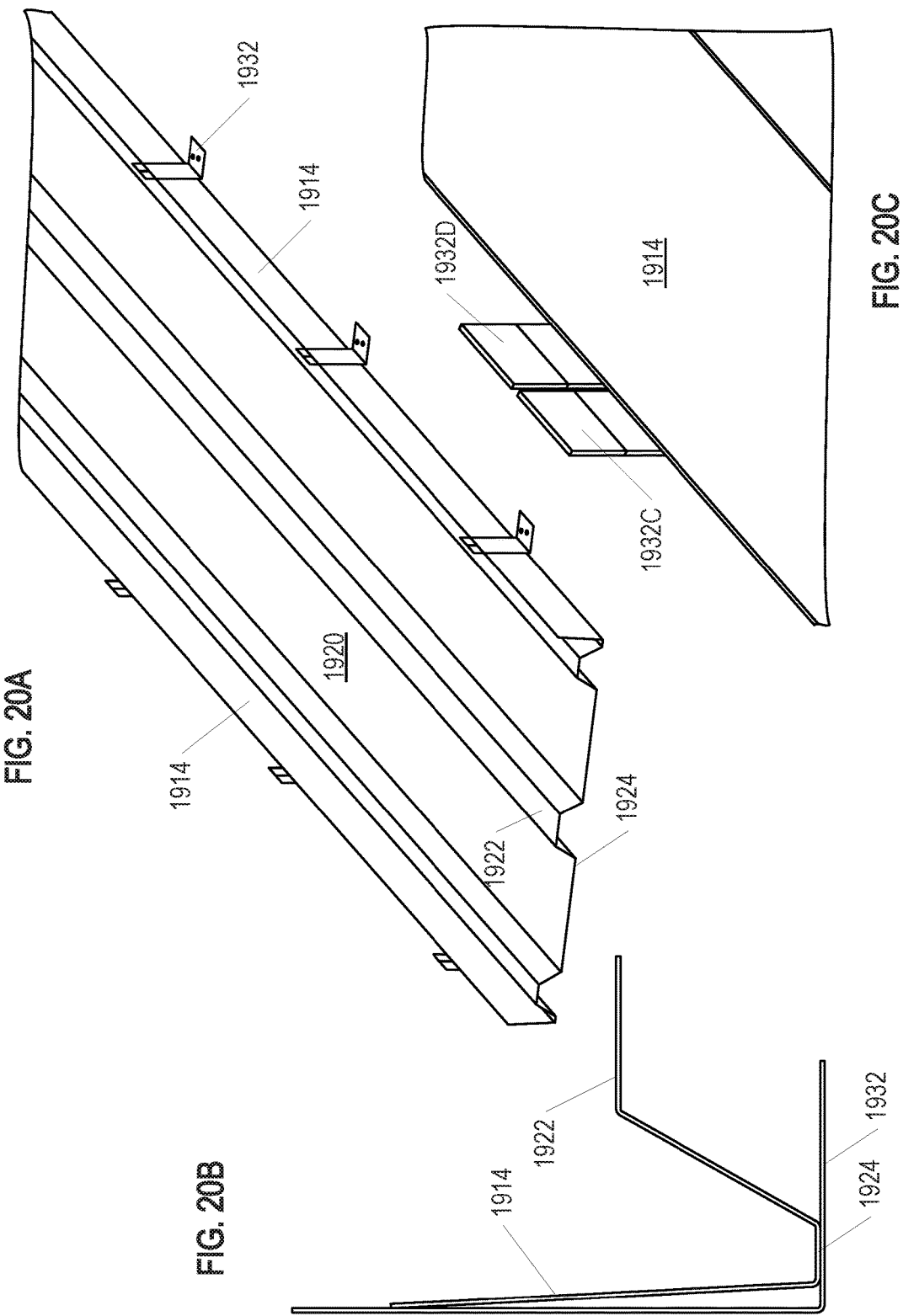

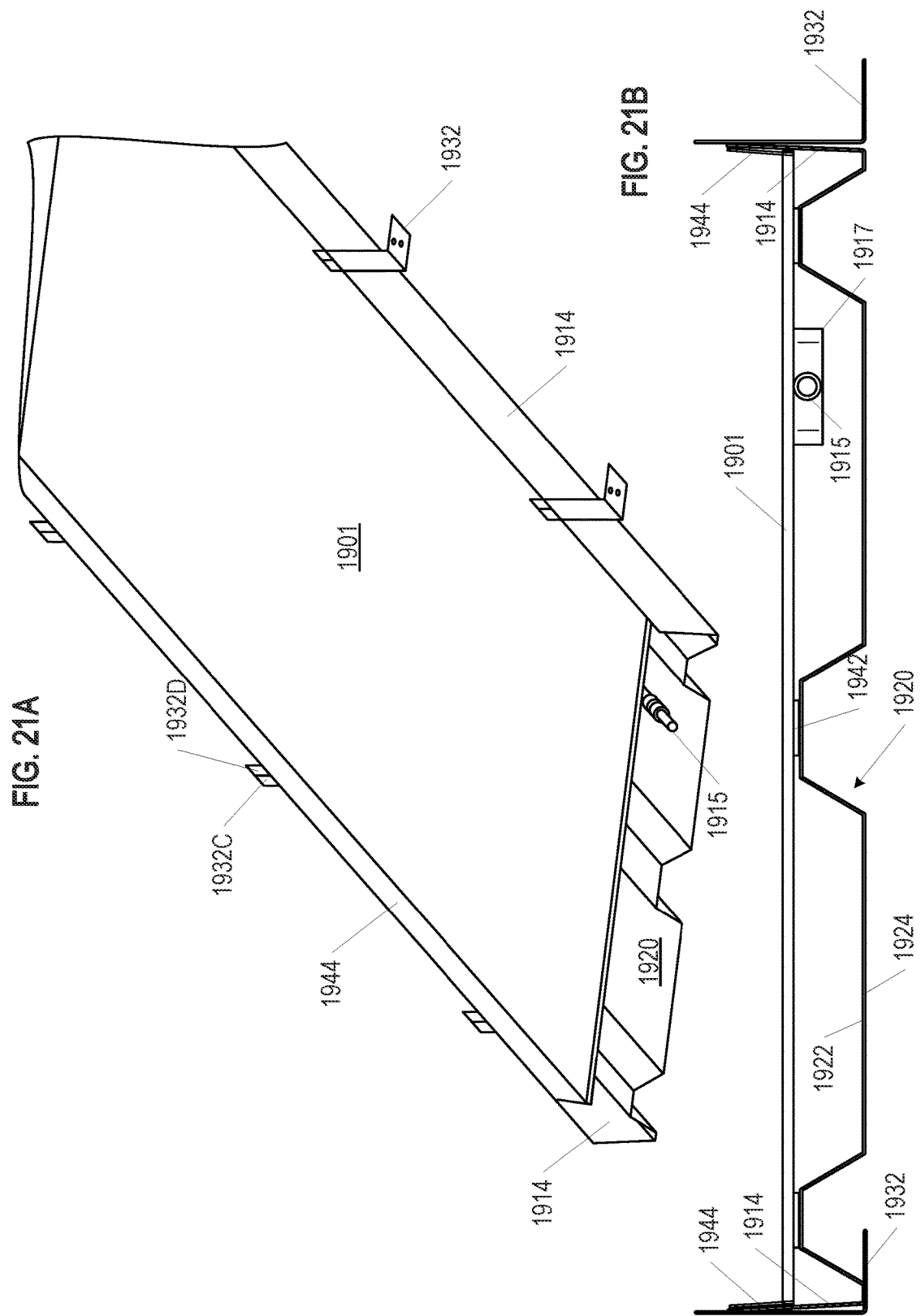

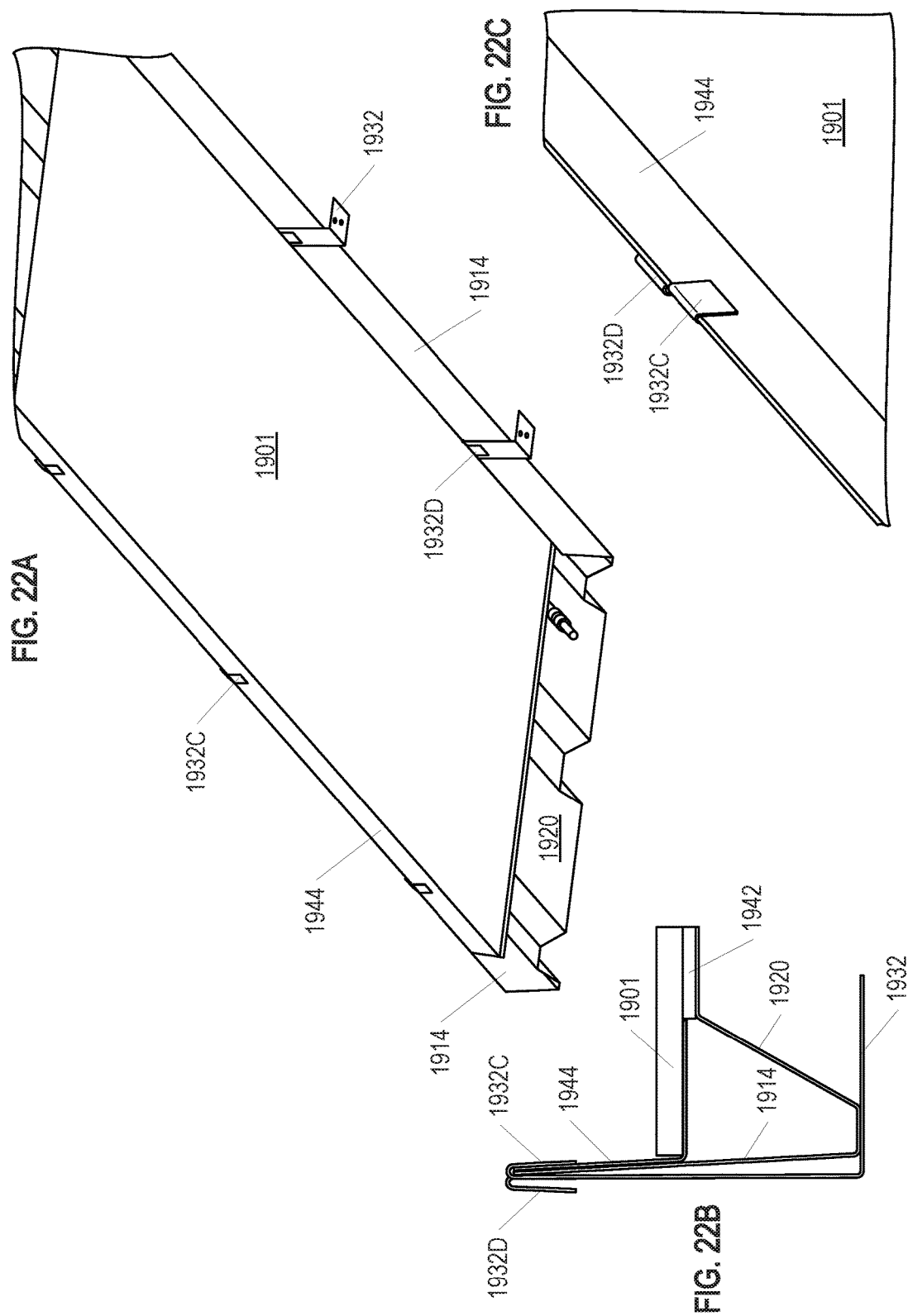

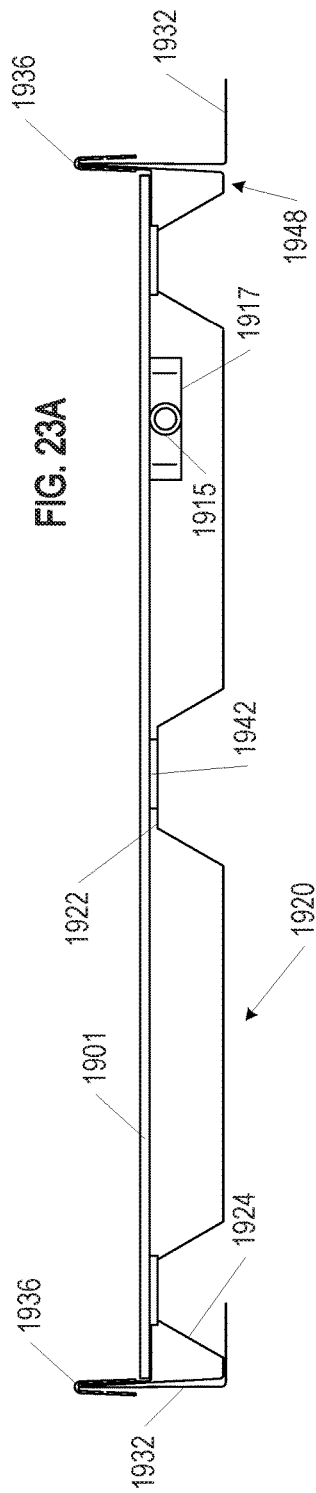
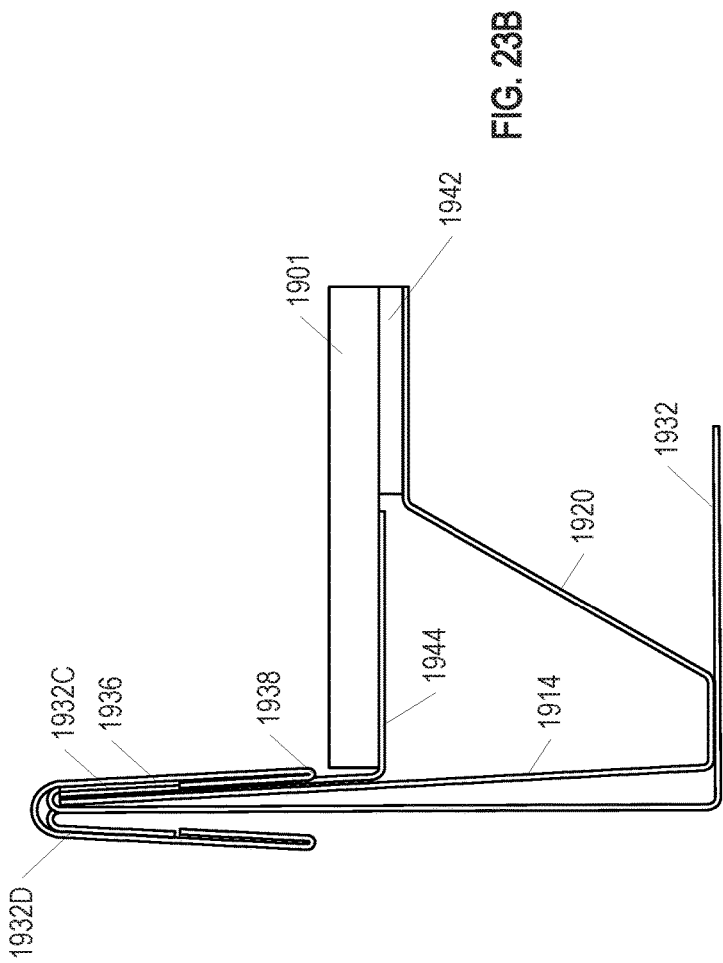

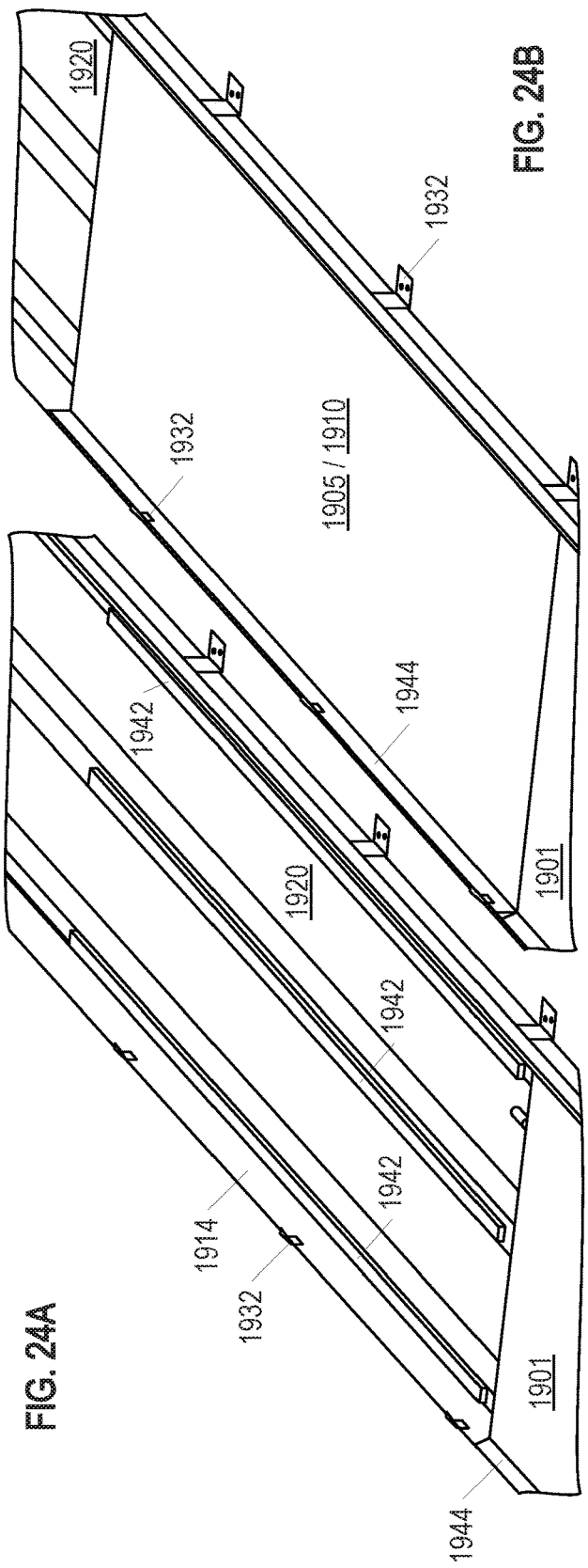

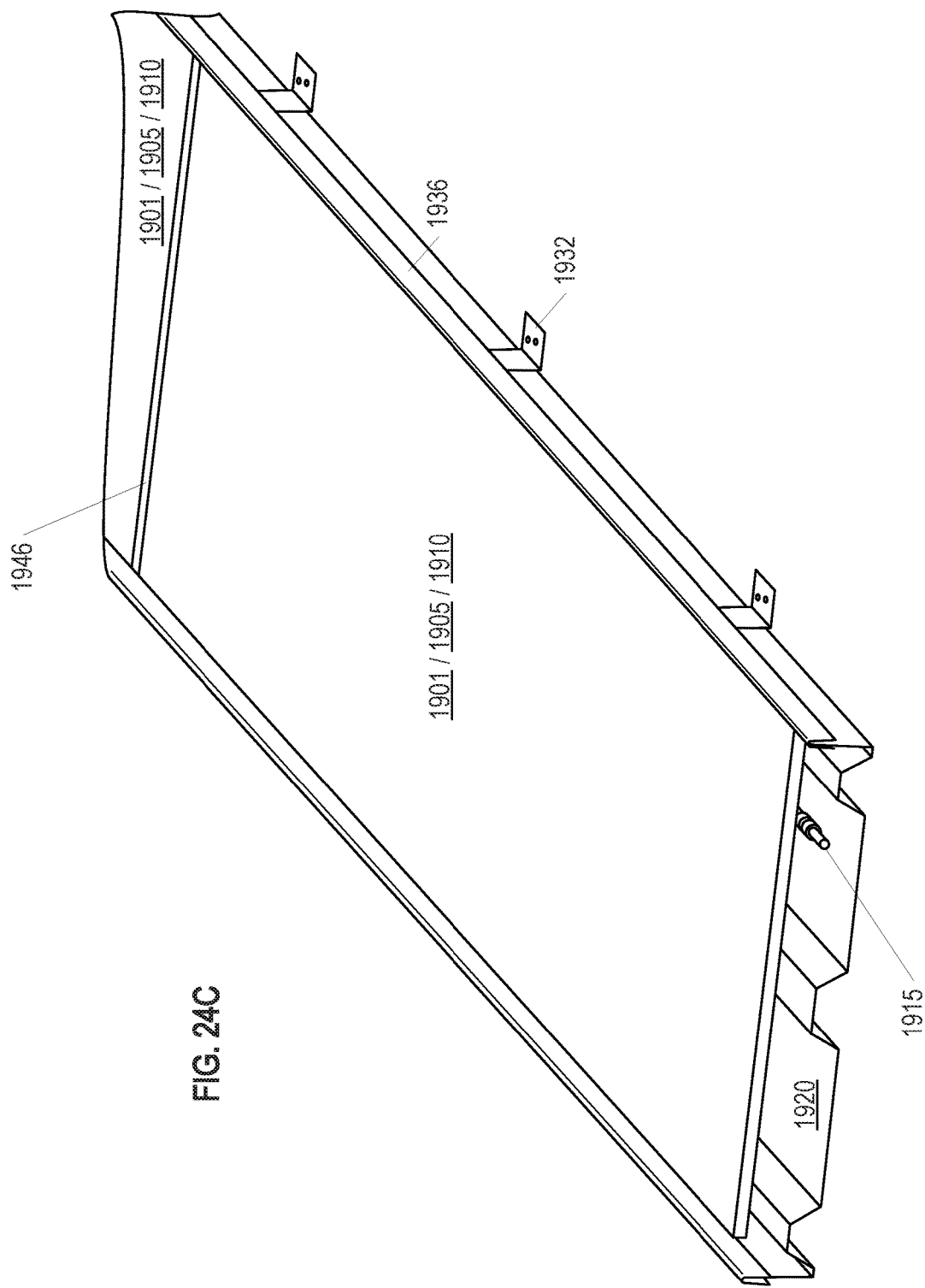

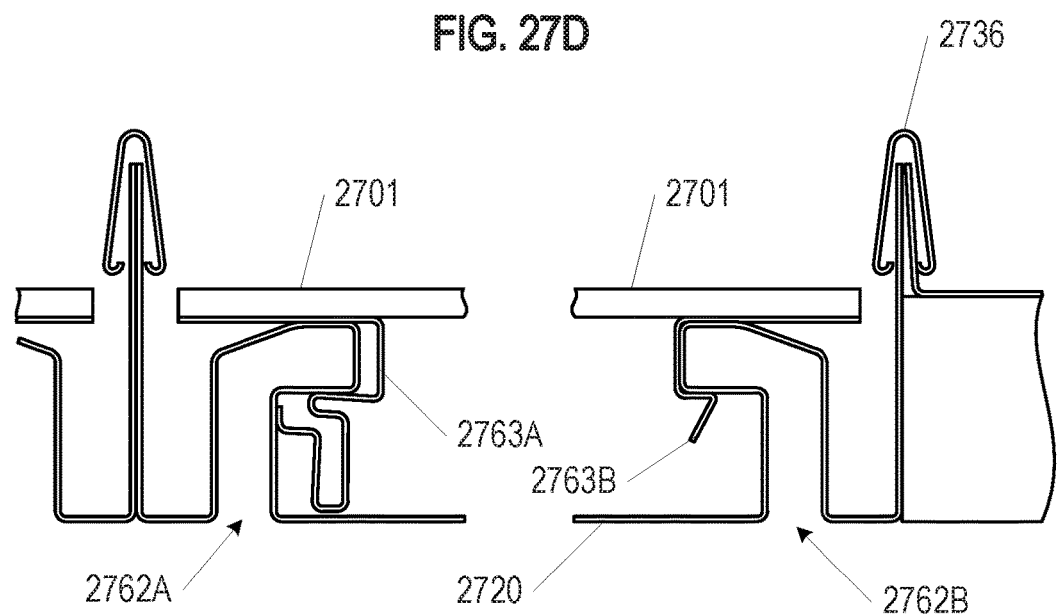
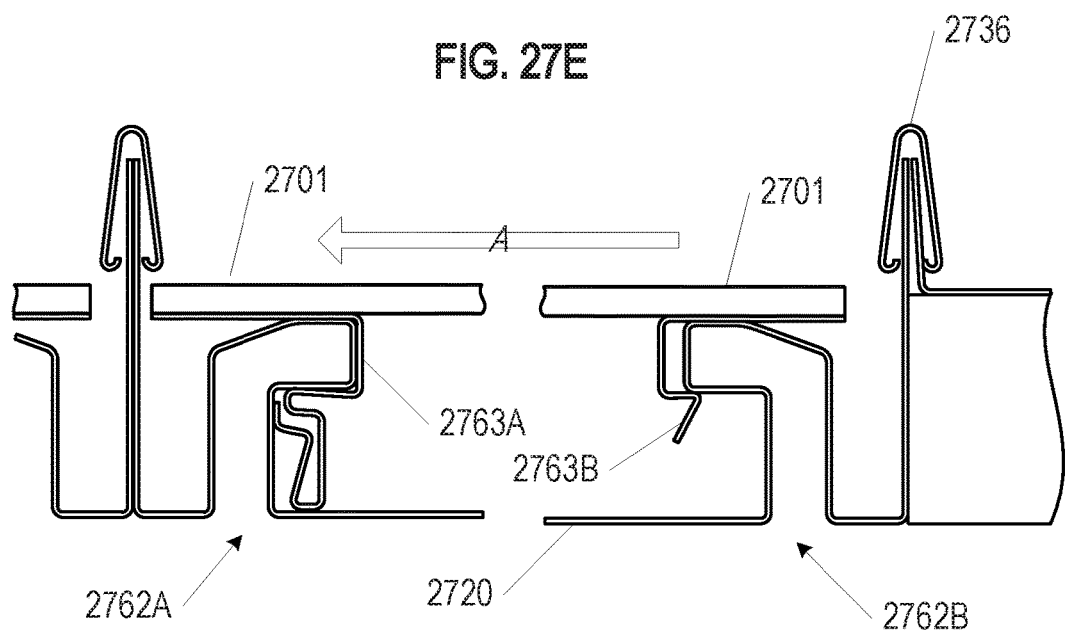

BUILDING INTEGRATED PHOTOVOLTAIC ROOFING ASSEMBLIES AND ASSOCIATED SYSTEMS AND METHODS

CROSS-REFERENCE TO RELATED APPLICATIONS

This claims the benefit of: U.S. Provisional Application No. 62/294,743, entitled "BUILDING INTEGRATED PHOTOVOLTAIC ROOFING SYSTEM" and filed on Feb. 12, 2016; U.S. Provisional Application No. 62/308,828, entitled "BUILDING INTEGRATED PHOTOVOLTAIC ROOFING SYSTEM" and filed on Mar. 15, 2016; U.S. Provisional Application No. 62/313,678, entitled "BUILDING INTEGRATED PHOTOVOLTAIC ROOFING SYSTEM" and filed on Mar. 25, 2016; U.S. Provisional Application No. 62/354,599, entitled "BUILDING INTEGRATED PHOTOVOLTAIC ROOFING ASSEMBLIES AND ASSOCIATED SYSTEMS AND METHODS" and filed on Jun. 24, 2016; U.S. Provisional Application No. 62/357,329, entitled "BUILDING INTEGRATED PHOTOVOLTAIC ROOFING ASSEMBLIES AND ASSOCIATED SYSTEMS AND METHODS" and filed on Jun. 30, 2016; and U.S. Provisional Application No. 62/374,704, entitled "BUILDING INTEGRATED PHOTOVOLTAIC ROOFING ASSEMBLIES AND ASSOCIATED SYSTEMS AND METHODS" and filed on Aug. 12, 2016, which are all herein incorporated by reference in their entireties. This is also related to concurrently filed non-provisional applications U.S. Ser. No. 15/246,475, filed Aug. 24, 2016 and U.S. Ser. No. 15/246,495, filed Aug. 24, 2016, both entitled "BUILDING INTEGRATED PHOTOVOLTAIC ROOFING ASSEMBLIES AND ASSOCIATED SYSTEMS AND METHODS", filed on the same day as this paper, and which are both hereby incorporated herein by reference in their entireties.

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of utility power in most areas, however, solar largely remains a niche product for those who value saving money, reducing $CO_2$ emissions, or both.

One factor that may limit the adoption of solar technology is aesthetics. Most residential solar systems are installed as modules on an existing tile or composition shingle roof. The solar array, which often only covers a portion of the roof, or even a portion of one mounting plane on the roof, stands out as separate and distinct from the existing roof, both in height and material. This structure is therefore visible even from the street level and over large distances.

Another obstacle to solar adoption in existing homes is the dissonance between the age of the existing roof and the solar system, particularly where the existing roof is made from composition shingle. The expected life of a solar system and a composition shingle roof are both about 25 years depending on the local climate, but the existing roof may be several years, if not decades, into that lifespan when a prospective customer is contacted. So the customer may be presented with the dilemma of getting a new roof first, increasing the cost of going solar, or installing a 25-year solar system on a roof, which may have a relatively shorter remaining operational lifespan.

Accordingly, there is a need to resolve the dissonance between the expected life of the solar system and the remaining life of the roof that also blends in more aesthetically with the complete roof surface or at least the mounting plane and that doesn't require the prospective customer to pay for a new roof and a new solar system over that roof.

BRIEF SUMMARY

Various embodiments provide a new and improved approach to installing solar on existing roofs, and in particular, existing composition shingle roofs. Some fit over an existing composition shingle roof and/or other suitable roof surfaces (e.g., a metal seam roof, roof deck, underlayment or insulation layer). Some have improved aesthetics that reduce the visual differences between solar and non-solar portions of the roof. Some are more modular and/or simplify the replacement capability of individual photovoltaic ("PV") modules of the system. In addition, some cost less to make and install compared to conventional solar systems. And some solar systems can be installed as a new roof rather than a re-roof or mounted to an existing roof. These and other embodiments are discussed in greater detail in the detailed description and drawing figures.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive.

FIG. 3C shows a cross-sectional view of a building integrated photovoltaic system according to various embodiments of this technology.

FIG. 4A shows a cross-sectional, close up end view of a portion of a building integrated photovoltaic system including coupled seams according to certain embodiments of this technology.

FIG. 4B shows a cross-sectional view of a seam cover, seam clip, and standing seams according to certain embodiments of this technology.

FIGS. 4C and 4D show cross-sectional views of a building integrated photovoltaic system including seams that are coupled according to yet further embodiments of this technology.

FIGS. 5-9A show a perspective view, cross-sectional front view, and various side views respectively of a portion of a building integrated photovoltaic system according to other various embodiments of this technology

FIGS. 11A-11H show different views of a grounding clip for use with a PV system according to certain embodiments of this technology.

FIGS. 12A-12C show different views of wiring caps and clips for use with a PV system according to various embodiments of this technology.

FIGS. 13A-13M show various wiring systems, circuits, and pathways in accordance with various embodiments of this technology.

FIGS. 14A-14G show other wiring features and support pan structures in accordance with certain embodiments of this technology.

FIGS. 16A-16J are a series of diagrams showing schematic wiring options for solar cell sections of a photovoltaic module accounting for shading caused by standing seams, in accordance with various embodiments of this technology.

FIG. 19C shows an exploded perspective view of a PV module with different rail options according to various embodiments.

FIGS. 20A, 20B, and 20C show perspective, cross-section, and detail views of a corrugated PV pan with seam clips, in accordance with certain embodiments.

FIGS. 21A and 21B show perspective and cross-section views of a corrugated PV pan with seam clips and a PV module mounted thereto, according to other embodiments.

FIGS. 22A, 22B, and 22C show perspective, cross-section, and detail views of a corrugated PV pan with seam clips securing a PV module thereto in accordance with certain embodiments.

FIGS. 23A and 23B show perspective and cross-section views of a corrugated PV pan with seam clips and a PV module mounted thereon according to other various embodiments.

FIGS. 24A, 24B, and 24C show perspective views of photovoltaic modules and non-photovoltaic modules installed on support pans in accordance with certain embodiments.

FIGS. 27A-27E show latching assembly features for photovoltaic module assemblies, according to various embodiments.

DETAILED DESCRIPTION

Figure 1A:
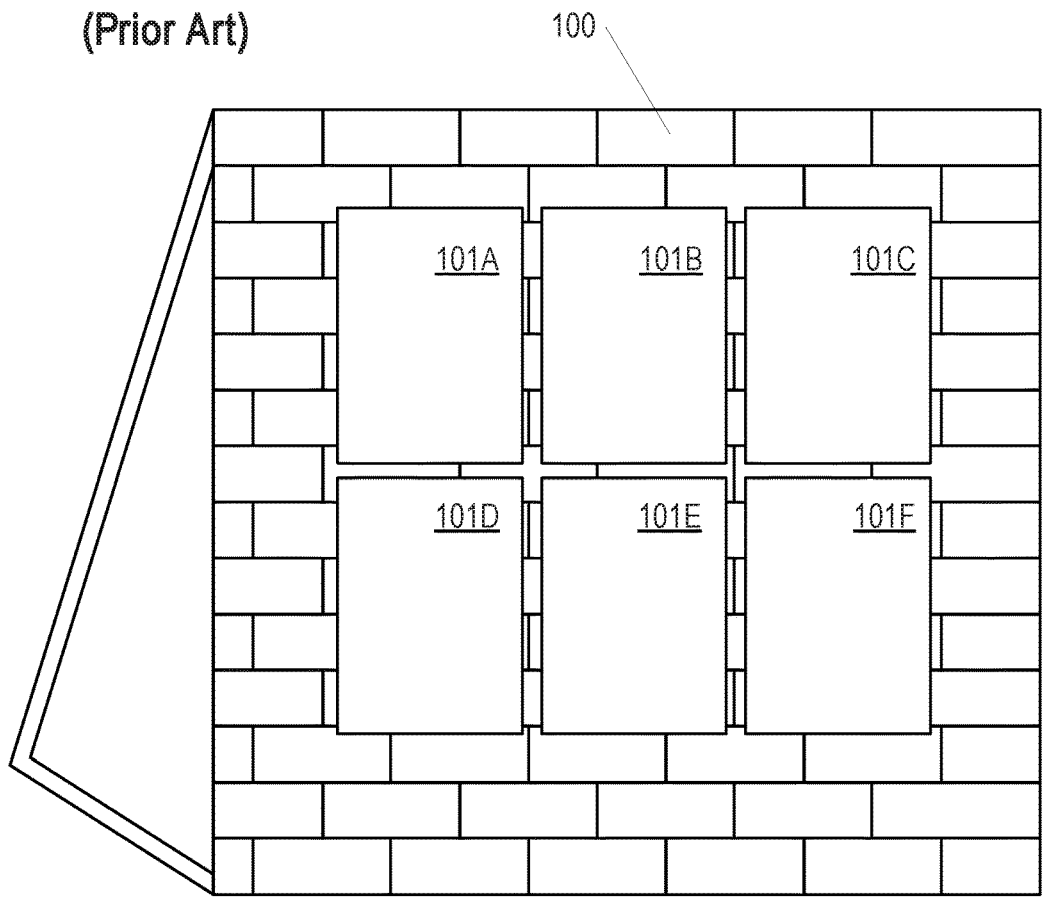
FIG. 1A shows an example of a prior art photovoltaic array installed on a roof.

The present disclosure describes various embodiments of photovoltaic roofing systems and associated systems and methods. Some embodiments relate to building integrated photovoltaic module assemblies and associated systems and methods. In various embodiments, the systems described herein lower costs of conventional systems in which a PV system is installed over a roof, and at the same time can provide an improved aesthetic for a PV roof system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

Many of the details, dimensions, angles and other features shown in the Figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be, for example, by ±5%, ±10%, ±15%, ±20%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" of "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. The PV modules, PV module pans, or both (depending on the particular embodiment) can be used as the actual building envelope (e.g., roofing membrane) to provide a watertight or substantially watertight seal. Alternatively, in other embodiments, the PV components (e.g., photovoltaic modules and associated wiring) of the system may be affixed over the building envelope in a manner that simulates the appearance of BIPV without having the PV system components be part of the building envelope. In other words, the PV modules may be installed over a metal roof pan or support pan that makes up part of the building envelope. As used herein, the term "BIPV system" may be used to refer to either configuration.

As used herein, the terms "up-roof" and "down-roof" are used to provide orientation, direction, position, or a reference point relative to or in context of a roof or roofing surface upon which the systems described herein are installed on and/or form a portion of. Up-roof generally refers to an orientation that is relatively closer to the roof ridge while down-roof refers to an orientation that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Rapid shutdown devices ("RSD") for PV systems can be applied to the systems described herein, and can be located or positioned in various locations. In some embodiments, a recess or other opening can be made in structural support pans (e.g. a transition pan or a non-PV pan) through insulation such that RSD can be inset or positioned inside recessed opening. Vents can be positioned on top of opening to conceal or cover opening. Structural support pans can be elements of roofing frames or array systems that provide stability or integrity to the overall structures, as described in further detail below. RSD can be positioned within a box or other suitable container prior to positioning within recess. In other embodiments, RSD can be positioned under eaves, or eave flashings or gutters. In yet other embodiments, RSD can be positioned within attic portions of a building.

Generally, PV modules are crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting pans. In some embodiments, PV modules can include layers of amorphous silicon or thin film variations of solar energy-collecting laminates (unlike traditional thin-film solar materials directly applied to continuous metal sheets of a roof). Generally, PV pan-module assemblies as considered herein, including PV modules, solar panels and laminates, have individual structures that can be used in combination to form larger solar arrays and/or building structures, as set forth below. Alternatively, thin-film PV modules, such as cadmium telluride, copper indium gallium diselenide, or amorphous thin-film silicon may be used. In still further embodiments, cells based on perovskite or other as of yet non-commercialized materials may be used. The particular type of cell technology used is a design choice and not critical to the various embodiments of the invention.

FIG. 1A shows a prior art PV array installed on roof 100. The exemplary PV array of FIG. 1A includes six solar panels 101 or modules (identified individually as solar panels 101A-101F). Though not shown in detail, panels 101A-101F are mounted on roof 100 using one of various known rail-based or rail-free mounting systems, as are currently employed by solar installers, such as San Mateo, Calif.-based SolarCity Corporation.

Figure 1B:
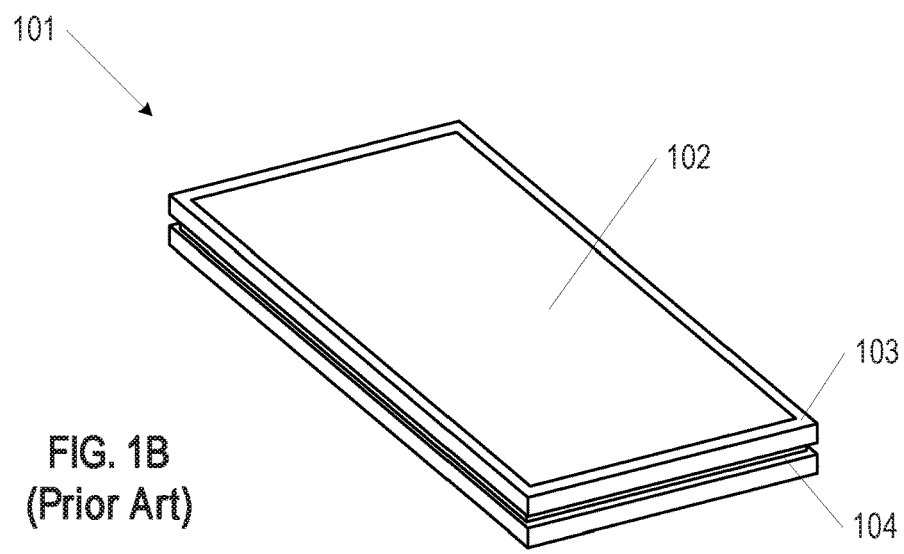
FIG. 1B shows an exemplary prior art photovoltaic module.

FIG. 1B shows one type of conventional solar panel 101 in more detail. Solar panel 101 includes PV laminate 102, which in conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 102. Although shown as a unitary structure, laminate 102 may include a plurality of individual solar cells that are wired together to form a single unit under the top glass sheet. In the example shown in FIG. 1B, frame 103 is a grooved frame with groove 104 surrounding the outer face of frame 103 on all sides. Grooved frame modules such as module 101 are manufactured and sold by SolarCity Corporation of San Mateo, Calif. In such a module, groove 104 serves as mechanism for attaching other mounting hardware (e.g., a leveling foot, an interlock) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal and have material usage inefficiencies. First, conventional PV systems, such as that shown in FIG. 1A, are typically installed over an existing roof, essentially requiring redundant structure since the PV array will shield most of the portion of the roof that it is installed over. Second, conventional systems are deemed by some people to be unaesthetic. Conventional PV modules usually come in one of two colors: blue, signifying a poly-crystalline silicon structure, and black, signifying a mono-crystalline silicon or thin-film structure. The metal frame portion can be painted black to help it blend in with the roof surface, or it can simply be raw aluminum. Regardless of whether blue or black modules are used, the difference between the look of the portion of the roof that is covered with solar and the remainder of the roof is generally quite dramatic. As a result, roofs that are partially covered with solar panels have an aesthetic contrast that can be seen from very far distances due to the difference in reflectivity, elevation, height, and/or color between these two very different surfaces.

Building Integrated Photovoltaic Array & Coupling Seams

Figure 2A:
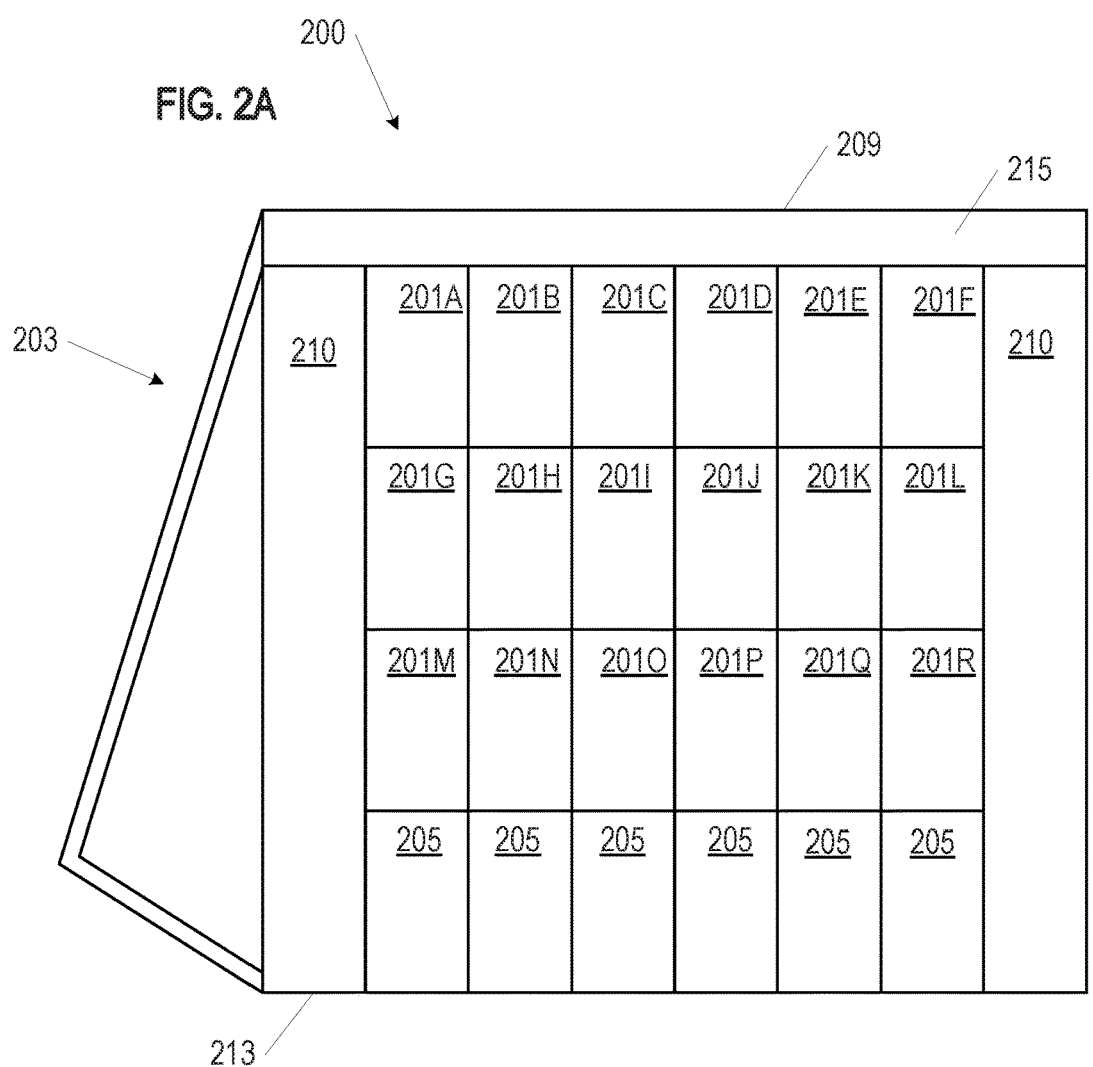
FIG. 2A shows a building integrated photovoltaic system according to various embodiments of this technology.

FIG. 2A shows BIPV system 200 installed on a plane of roof surface 203. System 200 is arranged in vertical pans on existing roof 203 to mimic the look of an all metal standing seam metal (e.g., steel, aluminum, galvanized) roof with evenly spaced vertical seams running from the roof ridge to the eave. The resultant BIPV system is comprised of six vertical pan sections containing PV modules 201A-201R, regular roof pans 210, and dummy or transition pans 205 that complete the six vertical columns (e.g., col. 1=201A, 201G, 201M; col. 2=201B, 201H, 201N; col. 3=201C, 201I, 201O; col. 4=201D, 201J, 201P; col. 5=201E, 201K, 201Q; and col. 6=201F, 201L, 201R). As discussed in greater detail herein, in some embodiments, the PV modules in each column (e.g., 1, 2, 3, 4, 5, and 6) may be affixed to a roof pan containing raised seams on either side. In other embodiments, the PV modules in each column may make up a portion of the roof-facing portion of the pan. Ridge cap 215 sits at the top of the resultant array, and as discussed herein may be used for venting, heat dissipation, and wire management. Together, these elements form an integrated PV roofing system 200 that reduces the redundancy inherent in conventional PV systems while providing a uniform look.

Standing seam as understood herein refers to the raised seams running up-roof to down-roof on both sides of a roof pan that are used to interlocking adjacent pans. The standing seams can be vertically or upwardly extending sidewalls or flanges and may be held together with clips or other fasteners. The seams between pans may be covered with a cap or other feature that keeps them watertight while concealing the seam. While shown as extending substantially perpendicular to a base planar surface portion (e.g., the plane of the roof surface or PV modules), in other embodiments, the standing seams can extend at angles other than ninety degree. Systems and features described herein can also be applied to non-metal (e.g., comp shingle, tile) roofs.

The seams (e.g., raised seams) of adjacent roof pans used in the PV systems described herein can be interlocked (e.g., coupled or secured together) in a variety of manners. For example, seams can be interlocked by folding (e.g., bending, rolling) one seam over the another seam and crimping them together (see e.g., FIG. 3C), which creates equally spaced, interlocked seams running from roof ridge 209 to roof eave 213. In some embodiments, seams are interlocked or snap-locked by clips, clamps, covers, or other suitable mechanical fasteners (e.g., rivets and screws) that fit over the entire seam as described in more detail below with reference to FIGS. 4A-4D. In yet further embodiments, seams can be welded or otherwise bonded or adhered together. As noted above, in certain embodiments seams of systems described herein can be inverted (e.g., extended or bent in a downward direction such that they are positioned below the roof or PV module surfaces) as compared to the standing or raised seams.

In yet further embodiments, the seams can be hemmed, folded, or bent into different configurations to provide improved engagement features as described in more detail below (see e.g., FIG. 4B). For example, a clip used to engage and couple the hemmed seams can include one or more hook portions that can engage (e.g., be "snap-locked") the seams in a manner to provide increased resistance to pullout in response to uplift forces (e.g., wind uplift). Further, having such hemmed or bent seams can provide improved safety when shipping and installing such components by reducing the number of exposed sharp edges. In yet other embodiments, the seams can be inverted or extended (e.g., bent) downward such that ends of the seams are positioned below the planar, roof surface portions of the metal roof.

System 200 includes a solar array of eighteen low profile building integrated PV modules 201 (identified individually as PV modules 201A-201R arranged in six columns and three rows of PV modules). PV modules 201 can, in some contexts, also be referred to as PV panels or solar panels. In other embodiments, system 200 can include a different number of columns or rows of PV modules (e.g., two rows). Further, the columns and/or rows can be spaced apart as desired (e.g., not directly adjacent to each other). System 200 can also include dummy modules 205 (alternatively referred to as dummy panels) and columns of standard roof pans 210 that contain no solar PV modules. Dummy modules 205 generally refer to roof structures that can mimic the appearance of PV modules 201, serving a function similar to standard roof pans 210. In some contexts, roof pans 210 can alternatively be referred to as general support pans or non-PV pans.

Figure 3A:
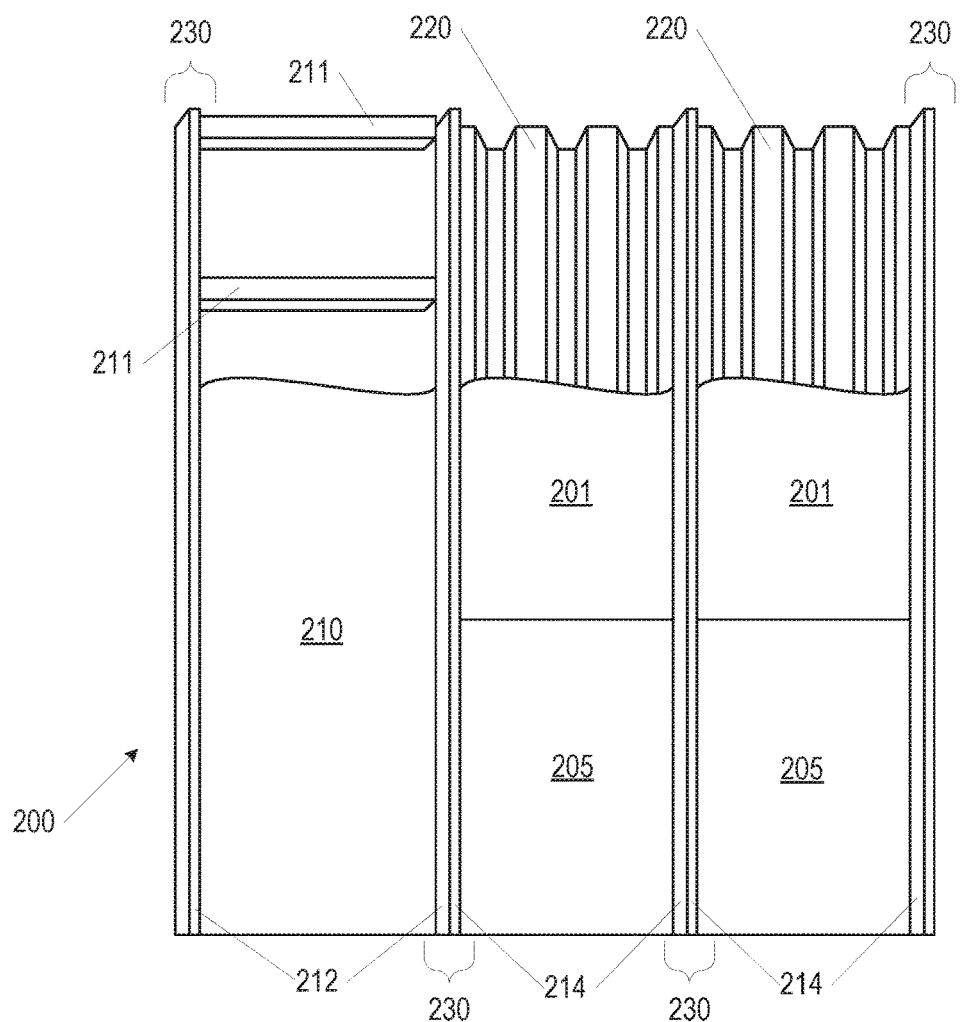
FIG. 3A shows a partial cutaway view of a portion of a building integrated photovoltaic system according to various embodiments of this technology.

As discussed above, PV modules 201A-201R can be placed or mounted within ordinary pans that are substantially the same as non-PV pans 210. Alternatively, they may be installed in, or part of special pans (e.g., pans 220 in FIG. 3A) so that the height of modules 201A-R is substantially equal to the height of non-PV pans 210. Moreover, as discussed in greater detail herein, the pans holding modules 201A-201R, in columns 1-6, may be specifically configured with additional recesses (e.g., 224) to accommodate module junction boxes 217 and route power cables as shown in FIGS. 3A and 3C. In contrast, standard roof pans 210 generally refer to traditional structures and panels used for the tiling or construction of roofs, which do not include PV electricity generation components. Such non-PV pans 210 may be installed over roof battens 211 as seen in the partial cutaway view of FIG. 3A. Alternatively, they may be installed directly on the roof deck. Dummy modules 205 are roof pans that are used to complete a column of PV pans, after the PV portion stops. Dummy modules 205 may not only mimic the appearance of PV modules 201, but they may be mounted on PV pans 220 instead of PV module 201. In such a case, dummy modules 205 can maintain a uniform appearance alongside PV modules and provide space beneath the generally uniform planar surface of PV modules 201 of system 200, in which electrical components can be centralized, ventilation can be achieved, or where access to underlying roof 203 (e.g. sub-roofing, an attic, etc.) can be provided.

Dummy modules 205 can be substituted for, or configured to appear similar to, roof pans 210 and/or PV modules 201. For example, dummy modules 205 can be painted to match in color or appearance of roof pans 210 and/or PV modules 201. In some embodiments, dummy modules 205 can be used as transition pans at up-roof (e.g. at ridge 209 of roof 203) or down-roof portions (e.g., at eave 213 of roof 203) at the beginning and/or end of a column of PV modules 201, as described in more detail below. In other embodiments, roof pans 210 can be used as transition pans, such as part of a column of PV modules 201. As used herein, the term transition pan refers to sections of roof pan that are used to transition between different pan types (e.g., PV pan 220 and non-PV pan 210) or to complete a column before PV modules start or after they stop. In certain embodiments, dummy modules 205 can be installed adjacent to side portions of roof 203, in place of, or along with roof pans 210. In other embodiments, roof pans 210 can be used or substituted for one or more dummy modules 205. In some embodiments, dummy modules 205 can include roof pan 210 or panel or a PV module layer (e.g., glass, backsheet, etc.) positioned on a batten or other pan mount.

System 200 can include ridge cap 215 to cover roof ridge 209 and may be used to conceal and protect wires (e.g., conduits or cables) or other equipment (e.g., fans, vents, connectors, inverters, jumpers, home-run connections). System 200 can also include other roofing components (e.g., flashings, gutters, vents, caps, covers, trims), for example, at eave 213, or at hips, valleys, or sides of the roof (not shown). While FIG. 2A shows system 200 including eighteen PV modules 201A-201R, in some embodiments, system 200 includes a solar array with more or less than eighteen PV modules 201. Further, in some embodiments, a column of roof pans 210 can also include dummy modules 205 and/or PV modules 201.

Figure 2B:
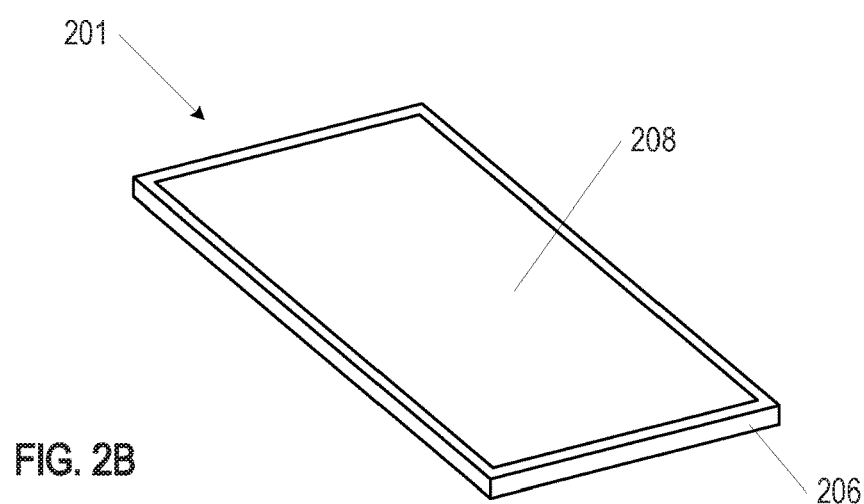
FIG. 2B shows an exemplary photovoltaic module usable with a building integrated photovoltaic system according to various embodiments of this technology.

FIG. 2B shows exemplary low-profile BIPV module 20. In various embodiments, PV modules 201 can include any number of cells, including more or less than conventional 60-cell or 72-cell solar panels. For example, PV module 201 may have 3 columns of 11 cells, 3 columns of 10 cells, or, in a shingled configuration, 3 columns of thirty-three 33 sub-cells, where each cell is cut into 3 shingled cells. PV modules 201 can also include bi-facial, shingled cells, or a combination thereof. As shown, PV modules 201 can be about half the width of conventional, full-width modules. Further embodiments of PV modules 201 can have a specific number of solar cells, such as 12-cell, 20-cell, 24-cell, 30-cell, 36-cell, 40-cell, 42-cell, 48-cell, 54-cell, or 56-cell embodiments. Other embodiments of the present technology can include PV modules having 60-cell, 70-cell, 80-cell, or 92-cell solar panels, or other such solar panels as known in the field. Further embodiments can have PV modules 201 with other number-of-cell embodiments within the above-considered ranges. The various embodiments of PV modules 201 with different numbers of solar cells allows for flexibility in selecting solar panels appropriate for any given system installation.

PV modules 201 can also be frameless or have a minimized frame structure, as shown in FIG. 2B. In other words, PV modules 201 can be constructed without a rigid frame (e.g., made of metal, plastic) surrounding or enclosing the edges of the panel, or in some embodiments, surrounding only a portion of the bottom and sides but not the top of the module. Individual PV modules 201 can include layer of top glass 208 and a back sheet that will sandwich the internal PV layers as described in more detail below with respect to FIGS. 2C and 2D without any framing. In certain embodiments, because PV modules 201A-201R can be supported by PV pans 220 (e.g., tray, plate—as shown, for example in FIG. 3A), where PV pans 220 with raised portions 222, whereas PV pans 220 sit on and/or are secured to roof 203 or other suitable roof surface at valleys 224, PV modules 201A-201R may not need to be as strong as framed panels in an ordinary or conventional array. In other words, in an ordinary or conventional array, the panel frame can become part of the mounting system and is subject to the same forces and moments as the mounting system, whereas in contrast, PV pans 220 can primarily bear load instead of PV modules 201. PV modules 201 and PV pans 220 form PV module-pan assemblies when bonded or otherwise coupled to each other. Frameless, low profile solar PV modules are not required. For example, a framed module can used and the frame can be color matched to PV pan 220.

Generally, in various embodiments, either or both of non-PV metal roof pans and transition pans can be painted to appear like PV modules, for example, replicating solar cell lines, color, and other visual characteristics of PV modules. Similarly, either or both of non-PV metal roof pans and transition pans can have visual or structural characteristics to track PV module-pan assemblies. The combination of these elements can provide for an overall roof appearance that is visually pleasing, with minimal points of contrast or sharp edges to distract the eye of an observer.

It should be understood that in these embodiments, roof pitches where such systems are installed are non-zero, and that the systems are installed to account for the angle or slope of (non-flat) roofs. The distances or gaps between various pans, modules, and assemblies, and the degree to which such gaps are concealed will be dependent on roof pitch, the distance a viewer is from the roof, and the height of the viewer.

Figure 2C:
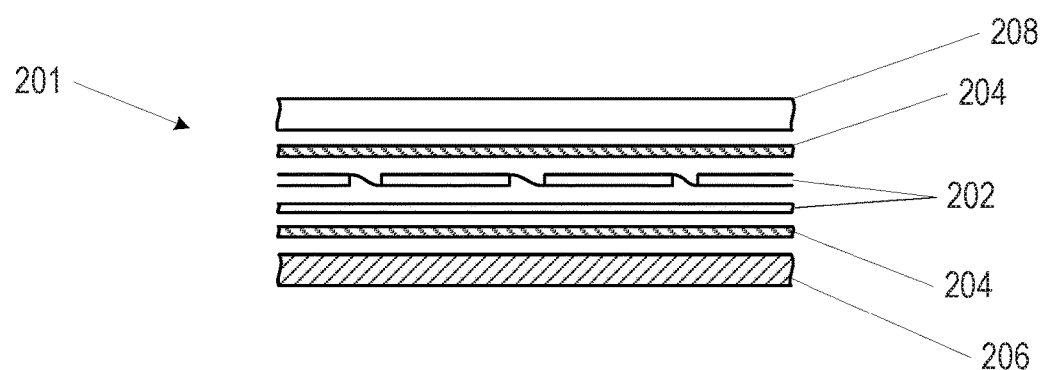
FIGS. 2C and 2D show exploded cross-sectional views of the PV module of FIG. 2B showing the different layers of the PV module according to various embodiments of this technology.
Figure 2D:
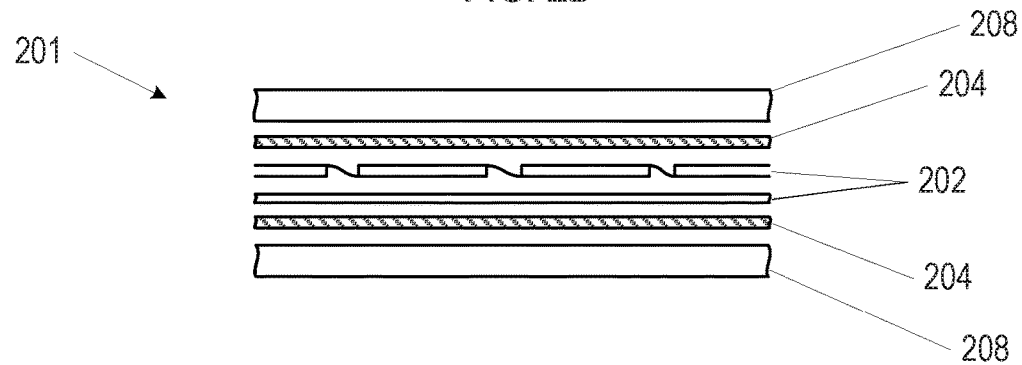

FIGS. 2C and 2D show in further detail the layers of exemplary PV modules 201. In some embodiments, PV modules 201 described herein refer to crystalline-type (e.g., non-thin film or amorphous solar) solar modules. However, PV modules 201 are not limited to crystalline-type solar cell technology. For example, in other embodiments, thin-film or amorphous solar (e.g., amorphous silicon) can be used as laminate layers with certain embodiments of PV modules 201 described herein. In yet further embodiments, hybrid crystalline and amorphous solar modules can be used with PV modules 201 systems described herein. In other embodiments, other types of solar cells (e.g., non-silicon based semiconductors, partial silicon, non-crystalline, partial crystalline, organic, carbon-based, perovskite, cadmium-telluride, copper-indium-gallium-selenide ("CIGS"), dye sensitized, transparent luminescent solar concentrator, polymer, transparent cells) can be provided as part of PV modules 201.

As shown in FIG. 2C and noted above, in some embodiments, PV module 201 can include PV layers 202 (e.g., solar cells, semiconductor layers, bussing, insulation, laminate) sandwiched between encapsulation layers 204 (e.g., EVA). PV modules 201 can further include one or more backsheets 206 (e.g., polyvinyl fluoride film) and/or glass layers 208. As shown in FIG. 2D, PV modules 201 can include first and second glass layers 208 (e.g., "glass on glass") sandwiching encapsulation layers 204. The glass on glass PV modules 201 can also eliminate or reduce the need for additional intermediate material layers (e.g., a pan portion, underlayment, felt paper) between a bottom of PV module 201 and existing roofing surfaces, which may otherwise be used for fire protection or other purposes. In certain embodiments, PV modules 201 can include both glass layer 208 and one or more backsheet layers 206. In yet further embodiments, PV modules 201 can include one or more additional layers (e.g., transparent coatings, insulation layers, phase change material layers to help with heat transfer) on a top side (e.g. the side of PV module 201 incident to solar energy), rear side (e.g. the side of PV module 201 proximate to the installation surface or roof), or as intermediate layers.

In some embodiments, tape, edge trim, or other edge protection materials can be applied to corners, edges or sides of PV modules 201 to protect PV modules 201 from damage during shipping or installation. These can be configured to be tear-away or permanent materials. Encapsulation layers 204 or backsheet layers 206 can also be optionally trimmed during manufacturing such that they can be rolled over PV module 201 edges and laminates to provide edge protection. Any or all portions of encapsulation layers 204 or backsheet layers 206 can then be removed prior to, or during installation, on a roof. In certain embodiments, glass edges of glass layer(s) 208 can be rounded or beveled accordingly for ease of installation.

Although backsheet layers 206 can have a light color, such as white, PV modules 201 can include non-white (e.g., black, blue, transparent) backsheet layers 206. Non-white backsheet layers 206 can improve aesthetics by reducing glare or reflection off or through glass layers 208 or a mounting pan as compared to white backsheet layers 206. Additionally, black or blue backsheets tend to be closer in color to conventional solar cells or PV modules. Thus, non-white backsheets can create a more uniform appearance with the rest of the system. Backsheet layers 206 (or other layers) may be cut at an angle, such that the cut, exposed portion of backsheet layer 206 faces roof 203, or is oriented in a substantially downward direction (e.g., toward the roof) when PV modules 201 are assembled and mounted to the roofing surface.

The arrangement of backsheet layers 206 above or below PV layers 202 and encapsulation layers 204 can provide for added thermal control and/or directed light reflection within PV modules 201. In some embodiments, PV modules 201 may include first and second backsheet layers 206 (e.g., non-white or white) sandwiching encapsulation layers 204 (e.g., on both air and cell sides of PV module stack). Further, backsheet layers 206 can be integrated with encapsulation layers 204 or adhesive layers in certain embodiments. Certain backsheets can also provide PV modules 201 with improved thermal dissipation or heat reflective properties, electrical insulation, or protection from damage, moisture, or UV degradation. Such backsheets can include dyMat™, DuraShield®, or PowerShield®.

Figure 3B:
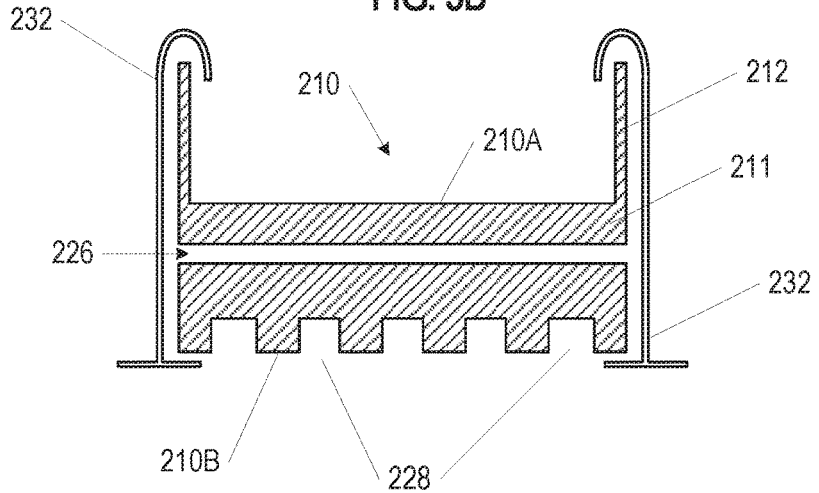
FIG. 3B shows a cross-sectional view of a structurally integrated non-PV roof pan or panel configured in accordance with certain embodiments of this technology.

FIG. 3A shows a partial cutaway view of a portion of building integrated PV system 200, and FIG. 3B shows a cross-sectional view of the same system 200. FIGS. 3A and 3B show the layers of different materials or components used to construct system 200. System 200 can be installed, for example, directly over an existing composition shingle roof layer and/or other suitable roof surface or structure (e.g., a roof deck, metal seam roof, insulating layer, underlayment, ice dam protection membrane, slip sheet, batten, purlin, rafter, flashing, furring strip). Alternatively, the existing roof may be scraped clean before installing system 200. In still further embodiments, system 200 may be installed as part of new construction where there is no existing weather resistant roof surface other than the plywood roof deck.

After a desired size of the solar array has been determined (e.g., based on orientation of the roof, space considerations, weight considerations, amount of electricity production required, efficiency of modules, amount of sunlight), trim, vent, or flashing at the eave or sides of roof 203 can be installed. Battens 211 can then be installed across roof 203 in areas (e.g., columns) of roof 203 where non-PV modules will be placed. For a composition shingle roof, battens 211 can be attached directly over the composition shingle roof in a series of rows that run from roof ridge 209 down to roof eave 213 and/or as continuous or semi-continuous layers or sheets of insulation material, which in some aspects, can be referred to as intermediate layers 219 of roof 203. Non-PV roof pan(s) 210 and/or dummy modules 205 can then, for example, be installed over battens 211.

In alternative embodiments, battens 211 can be pre-installed, secured to, or otherwise integrated with an underside of non-PV roof pans 210 and/or dummy modules 205 (e.g., forming a structurally integrated roof panel) prior to securing roof pans 210 to roof 203. For example, as shown in FIG. 3B, non-PV roof pans 210 can include batten 211 (e.g., foam, isoboard, polyisocyanurate foam, or other insulation materials) sandwiched between upper pan surface 210A and lower pan surface 210B. Lower pan surface 210B can be secured to upper pan surface 210A to provide improved overall rigidity of roof pan 210. This can help reduce unintended detachment of roof pans 210 as well as resistance to uplift from wind. For example, lower pan surface 210B can include raised seams 232 secured or configured to be secured to standing seams 212 of upper pan surface 210A with seam clips or other suitable fasteners (e.g., rivets), or be welded together. Further, in certain embodiments, batten material can include one or more primary wiring channels 226 (or "pathways") that provide space for wire routing and management, and that can be oriented in either or both of an "East-West" direction (transverse to the length of roof pan 210) or a "North-South" direction (longitudinally along the length of roof pan 210). Similarly, in some embodiments, lower pan surface 210B can include one or more secondary wiring channels 228 that provide space for wire routing and management, and that can be oriented in either or both of an "east-west" direction (transverse to the length of roof pan 210) or a "North-South" direction (longitudinally along the length of roof pan 210).

While battens 211 are shown in FIG. 3A as extending generally horizontally (e.g., side-to-side) in rows across roof 203 between corresponding seams 212 (identified individually as seams 212A and 212B) of non-PV pans 210, battens 211 can be positioned on or extend across roof 203 in a direction generally parallel to or at an angle to a longitudinal axis of standing seams 212. Although battens 211 have a rectangular cross-section, any other suitable cross-sectional shapes (e.g., triangular, square, trapezoidal) can be used. Battens 211 can have one or more cross-sectional sizes. For example, battens 211 can have a cross-sectional dimension equal to or about 1"×4", 1.5"×4", 1.75"×4", 2"×4", 3"×4" (where quotation marks indicate inches), or any value in between.

Battens 211 may also be spaced apart or include one or more channels or apertures such that cables, conduits, or other wires can be routed through or pass across the roof underneath the pans (e.g., in either or both of North-South and East-West directions). Battens 211 can, for example, be made of wood or other suitable materials (e.g., foam, rubber, polystyrene, isoboard, metal, polyisocyanurate foam). In certain embodiments, battens 211 can include a layer of reflective material. In yet further embodiments, battens 211 can include one or more continuous or semi-continuous layers of suitable materials as set forth above.

Non-PV roof pans 210 can be manufactured in pre-cut lengths (e.g., 6', 8', 10') and cut to fit into custom lengths as needed for any given installation. Roof pan 210 can also be pre-formed with standing seam 212, ridge or other feature that matches or mimics PV pan standing seam 214 as configured between adjacent low profile building integrated PV modules 201. As shown in FIG. 3C, roof pan 210 can have standing seam 212 with larger outer seam 212A on the left side and smaller inner seam 212B on the right side. PV standing seams 214, also with left side larger outer seam 214A and right side smaller inner seam 214B, can mirror seams 212A and 212B, or vice versa. These configurations facilitate interconnection or interlocking of standing seams 212 of roof pan 210 with corresponding standing seams 214 of PV pan 220, forming interlocked standing seam 230. Alternatively, all seams can be the same. Battens 211 can be sized to maintain roof pan 210 at a height or elevation that is equal to or substantially similar to surrounding PV modules 201 and dummy modules 205. Battens 211 can also support roof pan 210 from below so that if for example, an installer steps on roof pan 210 during installation, roof pan 210 is less likely to dent or take on the shape of the course of shingles below.

FIGS. 3A and 3C show one or more PV pans 220 that extend in a column adjacent to roof pan 210. PV pans 220 in this embodiment are partially corrugated pans with a series of ridges 222 (alternatively referred to as peaks) and channels 224 (alternatively referred to as troughs or valleys) formed in PV pans 220 that provide support to PV modules 201 mounted on PV pan 220. PV modules 201 and dummy modules 205 can be installed over PV pan 220 to form a complete column of similar looking material. Dummy modules 205 can also be made of glass, painted metal, plastic or other material that matches the color, reflectivity, and/or texture of PV modules 201 or non-PV roof pans 210.

As noted above, dummy modules 205 can also be configured as transition pans at down-roof or up-roof portions of a column of PV modules 210 and PV pans 220. Transition pans can be installed at up-roof and down-roof portions (e.g., ridge or eave, respectively) of a PV system (e.g., a roof). Dummy pans 205 can appear the same or substantially similar in appearance to the non-PV roof pans 210 and/or the assembly of PV modules 201 with PV pans 220. Various embodiments are described in more detail and shown below.

Similarly, non-roof pans 210 can also be similarly configured (e.g., painted) to match the color, reflectivity and texture of PV modules 201, or vice versa. In some embodiments, modification of dummy modules 205 or non-PV roof pans 210 can include grid-lines or other features (e.g., printed cells, bussing, or busbars) to further match the appearance of PV modules 201.

In certain embodiments, one or more PV module junction boxes 217 (alternatively referred to as "j-boxes") can fit within or extend into one of channels 224 of PV pan 220. Junction boxes 217 can be attached to or extend from a bottom surface of the PV modules into channels 224. As described in more detail below, having more than one junction box 217 (e.g., V+ and V−) can provide additional or improved potential wire routing pathways or connections. Further, including more than one junction box 217 can decrease the profile or size required of each junction box 217, relative to a single j-box implementation and also reduce the amount of external or internal wire (e.g., copper wire) required for electrically connecting cells and PV modules of a PV system relative to using one junction box 217 in certain embodiments. In certain embodiments, efficiency can be improved by reducing internal or external resistances by reducing the amount of internal or external wiring.

One or more junction boxes 217 can be center mounted, for example, on the underside of PV module 201, as shown in the center portion of FIG. 3C. Junction boxes 217 can also be mounted off-center (e.g., more proximate to opposing sides and/or ends of PV module 201 rather than a center or center-line of PV module 201) on the underside of PV module 201, as shown under PV module 201 in the right side portion of FIG. 3C. In some implementations, primary wiring channels 226 and/or secondary wiring channels 228 can accommodate the wires and connectors that interconnect adjacent or proximate PV modules 201 to each other as part of system 200, as well as the home run connection to a power substation connected to system 200. Junction boxes 217 can be pre-assembled, clipped, or bonded to PV modules 201. Wires or cables for connection to other junction boxes 217 can optionally be pre-attached (e.g., taped, with clips) to PV modules 201 prior to installation. In certain embodiments, PV modules 201 can include micro-inverters, DC optimizers, or other module-level electronics as part of or separate from the housing that also holds junction boxes 217.

As shown in FIG. 3C, either battens 211 or PV pans 220, or both can be installed over existing composition shingle roof or roof deck 203. In some embodiments, intermediate layers 219 of felt paper, insulation (e.g., battens, isoboard, polyisocyanurate foam, foam), reflective layers, underlayment (e.g., moisture, fire protection, or other suitable insulation layers such as VersaShield®, MetShield®, or Dens-Deck®), and/or other suitable layers can be positioned between shingle roof 203 and bottom of battens 211 or PV pans 220. In certain embodiments, battens 211 or PV pans 220 can be mounted onto an existing or newly installed roof deck with no composition shingle thereon. In yet further embodiments, intermediate layers 219 can be positioned on top of battens 211 or further insulation layers, instead of, or in addition to, under battens 211. Further, battens 211 (e.g., insulation layer or other spacers or raisers) can space roof pans 210 to a desired height above roof 203 surface, for example, such that roof pans 210 are coplanar with PV modules 201 or dummy modules 205.

Installation of system 200 can continue with another PV pan 220 or column of PV pans 220 being joined to first column of PV pan(s) 220 via another respective standing seam 230. In certain embodiments, PV pans 220 will be covered by PV modules 201, roof pans 210, or dummy modules 205, thus, screws or other suitable fasteners (e.g., glue, nails, clips) can be used to attach further PV pans 220 directly to roof 203 surface or structure. Similarly, further columns of roof pans 210 and/or PV pans 220 can be installed on either side of system 200 not show, in other words, to the further right of side of PV pans 220 and/or to the further left of non-PV roof pans 210, and joined with respective roof pans 210 and PV pans 220 using another standing seam 230.

After non-PV roof pans 210 and PV pans 220 have been installed with standing seams 230 formed for the full coverage of system 200 for given roof 203, either dummy modules 205 and low profile PV modules 201 can be installed directly over PV pans 220. In some embodiments, PV modules 201 can be joined to PV pans 220 prior to installing PV pans 220 to roof 200 and/or forming interlocked seams 230. Dummy modules 205 can be bonded to roof pans 210 and PV modules 201 can be bonded to PV pans 220, for example, with a non-watertight (e.g. hook and loop) or watertight/substantially watertight adhesive (e.g., glue, sealants such as PV 804, RTV, PV-8030, thermal adhesive), or otherwise suitably coupled via one or more mechanical fasteners (e.g., clips, clamps, screws), depending whether system 200 is configured to allow water to flow between PV modules 201 and PV pans 220 or to maintain water above PV module 201 surface and out of PV pan 220. For example, in various embodiments, dummy modules 205, roof pan 210, or PV modules 201 can have one or more standing seams or rail portions that can be bonded to a separate pan that has seams or rails and can further be interlocked under a seam cover or other engagement features to form of standing seam 230. In other aspects, dummy modules 205 can be bonded to PV pans 220, to be arranged intermittently between with PV modules 201 also bonded to PV pans 220.

Once the array has been completed and all electrical interconnections made, ridge cap 215 can be installed over roof ridge 209 to conceal top edges of roof pans 210 and PV pans 220 as well as any PV wires or cables. The result of deploying and installing roof pans 210, dummy modules 205, and low profile building integrated PV modules 201 is to create an aesthetically consistent PV array with a uniform or substantially uniform look and elevation that is essentially a re-roof (or a newly installed roof) of an existing structure (e.g. a customer's home) with less material than conventional solar plus roofing. The entire roof, including PV modules 201, dummy modules 205, and flat roof pans 210 form a planar or substantially planar array of uniform or substantially uniform height. Because metal roofs are known to generally last 30-50 years, depending on climate, roof 203 can last at least as long as the solar panel system 200, thereby greatly minimizing or eliminating the possibility that roof 203 will expire before BIPV system 200 has reached an expected end of functional life. While shown here as part of an on-roof system, it can be understood that the installation process can also apply to PV pans and modules assembled as part of a built-in solar assembly, incorporated into the framing structure of a roof.

Figure 4E:
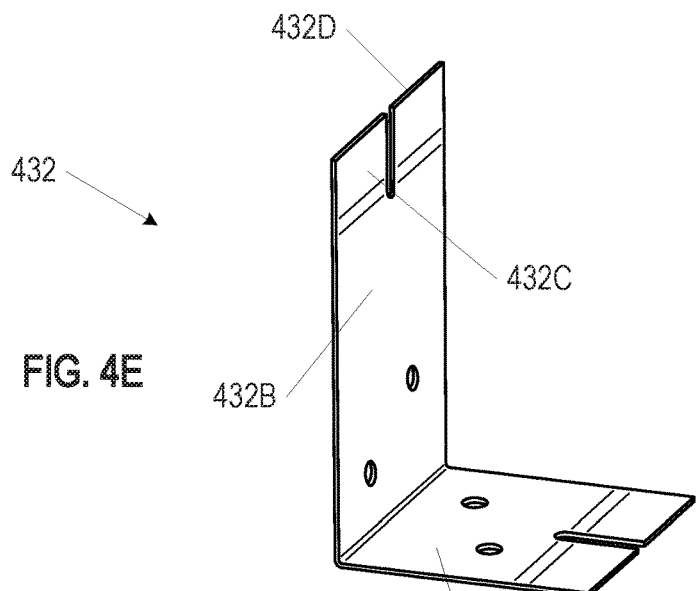
FIGS. 4E-4G further show different views of a seam clip configured in accordance with an embodiment of this technology.

FIGS. 4A-4I show other ways to assemble and interlock the seams of adjacent pans and modules and/or attach a PV module to a pan (e.g., a corrugated pan). FIG. 4A is a general representation of standing seam assembly 400, and FIG. 4B is a magnified, cross-sectional view of a portion of a PV system having corresponding standing seams of two adjacent pans, non-PV pan 410 and PV pan 420, interlocked or coupled together with one or more seam clips 432 to form standing seam assembly 400 in accordance with various embodiments. This could be a system such as system 200 in FIGS. 2A, 3A-3C, or a system such as that shown in other embodiments of this disclosures. Non-PV pan seam 412 of non-PV pan 410 and PV pan seam 414 of PV pan 420 can be interlocked with seam clip 432 positioned therebetween. Seam clip 432 can include two or more tabs (identified individually as first tab 432C and second tab 432D) that can be folded (e.g., bent or crimped) over respective standing seams non-PV pan seam 412 and PV pan seam 414 to interlock non-PV pan 410 and PV pan 420 together. Moreover, standing seam assembly 400 can, for example, hold and position both non-PV pan 410 and PV pan 420 such that the surfaces of non-PV pan 410 and PV module 401 form a uniform or substantially uniform planar surface. In aggregate, PV module 401, whether bonded, adhered, or mechanically coupled to PV pan 420, can be referred to as a PV pan-module assembly.

In various embodiments, as noted above and shown in FIG. 4A, standing seams, such as non-PV pan seams 412 of non-PV pans 410 can be hemmed or bent into various shapes rather than extend in a substantially vertical direction. The various shapes of non-PV pan seams 412 and PV pan seams 414 can include, for example, standing seams that are hemmed inwardly or medially toward each other, closed hems (e.g. with no gap), open hems where the hemmed portion can extend at various angles relative to a vertical axis. Such hemming can provide improved stiffness and rigidity that can help mitigate wind uplift as well as ease of installing or moving pans. The tabs of seam clips 432 can then include bent, hook, J-shaped, other projection, or engagement portions 438 for engaging hemmed non-PV pan seams 412 (e.g., in a snap-lock manner). Tabs of seam clips 423 can be installed extending generally upward in a vertical direction and then bent along a path P in FIG. 4A to be in an orientation to latch or interlock with standing seams. Seam cover 436 can then be cut to the appropriate length and assembled over the top of the interlocked (bent-over) seam clips 432 and standing non-PV pan seams 412. As noted above, this secured assembly can provide improved resistance to pullout of pans from the clips in response to, for example, wind uplift. Similarly, PV pan seams 414 of PV pans 420 can be hemmed or bent into various shapes rather than extend in a substantially vertical direction, and the tabs of seam clips 432 can include bent, hook, J-shaped, other projection, or engagement portions 438 for engaging hemmed PV pan seams 412 to secure PV pans 420 to a structure.

Shown in FIG. 4B, seam clip 432 can be attached to an existing roof surface or structure 407 (e.g., roof deck, composition shingle, rafter) prior to laying the pans over seam clip 432. As shown, in some embodiments, seam clip 432 has an L-shaped cross section with base portion 432A that extends under a lower surface of one of the non-PV pan 410 or PV pan 420 when attached to roof surface 407, and wall portion 432B extending between the respective non-PV pan seam 412 and PV pan seam 414. Seam clip 432 can include first tab 432C and second tab 432D, each of which can be configured to bend in opposite directions from each other, and thereby be positioned to latch or couple with standing seams on either side of seam clip 432. Further, both first tab 432C and second tab 432D can include one or more projections or "wing" portions, referred to as first tab wing 432E and second tab wing 432F, respectively, to engage with corresponding engagement features of seam cover 436 as described in more detail below.

In certain embodiments, seam cover 436 (or cap) can be attached over adjacent non-PV pan seam 412 and PV pan seam 414. Seam cover 436 can help reduce and ideally prevent the ingress of water, wind, or other debris to the space under either non-PV pans 410 or PV pans 420, or between standing seams. In various embodiments, seam cover 436 can include engagement features 438 (e.g., hooks, curved portions, J-shaped end portions) to engage or mate with corresponding projections, such as first tab wing 432E and second tab wing 432F, extending from first tab 432C and second tab 432D, respectively, to secure or couple seam cover 436 to seams clips 432 onto the respective standing seams of interlocked pans. In some aspects, first tab wing 432E and second tab wing 432F can have a spring tension, such that engagement between first tab wing 432E and second tab wing 432F with engagement features 438 secures seam cover 436 with seam clip 432 due to the mechanical interlocking of these parts and/or the frictional interface between these parts due to the restoring spring force of first tab wing 432E and second tab wing 432F on opposing interior sides of seam cover 436.

As shown, PV modules 401 can be attached to the upper surfaces (e.g., ridges 422) of corrugated PV pans 420 with adhesive 440 (e.g., hook and loop, sealant, glue) or with other types of suitable mechanical fasteners. Adhesive 440 can include one or more hook and loop strips or patches. In other embodiments, glue or other types of adhesives 440 can be applied to PV module 401 and PV pan 420 to couple or bond PV module 401 to PV pan 420. In some embodiments, the underside or backside (e.g., backsheet) of PV module 401 can include one or more layers, strips, and/or patches of padding 442 between applied adhesive 440 and PV module 401. Padding 442 can help protect PV module 401 and/or improve adhesion with adhesive 440. In other embodiments, padding 442 can be attached to the ridge portions 422 of pan 420. In certain embodiments, padding 442 (e.g., VHB tape, hook and loop) of a desired thickness can be applied to PV pans 420 or PV modules 401 in order to set PV modules 401 at a desired height above PV pan 420, such that PV module 401 will be mounted at a specified height (e.g. uniform with proximate non-PV pans 410) after applying adhesive 440. In such cases, padding 442 can be mounted to PV modules 401 prior to the application of adhesive 440.

FIGS. 4C and 4D are cross-sectional views of building integrated PV system 400 with seams secured according to other embodiments of the present technology. As shown, respective non-PV pan seams 412 of roof pans 410 and PV pan seams 414 of PV pans 420 can be secured together or interlocked by overlapping the seams and using rivets 416 to secure them together. As described above, PV pans 420 can be secured to the roof through the overlapping portion of via one or more rivets 416, screws 418, or other fastening members 444 (where fastening members 444 can be nails, bolts, etc.). FIG. 4D shows an embodiment where corresponding non-PV pan seams 412 of adjacent columns of non-PV pans 410 (e.g. roof pans) are secured together with rivets 416. Further, screws 418 can be hidden under an upper seam of the overlapping non-PV pan seams 412 and extend through the lower seam into an underlying roof (e.g., into a batten, rafter, deck, or other roof structure) to secure non-PV pans 410 to the underlying roof.

Figure 4F:
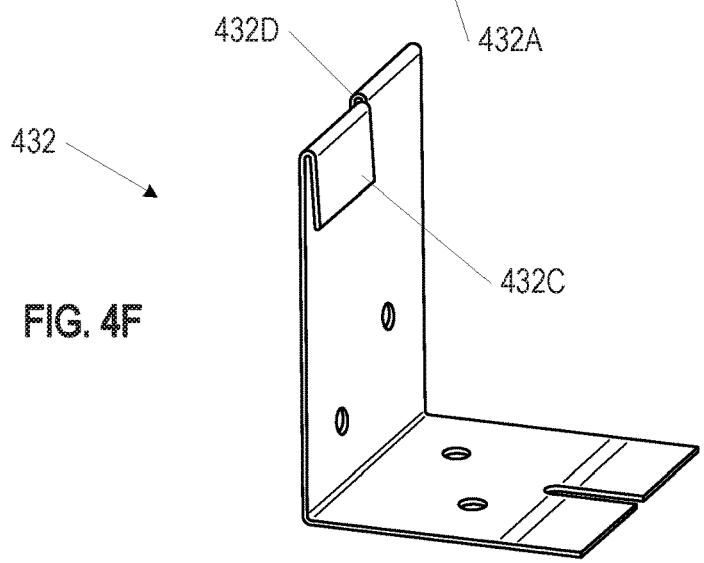
Figure 4G:
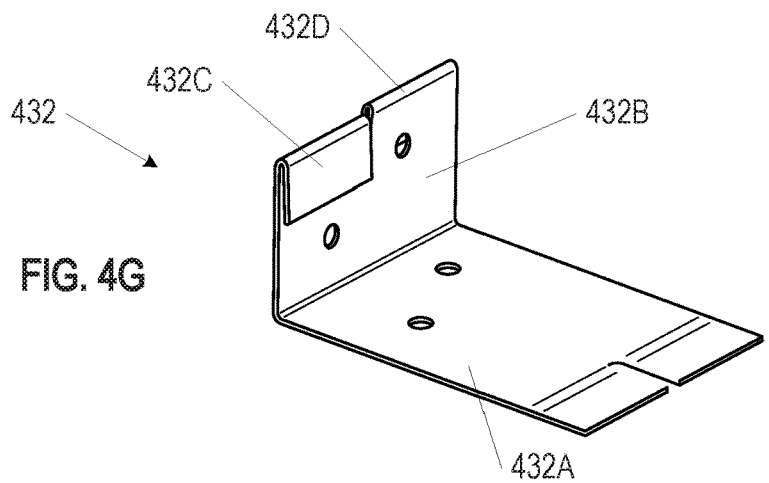

FIGS. 4E-4G show various isolated views of an embodiment of seam clip 432 that can be used to interlock or couple standing seams of PV pan-module assemblies, transition pans, or roof pans. Seam clip 432 can be configured to have tab portions, hook portions, or the like. Seam clip 432 can have a substantially L-shaped configuration or body having first surface 432A (alternatively referred to as a "base" surface) and second surface 432B (alternatively referred to as a "wall" surface) extending substantially perpendicular relative to each other. Such seam clips 432 can save or reduce manufacturing costs (e.g., by having one SKU). Seam clip 432 can be dimensioned such that seam clip 432 can be positioned below battens or other insulation layers (e.g., isoboard) to couple seams of adjacent pans (e.g. roof pans, PV pans, non-PV pans, transition pans, etc.) in a first configuration. Seam clip 432 can also be positioned above battens or other insulation layer to couple seams of adjacent pans in a second configuration.

In some embodiments, first surface 432A is smaller than second surface 432B (e.g., FIG. 4E). In other embodiments, first surface 432A can have a greater length relative to second surface 432B (e.g., FIG. 4G). Each of first surface 432A and second surface 432B can include corresponding tab portions that can be bent over as noted above. In the context of the present disclosure, first surface 432A can be considered the portion of seam clip 432 that is in contact with the mounting surface while second surface 432B can be considered the portion of seam clip extending upward and perpendicularly away from the mounting surface. Thus, if seam clip 432 is reoriented for a particular installation, the base surface and wall surface of seam clip can be defined such that second surface 432B can have a greater length relative to first surface 432A. Accordingly, both first tab 432C and second tab 432D refer to bendable tabs at the end of second surface 432B, although both first surface 432A and second surface 432B have tabs at their ends. The particular tabs used will depend on the orientation of clip 432. As a result, instead of having two SKUs for two different sized seam clips 432, one SKU or seam clip 432 can be provided that can be mounted in two different configurations.

Figure 4H:
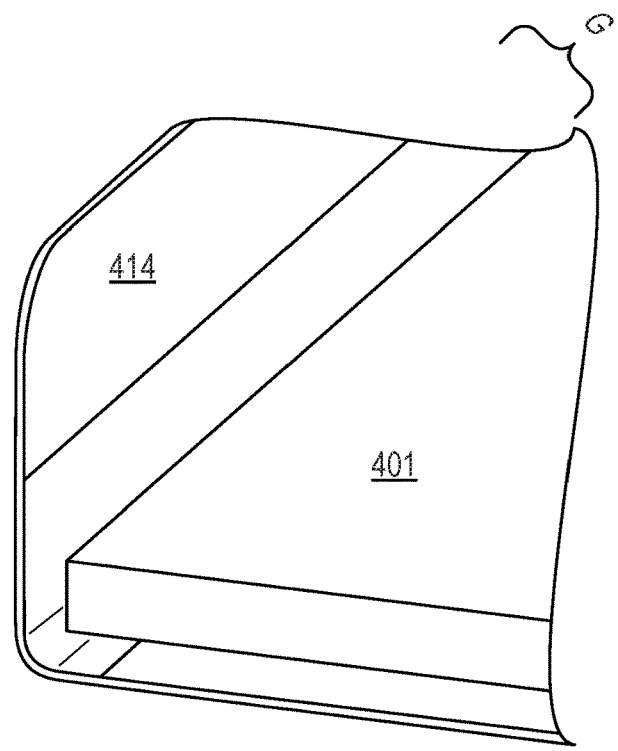
FIGS. 4H and 4I show spacing and a filling or wedge member between photovoltaic modules and proximate side walls, in accordance with aspects of this technology.
Figure 4I:
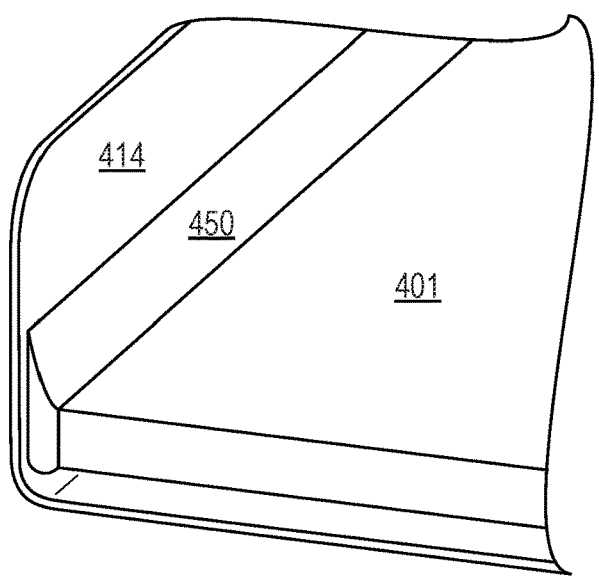
Figure 5:
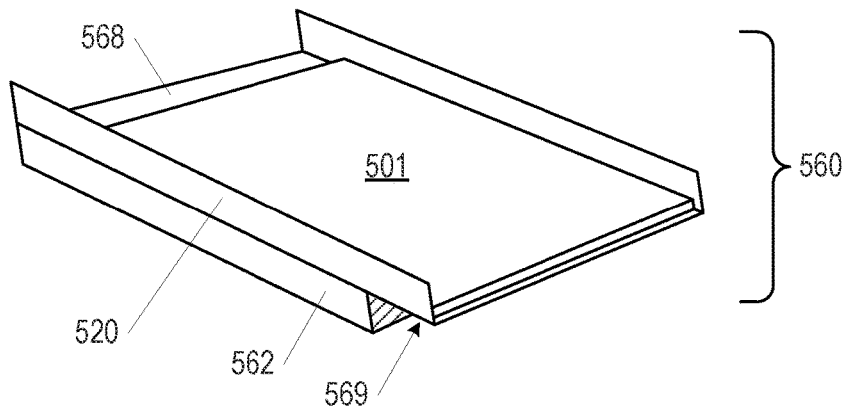
Figure 6:
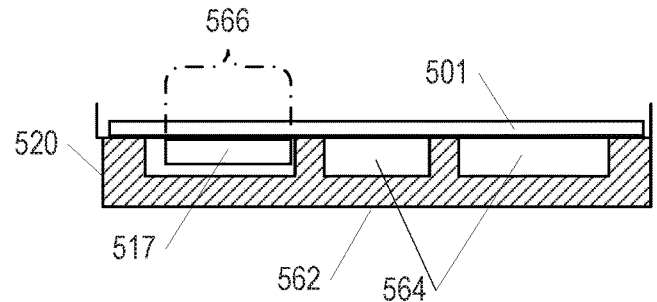

FIGS. 4H and 4I show gaps between opposing side edges of PV module 401 and standing seams, particularly PV pan seam 414 in an exemplary PV roof system according to various embodiments. As shown, in order to improve aesthetics (e.g., color matching) and to reduce debris (e.g., dirt, water, ice) from being lodged between PV modules 401 and standing seams, the gaps G between the two structures can be taped (with a colored tape) or painted accordingly. In some embodiments, sealant (e.g. a silicon-based sealant) can be used to fill the gap. In other embodiments, sealing member 450 (e.g., made of rubber or other suitable materials) can also be inserted and secured within gap G or seam. Sealing member 450 or tape or adhesive in the side gaps G can also improve adhesion or strength of the bond between PV module 401 and PV pan 420, as such elements add further locations where PV module 401 is bonded to PV pan 420 in addition to adhesive under PV module 401. In other embodiments, sealing member 450 can be positioned between PV module 401 and a rail physically connected to underside of PV module 401.

As discussed in greater detail herein, in other embodiments, vertical seams 414 may be attached to either side of PV modules 401 so as create an integrated pan and module, thereby eliminating the need for a separate PV module pan. In such cases, the PV module is actually part of the building envelope. This distinction is significant because in such embodiments, wiring may only reside under the PV modules and therefore, within the building envelope, triggering different code requirements related to wire management.

FIGS. 5-8 and 9A-9B are perspective views and schematic cross sectional or front views of a portion of BIPV system according to other various embodiments. In the embodiments shown in these figures, PV modules 501 and PV module pan 520 are integrated into a single structure, thereby simplifying the installation process. As shown, a bottom surface (e.g., backsheet) of PV module 501 is bonded (e.g., adhered, secured, coupled) to pan 520 (e.g., sheet metal). In such embodiments, pan 520 extends across the entire or substantially the entire bottom surface of PV module 501, forming PV module-pan assembly 560 (e.g., a bonded PV module and pan). Thus, PV module-pan assembly 560 forms a portion of a new roofing membrane (e.g., maintaining the area between the pan and module dry) above an existing roof or roof surface. Pan 520 includes standing seams that can be interlocked (e.g., with seam clips and a seam cover) to seams of adjacent pans as described above. In other embodiments, pan 520 can include inverted seams as noted above with respect to other embodiments.

In various embodiments, pan 520 is coupled to spacer or support 562 that is attached to the roof surface or other roof structure. In some embodiments, pan 520 can be coupled to PV module 501 prior to installation to a roof surface. Support 562 can be made of foam or other suitable materials (e.g., polystyrene, polyisocyanurate foam) and can elevate PV module 501 and pan 520, referred to in combination as PV module-pan assembly 560, above the existing roof surface (e.g., to provide channels for airflow or j-box(es) as described in more detail below). As described above, adjacent columns of non-PV roof pans can sit on battens or other spacers (e.g., insulation layers) to maintain a planar or uniform height of the plurality of pans and PV modules forming the building integrated PV system.

In certain embodiments, support 562 can include one or more channels 564 passing underneath and open to a bottom surface of pan 520. Channels 564 can provide space to accommodate junction box 517 attached to the bottom of PV module-pan assembly 560 as well as space for associated wires. Also, channels 564 can provide space for airflow underneath PV module-pan assembly 560. Further, openings 566 (e.g., a window, cut-out) can be formed in pans 560 to allow junction box 517 to extend down into one of channels 564 when PV module-pan assembly 560 is coupled to support 562. In certain embodiments, rows of channels 564 or other cut-outs (e.g., perforations) can be made through support 562 to allow wires to be run in a direction generally transverse (e.g., side to side) to a longitudinal axis of pan 560.

Figure 7:
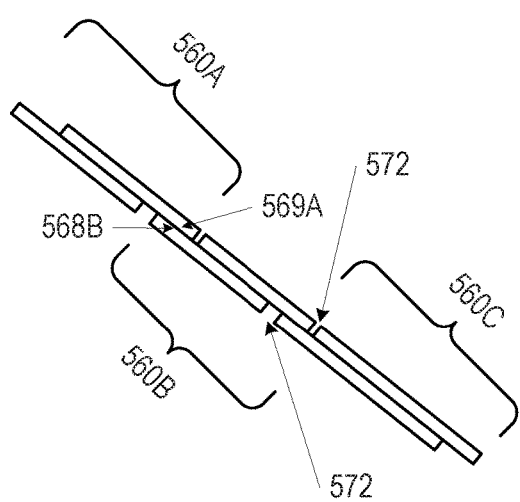

At one end, for example, first edge portion 568, of pan 520 may extend past PV module 501 to allow room for two successive assemblies 560 to overlap within a column. Thus, first edge portion 568 of a top surface of pan 520 can be exposed. Second edge portion 569 (e.g., an overhang, ledge) of PV module-pan assembly 560, on the opposing side of PV module-pan assembly 560 from first edge portion 568, can extend in an opposite direction from first edge portion 568 past a portion (e.g., top or bottom edge portion) of support 562 when PV module-pan assembly 560 is coupled to support 562. This arrangement can allow for a portion of first PV module-pan assembly 560A to lay or be positioned on a region of second PV module-pan assembly 560B within a column of PV module-pan assemblies. For example, as shown in FIG. 7, second edge portion 569A of first PV module-pan assembly 560A overlaps and sits on top of exposed portion 568B, a top surface of second PV module-pan assembly 560B. This will tend to direct rain water down the array rather than under the array.

In systems as shown with pan-to-pan contact (e.g., a bottom pan surface portion of first PV module-pan assembly 560A to a top pan surface portion of second PV module-pan assembly 560B), gap 572 can be present between PV modules 502 and/or supports 562 at these overlapped portions. In some embodiments, gap 572 extends between the bottom edge and top edge of first PV module-pan assembly 560A and second PV module-pan assembly 560B, or PV module 501 edges. In other embodiments, portions of PV module 501 edges of first PV module-pan assembly 560A and second PV module-pan assembly 560B can abut each other when installed. In yet further embodiments, gap 1972 can be filled or covered (e.g., reduced) with a sealant or with the use of edge trims or other sealing members (e.g., gaskets, edge protect, tape) as described above. The sealing members can be made of rubber or other suitable materials.

Additionally, in some embodiments, a sealant or other adhesive (e.g., butyl) can be used to bond overlapping pan portions of first PV module-pan assembly 560A and second PV module-pan assembly 560B. Second PV module-pan assembly 560B and third PV pan-module assembly 560C can be overlapped in a similar manner as first PV module-pan assembly 560A and second PV module-pan assembly 560B. Additional PV module pan assemblies can be added as desired. In certain embodiments, grooves (e.g., channels, indents, recesses, ridges) can be formed in first edge portions 568 and second edge portions 569 that contact and can couple with each other when overlapped. Such grooves can help reduce or prevent capillary action of moisture or water between pans, for example, in an up-roof direction. In some embodiments butyl caulk or sealant can be included between the overlapped sections.

Figure 8:
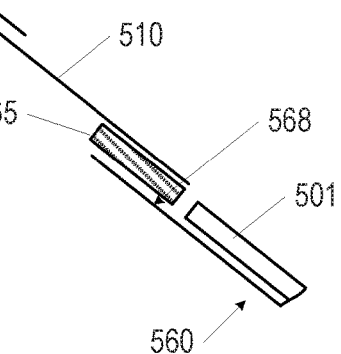

Non-PV roof pans can be used as dummy modules or transition pans for areas where no PV modules are desired or needed, and/or at the transition to an eave or a ridge. Non-PV roof pans 510 can be installed on exposed edge portion of pan 520 of PV module-pan assembly 560. For example, as shown in FIG. 8 showing a side view of an up-roof portion of a building PV integrated system, lower edge portion of non-PV pan 510 is positioned on exposed first edge portion 568 of PV module-pan assembly 560. Spacer 565 (e.g., filler, offset, support, batten, pad) can be positioned between exposed first edge portion 568 and lower edge portion of non-PV roof pan 510 to elevate non-PV roof pan 510 to a uniform or substantially uniform height as PV module 501. In certain embodiments, an opposing edge portion of non-PV roof pan 510 can extend under flashing 567 or a ridge cap depending on where the assembly with respect to features of the roof.

Figure 9A:
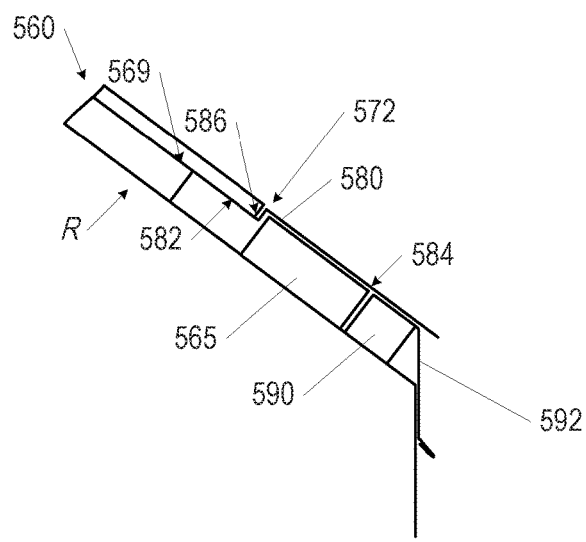

FIG. 9A shows a down-roof portion of a BIPV system according to various embodiments. In the system shown in this figure, Z-shaped (non-PV) pan 580 can be positioned at a bottom edge of PV module-pan assembly 560 such that first leg 582 of Z-shaped pan 580 extends in an up-roof direction underneath overhang or ledge portion 569 of PV module-pan assembly 560. Second leg 584 of Z-shaped pan 580 extends in a down-roof direction towards eave or gutter of roof R. Second leg 584 is positioned on spacer 565 to elevate Z-shaped (non-PV) pan 580 to a uniform or substantially uniform height as PV module-pan assembly 560. Middle body portion 586 (e.g., wall portion) extends between or couples the two leg portions, first leg 582 and second leg portion 584. Middle body portion 586 extends in a direction generally transverse or perpendicular to roof surface R when mounted to either PV module-pan assembly 560 or spacer 565. Middle body portion 576 can fit within gap 572 between pan structures, and can prevent PV module-pan assembly 560 from sliding down-roof (e.g., provides a stopping surface).

Figure 9B:
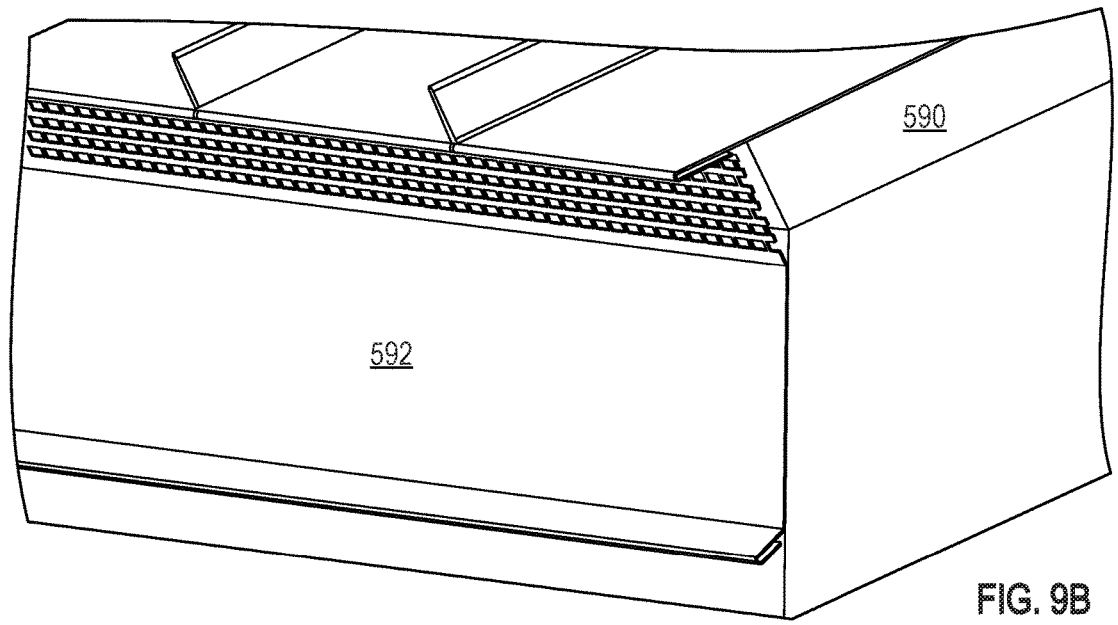
FIG. 9B shows a close-up view of roof eave portion of a roof including a louvered vent portion configured in accordance with embodiments of this technology.
Figure 10B:
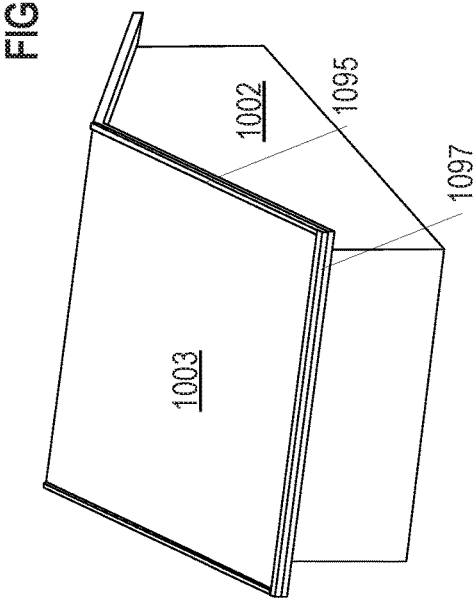
FIGS. 10A-10H show an example of a building integrated photovoltaic ("BIPV") system installation on a building including one or more features or components (e.g., roofing components, transition pans, PV module assemblies, roof pans, underlayment layers), in whole or in part, according to various embodiments of this technology.
Figure 10D:
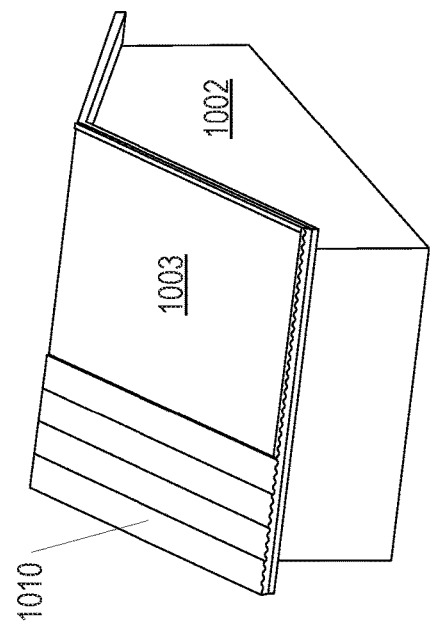
Figure 10A:
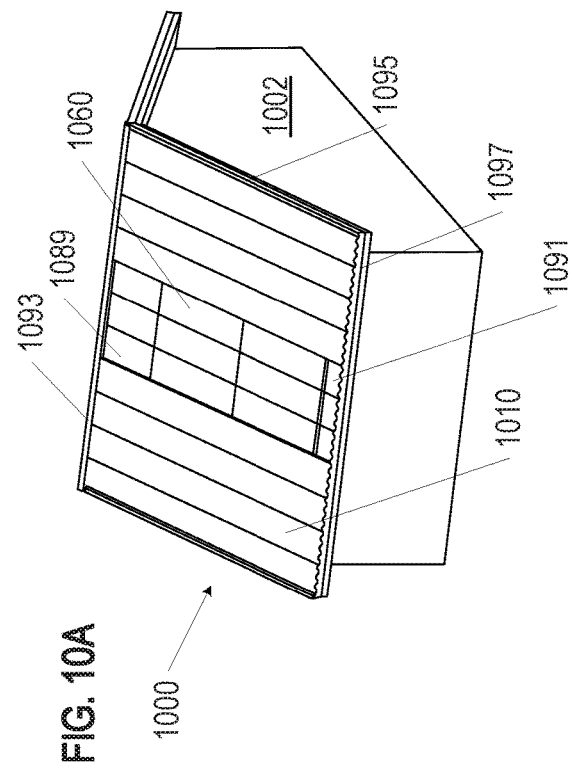
Figure 10C:
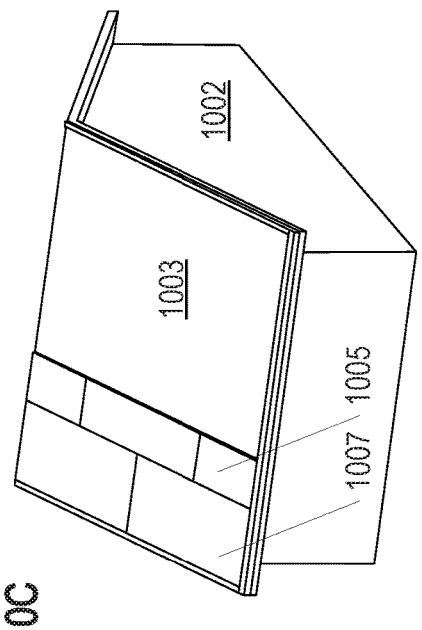
Figure 10E:
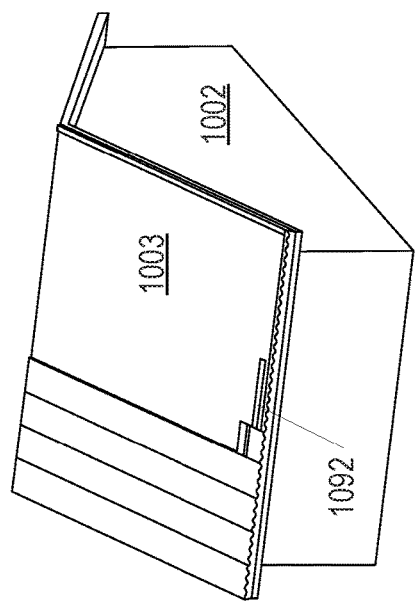
Figure 10F:
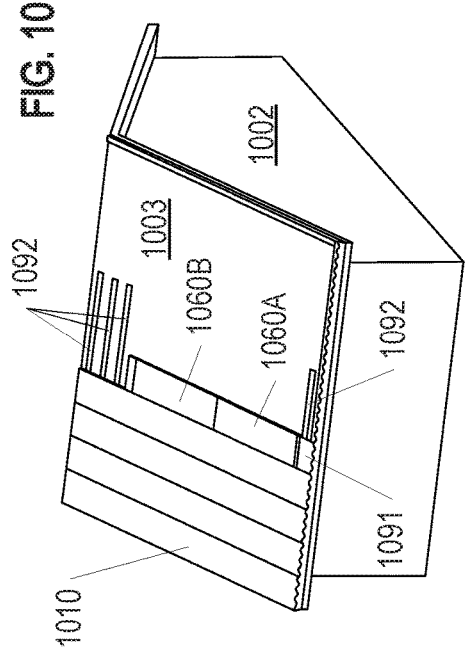
Figure 10G:
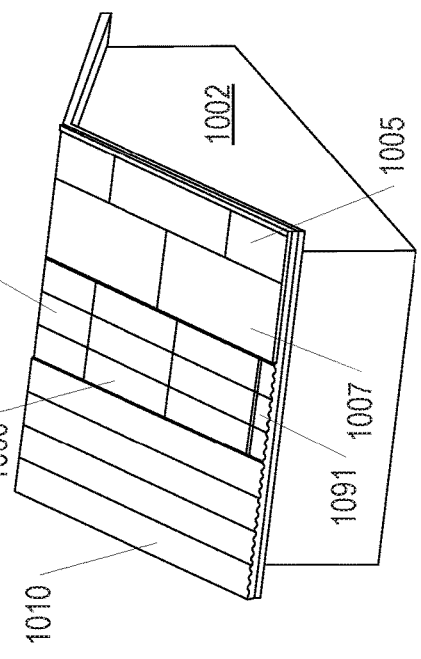
Figure 10H:
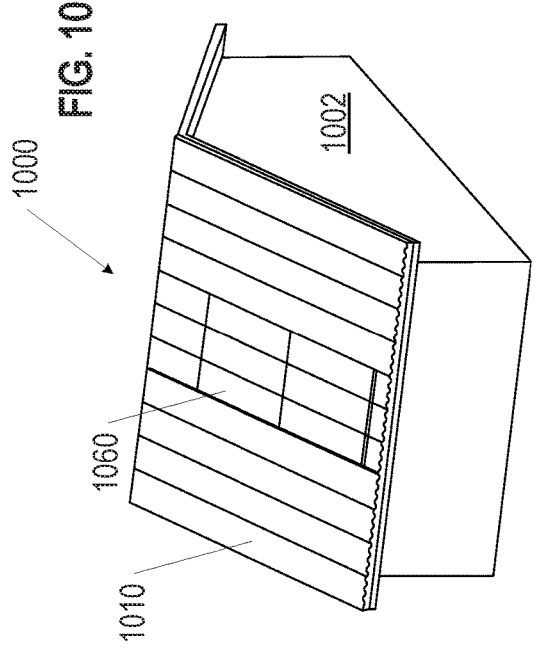

In various embodiments, a vent such as vent 590 (e.g., louvered vent, coravent, vented batten) is provided in front of spacer 565 at eave portion of roof R to allow air to flow through space 565 and underneath PV module pan assemblies 560. FIG. 9B shows in more detail a portion of an eave portion including perforated or caged vent cover 592 usable with various embodiments described herein. Air can flow or enter through such vent cover 592 and vent 590 and flow under PV module pan assemblies or between PV modules and pans of PV module pan assemblies.

Assembly of Building Integrated Photovoltaic Systems

FIGS. 10A-10H show an exemplary installation of BIPV system 1000 on building 1002 (e.g., roof surface of a home) including one or more features or components (e.g., roofing components, transition pans, PV module assemblies, roof pans, underlayment layers), in whole or in part, according to various embodiments of the present technology. BIPV system 1000 includes columns of roof pans 1010 and PV module-pan assemblies 1060 secured together via one or more standing seams (each PV module-pan assembly 1060 being a coupled structure of PV module 1001 and PV pan 1020). The columns of PV module-pan assemblies 1060 can further include down-roof transition pans 1091 and up-roof transition pans 1089 at eave and ridge portions, respectively, of roof surface 1003. BIPV system 1000 can be positioned or mounted on roof surface 1003, either directly to the wooden roof deck or over an existing layer of composition shingles. Intermediate layers of insulation (e.g., isoboard), batten, moisture, and fire protection layers can be laid upon roof surface at least in part below BIPV system 1000. The roof and/or roof surface 1003 of building 1001 can include various components including ridge cap 1093, edge trims 1095, flashing 1097 (e.g., rake, eave, ridge), vents, and gutters.

FIGS. 10B-10H are a series of figures showing an exemplary installation sequence of BIPV system 1000 and other various roofing components according to various embodiments. In some aspects, eave flashing 1097 can be installed onto existing roof surface 1003, which can be composition shingle roof or roof deck. Next, side edging or trimming 1095 can be applied to sides of roof surface 1003.

Layers or rows (e.g., battens) of insulation 1005 (e.g., foam, polyisocyanurate foam) can be installed on portions of roof surface where columns of roof pan (e.g., metal pans) are to be positioned. As noted above, one or more underlayment or other intermediate layers 1007 can be positioned between deck and insulation or insulation and roof pans. Then roof pans 1010 can be laid on top of insulation layer 1005 and/or intermediate layer 1007 and secured with staples, nails, screws or other suitable fasteners. Next, one or more rows of vented battens 1092 (e.g., metal, foam, polyisocyanurate foam) are secured to roof surface at down-roof and up-roof end portions (e.g., by the eave and ridge, respectively) in areas of roof surface 1003 configured to include PV module-pan assemblies 1060.

Down-roof transition pan 1091 can be installed on portion of vented batten 1092 adjacent side of previously installed roof pans 1010. PV module-pan assemblies 1060 are installed, with first PV module-pan assembly 1060A lapped onto a rear or up-roof portion of down-roof transition pan 1091. Second PV module-pan assembly 1060B is lapped onto the rear or up-roof portion of first PV module-pan assembly 1060A. Next, up-roof transition pan 1089 is positioned onto and lapped onto rear or up-roof portion of second PV module-pan assembly 1060B. As shown, two or more (e.g., additional) columns of transition pans 1089, 1091 and PV module-pan assemblies 1060 are similarly installed forming PV array of three columns and two rows of PV modules. In other embodiments, different configurations of PV modules can be included as desired.

Finally, a further layer of insulation 1005 and optional intermediate layers 1007 is installed on second side of the array formed by PV module-pan assemblies 1060, and corresponding columns of non-PV roof pans 1010 are positioned and mounted thereon as on other side of roof surface 1003. Flashing 1097 (e.g. rake flashing) can be installed onto sides of the roof surface (e.g., on the side edging or trimming). Finally, ridge cap 1093 can be installed over ridge. In certain embodiments, a ridge vent can be provided or installed within ridge cap 1093 as described in more detail below.

Supplementary PV Array Hardware

Various aspects of the present disclosure further describe components of structures that can aid in the installation and operation of BIPV systems, including but not limited to, grounding clips and wiring tunnels. In particular, in some embodiments as described in more detail below, one or more grounding members or clips for the PV modules can be positioned under seam covers in contact with a plurality of the seams. In some embodiments, cables or conduits can run along the seams under cover. In other embodiments, cables or conduits can be run along the outer surface of cover and a second cover can be positioned over a first seam cover to conceal cables.

FIGS. 11A-11H show various views of grounding clips 1100 configured in accordance with certain embodiments described herein. In various embodiments, grounding clips 1100 may be used in addition to mounting clips 432. Grounding clip 1100 can be made of stainless steel or other suitable metals or materials. In some embodiments, grounding clip 1100 can be manufactured from a sheet metal stamping process. In application, grounding clips 1100 can provide for structural stability and support to non-PV pans, PV pans, and other standing seam elements on a PV array system. Grounding clips 1100 can also electrically ground such structural elements such that accumulated charge, voltage, or static electricity is drawn away from and does not affect PV modules 1122 supported in the PV array system. In other words, grounding clips can electrically isolate standing seams of structural support pans, as well as rails of PV modules, from electrically conductive and solar energy collecting PV modules.

In various embodiments, grounding clip 1100 includes one or more teeth (e.g., projections, tabs, protrusions, 1104, 1108, 1110) configured to cut or "bite" into standing seam portions 1120 of adjacent, lapped, or overlapped pans (e.g., scrape through a paint coating of the pans or pierce or engage into the pans). Grounding clips 1100 can thereby bond support pans, including both PV module pans and non-PV pans (e.g., roof pans, dummy modules, transition pans,) together. Grounding clip 1100 can bond two panels lapped or positioned side to side as shown in FIG. 11F. As shown in FIG. 11G, grounding clip 1100 can also couple and electrically ground four PV pans 1122 where their standing seams 1120 overlap. In various embodiments, the seam cap may fit over bonding clip 1100.

In some embodiments, particularly shown in FIGS. 11A and 11B, grounding clip 1100 includes body portion 1102 adapted to be inserted between standing seams 1120 of at least two lapped, adjacent, or side-by-side panels 1122 or pans. As shown, inner teeth 1104 extending from opposing side portions of body portion 1102 are configured to engage inner surfaces of lapped standing seams 1120 adjacent to and facing each other. Further, grounding clip 1100 can include hemmed, bent, or curved tab portions 1106 that extend around or over top or upper portions of standing seams 1120 or similar structures. Bent or curved tab portions 1106 can include pair of outer teeth 1108 for engaging outer surfaces of corresponding lapped standing seam 1120 portions adjacent to and facing laterally opposite directions.

Grounding clips 1100 can electrically ground pans 1120 together when installed, directing electrical charge (e.g. static electricity not necessarily generated by PV modules 1122) away from the PV array system to ground. As shown in FIG. 11D, outer teeth 1108 can engage lapped standing seam 1120 portions of two pans, thus grounding two pans together when installed. Similarly, inner teeth 1104 engage paired standing seams 1120 of two pans, with body portion 1102 in between standing seams 1120. Grounding clip 1100 can be configured or sized such that a seam cap can be installed over grounding clip 1100. FIGS. 11E and 11F show an installation of grounding clip 1100 for grounding four lapped standing seams 1120 together, with FIG. 11F showing the positioning of grounding clip over four standing seams 1120 of pans holding PV modules 1122, and with FIG. 11E showing the engagement of grounding clip between four standing seams 1120 after installation. As shown in FIG. 11E, outer teeth 1108 can engage lapped standing seam 1120 exterior face portions, while inner teeth 1104 engage paired standing seams 1120 interior face portions, of two pans, with body portion 1102 in between standing seams 1120.

In certain embodiments, particularly shown in FIGS. 11B, 11C and 11H, grounding clip 1100 includes body portion 1102, pair of inner teeth 1104 extending from opposing side portions of body portion 1102, and curved tab portions 1106, and can also include additional projections, referred to as secondary outer teeth 1110, as well as wings 1112 extending from the ends of curved tab portions 1106. Secondary outer teeth 1110 project laterally outward away from the body portion 1102 of grounding clip 1100. Secondary outer teeth 1110 can be configured to cut or "bite" into or engage seam cover or cap as described above, seam cover being positioned over coupled or interlocked standing seams 1120. Wings 1112 can provide for a further frictional interface or tension spring to secure grounding clip 1100 in place with standing seams 1120.

FIGS. 12A-12C show views of conduits, cables, or wires 1200 of PV system extending or running beside seam covers or caps 1204. Color matched trim piece or secondary cover 1202 can be secured or snap-locked to seam cover 1204 or cap to conceal conduits or wires 1200. In certain embodiments, wire clip 1206 can be secured beside seam cover or cap 1204 under secondary cover 1202 to further secure or hold PV conduits, cables, or wires 1200. Wires 1200 can electrically connect with electrical outlets or other such connections (not shown) of PV modules 1201 to interconnect solar panels together as a PV system. Secondary cover 1202, similar to seam covers or caps 1204, can be configured to connect either or both of non-PV pans and PV pans (along with PV modules, dummy modules, or roof pans, as appropriate) together with a generally uniform appearance.

Wiring Layouts

FIGS. 13A-13M show various examples of portions of wiring systems (e.g., wire management, wire solutions, electrical circuits, configurations, connections, routes, conduits, or pathways) for electrically coupling or connecting PV modules 1301 of PV module-pan assemblies 1360 (e.g., column to column, in a column, in East-West or North-South directions) as part of BIPV system 1300 according to various embodiments. As noted above, one or more channels or pathways can be tunneled or cut through portions of insulation or insulation layers to run PV wires. In various embodiments, micro-inverters, DC optimizers, or other module-level electronics can optionally be electrically connected to one or more of PV modules 1301 as part of overall array and BIPV system 1300.

Figure 13A:
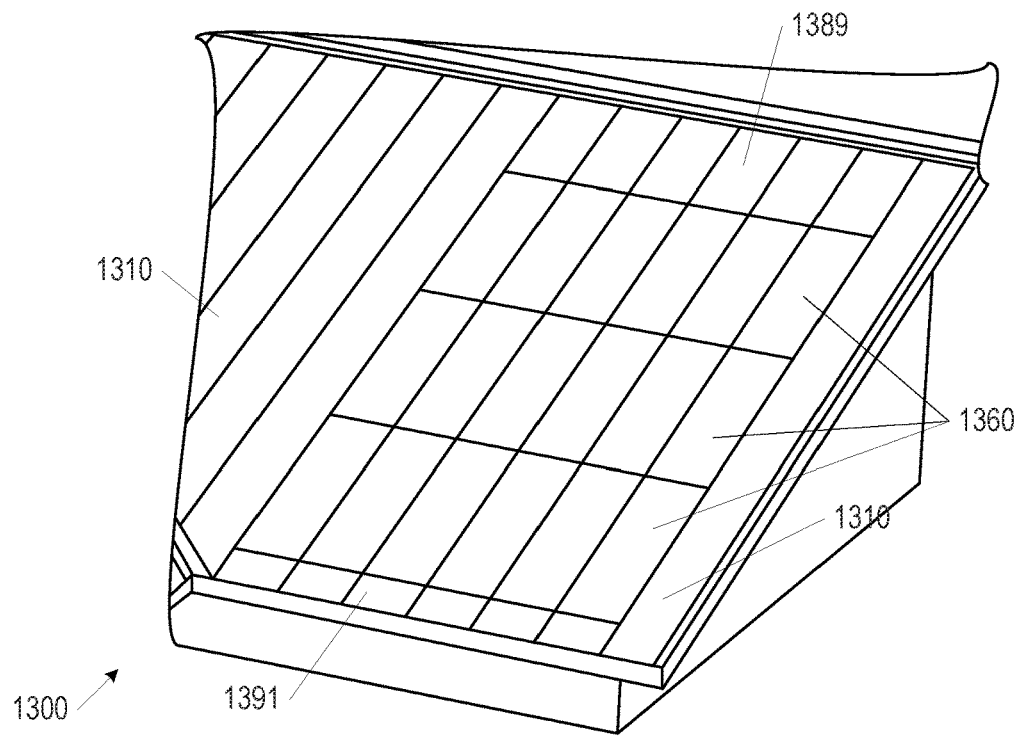
Figure 13B:
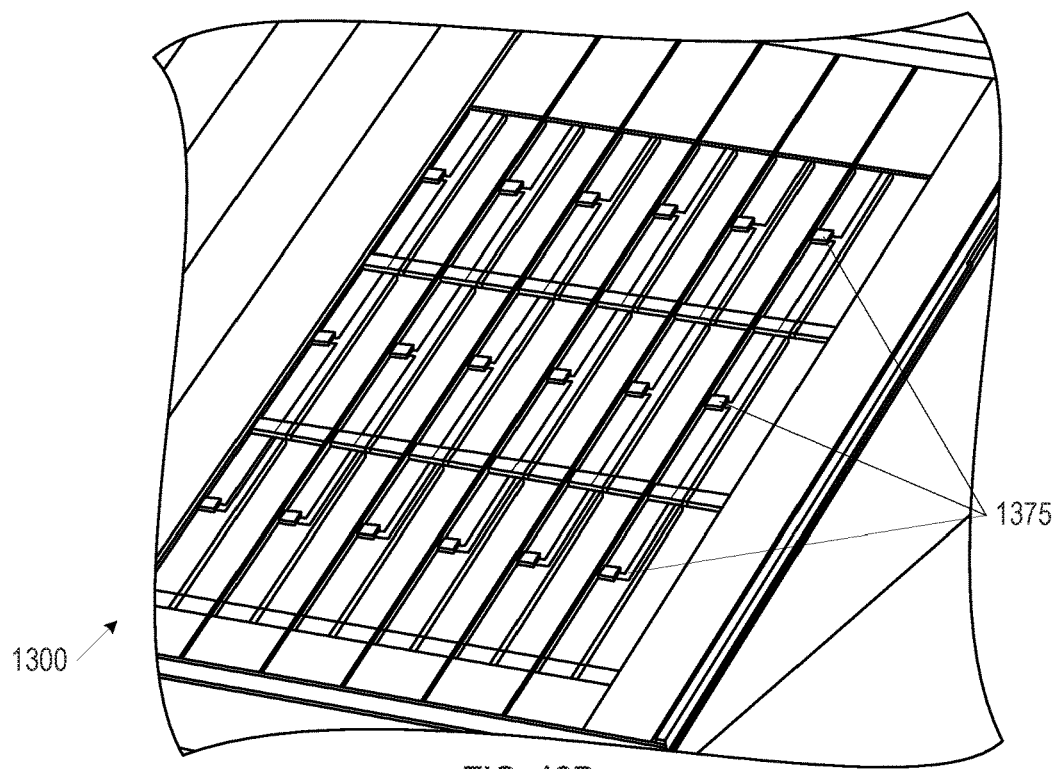

As shown in FIGS. 13A-13C, BIPV system 1300 can include columns and rows of PV module-pan assemblies 1360, upper transition pans 1389, (e.g., up-roof) and lower transition pans 1391 (e.g., down-roof), and non-PV or roof pans 1310. FIG. 13B shows a portion of BIPV system 1300 with PV modules removed for clarity, showing that columns of PV modules of a PV array can be serially connected by electrically connecting ("stringing up and down") the columns from one junction box 1375 to next junction box 1375. Respective columns can be connected by running wire under either or both of upper transition pans 1389 or lower transition pans 1391, or under lapped portions of PV module-pan assemblies 1360.

Various wiring arrangements are possible for any given array in BIPV system 1300. FIG. 13C shows an example of column-to-column stringing within BIPV system 1300 array (e.g., under lapped portions of PV module pan assemblies 1360A and 1360B). FIG. 13D shows column-to-column stringing at top of array (e.g., under up-roof transition pans 1389, here semi-transparent, above array columns). Further, the transition from conduit 1340 to exit the array can be routed through channel 1342 formed in insulation layer under the adjacent column of non-PV pan as shown in FIGS. 13D-13E. Conduit 1340 can then exit out through rake 1344 of roof. In other embodiments, conduit 1340 can be run vertically through to the roof eave and exit through slot or opening 1380 in eave as shown in FIGS. 13F-13G. In certain embodiments, two or more arrays on opposing sides of roof ridge can be connected by having conduit transition at ridge of roof that wires from each of arrays run to as shown in FIG. 13H.

FIG. 13I shows a wiring schematic for exemplary array 1300 in FIG. 13B. In this schematic, junction boxes are strung together along the length of each column and at North-South ends of the array, optionally connected beneath transition pans. FIG. 13J shows an exemplary wiring schematic of array 1300 of PV modules with single junction boxes, stringing all PV modules of array 1300 in series. FIGS. 13K-13M show exemplary wiring schematics for stringing or connecting PV modules having two separate junction boxes (V+ and V−). PV modules of these arrays can be "handed" or polarized as shown. FIG. 13K shows a schematic connecting positive and negative poles of PV modules with alternating short and long electrical connections. FIG. 13L shows connecting positive and negative poles of PV modules with short electrical connections laterally and longitudinally for poles that are relatively proximate to each other in array 1300. FIG. 13M shows connecting positive and negative poles of PV modules with a diagonal electrical connections within each row and short connections between rows of array 1300 to connect all PV modules in series. Thus, junction boxes can be positioned accordingly such that internal PV wires run to positive and negative junction boxes at terminal ends of each. Such arrangement of junction boxes can reduce internal and external resistance and the amount of copper wiring or bussing required for each PV module and for connecting PV modules in array 1300. Accordingly, such arrangement can also lower manufacturing cost, installation costs, or improve efficiency. All of the wiring schematics considered may further include a home run to connect array 1300 to a respective electrical grid (e.g., the customer's main electric panel).

FIGS. 14A-14D show other wiring solutions or pathways that can incorporate structural accommodations in support pans as part of PV pan-module assemblies 1460. For example, holes or other openings 1400 can be made in seams 1414 or other pan portions of PV module-pan assemblies 1460 such that wiring 1403 can be routed from column to column via such openings 1400. Grommet seals 1402

(shown here as exploded from opening 1400) can be positioned into openings around wires to seal opening 1400 after routing.

Figure 14A:
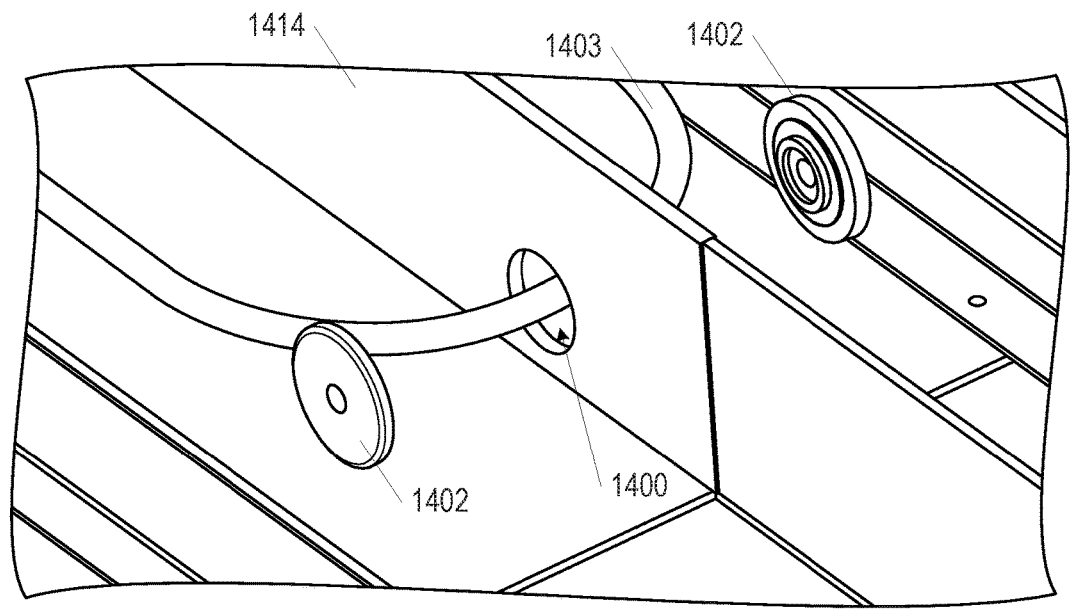
Figure 14B:
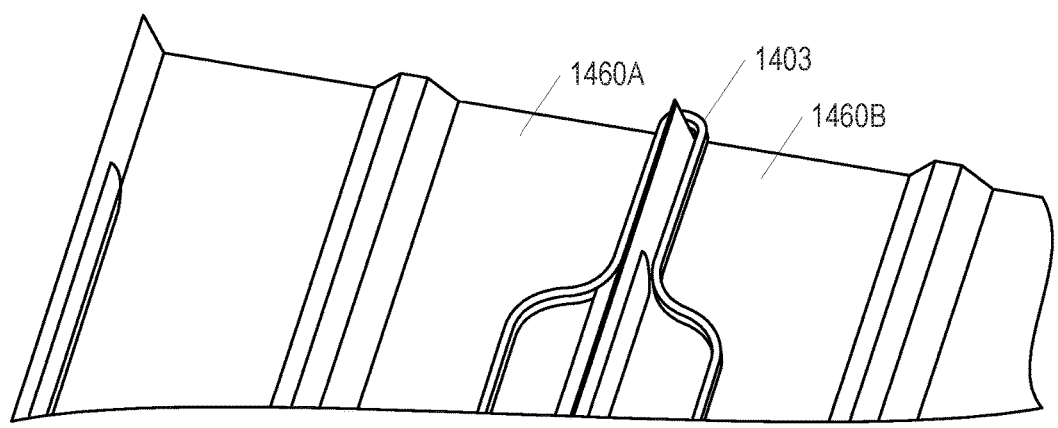
Figure 14C:
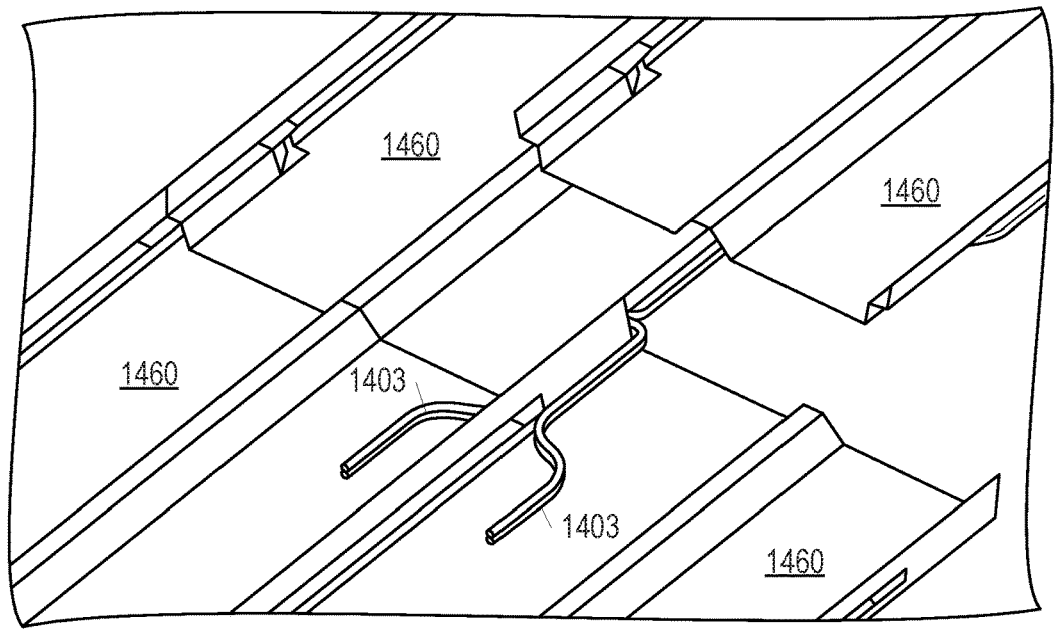
Figure 14D:
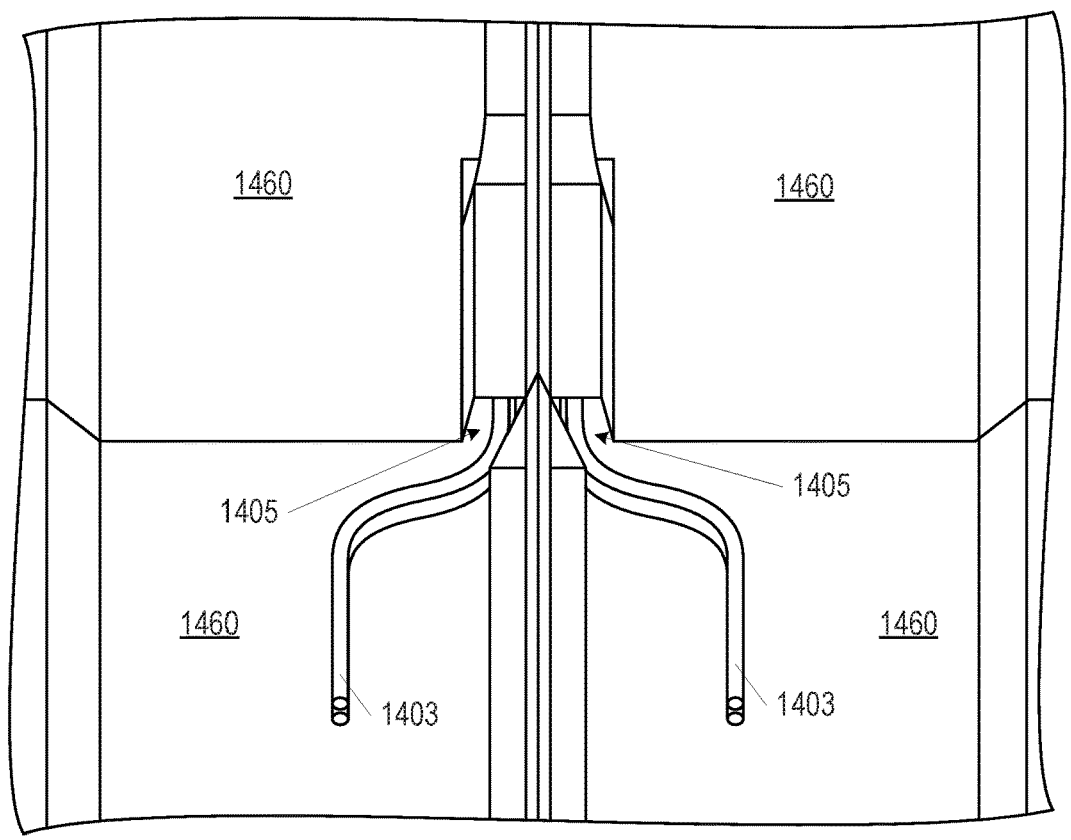

In some embodiments, particularly in configurations as seen above in FIGS. 3A-3C and 4A-4D, wires can be passed or routed column to column around end portions of overlapped portions of PV pans in column. For example, as shown in FIGS. 14B-14D, wires 1403 can be wrapped around up-roof seam end portions of two adjacent PV module pan assemblies 1460A, 1460B. As shown, wires 1403 can be understood to be located on the undersides of PV module pan assemblies 1460A, 1460B, or alternatively resting on PV pans of PV module-pan assemblies 1460 positioned to be between an upper surface of PV pans and a lower surface of PV modules connected thereto. Down-roof end portions of each PV module pan can include recessed portions 1405 (e.g., cavities, tunnels channels) that can be spaced over wires 1403 when lapping PV module-pan assemblies 1460 onto each other.

FIG. 14E shows an exploded view and FIG. 14F shows a perspective view of PV module-pan assembly 1460 according to various embodiments. Assembly 1460 includes exemplary PV pan 1420 that holds PV module 1401 (with PV module 1401 being transparent for this illustration). FIG. 14G shows a bottom perspective view of PV pan 1420. In these views, PV pan 1420 is seen with a gap in the lower surface, forming a workspace between the main trough portion of PV pan 1420 and support bar 1429. Moreover, PV pan 1420 does not have a central or middle rail or support leg, providing for more room for electronics or wire management. In the space between the main trough portion of PV pan 1420 and support bar 1429, multiple wiring routes can be laid allowing more room for cables, better air flow, a wide opening for symmetric or asymmetric wiring, and other conveniences in installation. Further, support bar 1429 can be used as a surface for nailing down or securing the edge of PV pan 1420, and the overall shape of PV pan 1420 can be easier to manufacture. PV module 1401 can be any solar cell laminate as considered herein to be a bonded or adhered (e.g. with a sealant bead) to PV pan 1420. In an array of PV pans 1420, wiring/cabling channels can be aligned with support bars 1429 facing each other across rows of PV module-pan assemblies 1460.

Phase Change Material Aspects

Figure 15A:
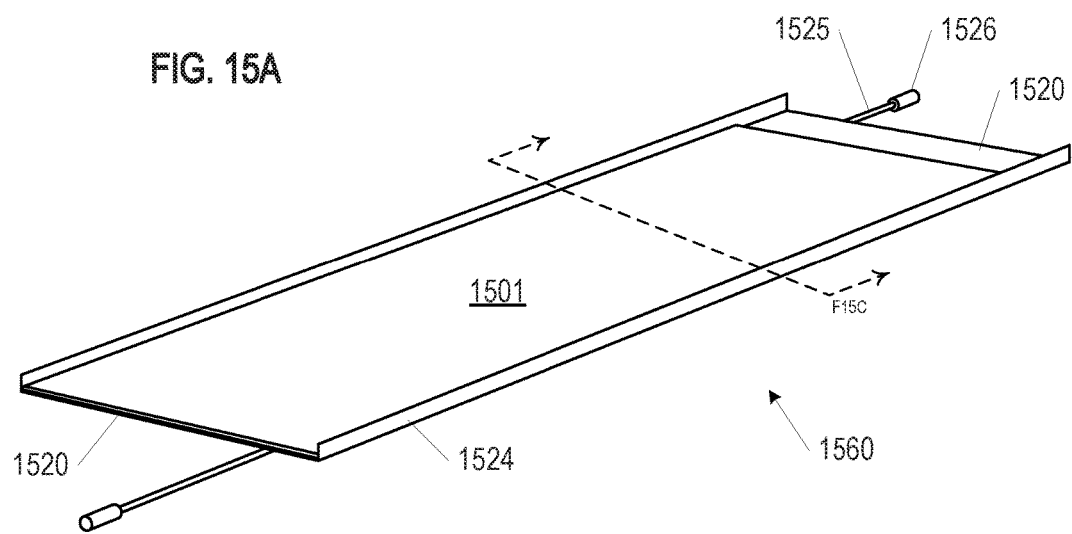
FIGS. 15A-15D show various views of a photovoltaic module pan assembly capable of supporting a heat transfer or phase change material usable with a building integrated photovoltaic system as described herein according to various embodiments of this technology.
Figure 15B:
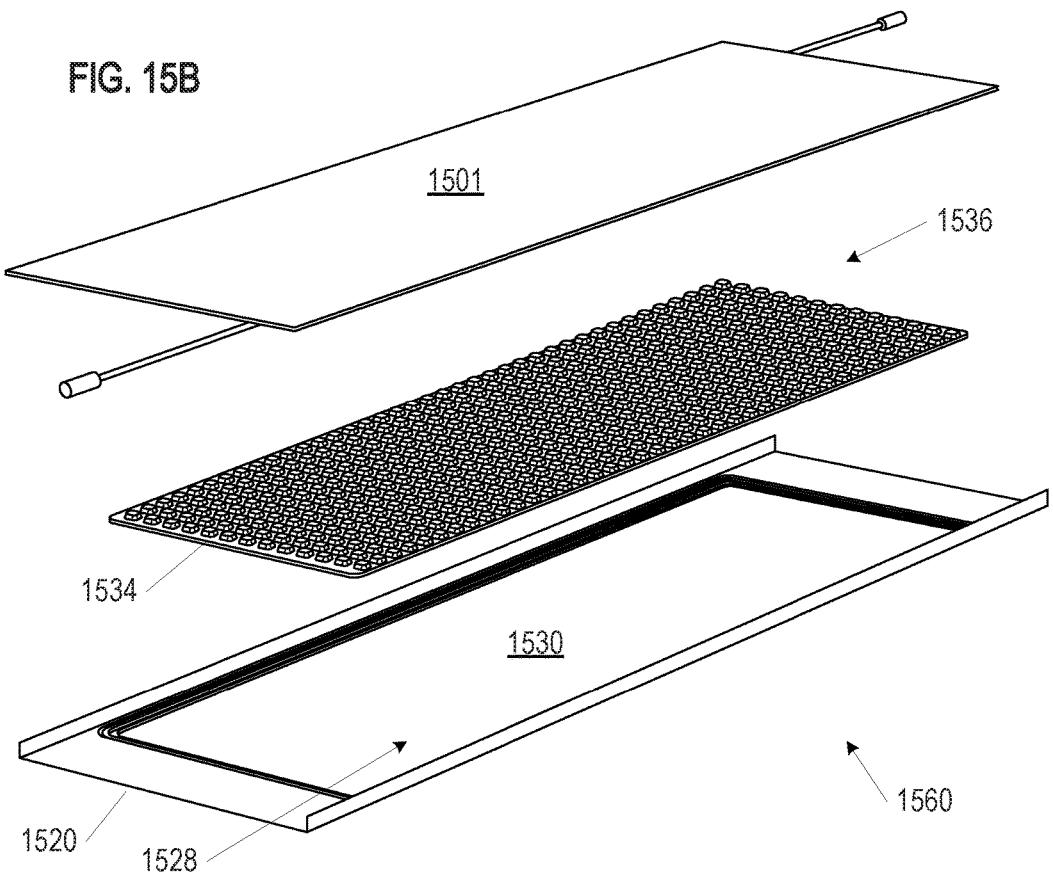

FIGS. 15A-15D are top perspective, exploded, section, and detail views, respectively, of PV module-pan assembly 1560 usable with building integrated PV systems (e.g., system 200) as described herein according to various embodiments. FIG. 15A shows a perspective view of completed PV module-pan assembly 1560 while FIG. 15B shows an exploded view of the same. PV module-pan assembly 1520 includes PV module 1501 bonded to pan 1520. Pan 1520 can include standing seams 1524 on opposing side portions for coupling pans 1520 with other pans (e.g., other PV pans, non-PV pans, roof pans, etc.) as noted above. Standing seams 1524 can be monolithically or separately attached/formed components. Standing seams 1524 can extend perpendicular to planar surface portions of pan 1520, extend at a non-perpendicular angle, and/or be hemmed to round edges. For example, standing seams 1524 can be hemmed inward or medially relative to opposing side portions of the pan. In other embodiments, pans 1520 can include inverted seams.

Referring to FIGS. 15A-15D together, pan 1520 includes first substantially planar surface 1532 (e.g., upper or top surface portion) on which PV module 1501 is mounted. First substantially planar surface 1532 includes opposing substantially planar shoulder portions 1546 that PV module 1501 is positioned or configured to be positioned on. Further, pan 1520 can be bonded to first substantially planar surface 1532 via adhesive 1544 (e.g., strip(s), patch(es), pad(s)) as noted above. Pan 1520 can include recessed portion 1528 (e.g., cavity, lower portion), where recessed portion 1528 includes second substantially planar surface portion 1530 (e.g., lower or bottom surface portion) positioned below or under first substantially planar surface 1532. First substantially planar surface 1532 and second substantively planar surface 1530 can be spaced apart by sidewall portions. While shown as being substantially planar, either of first substantially planar surface 1532 and second substantively planar surface 1530 can also include projections, bumps, or other non-planar features. Further, in some embodiments, pan 1520 does not include second substantively planar surface 1530 portion, such that pan 1520 (and by extension, at least a portion of underside of mounted PV module 1501) can be open to the roof or roof surface on which pan 1520 is mounted.

PV module 1501 can be bonded or otherwise secured to pan 1520 using known techniques. For example, PV module 1501 can be bonded with adhesive 1544 such that a water-tight or substantially water-tight seal is provided between PV module 1501 and pan 1520. In certain embodiments, strips or pads of VHB tape or other suitable material of a desired height can be applied to pan 1520 to set a desired height of PV module 1501. Adhesive or sealant 1544 can then be applied, and PV module 1501 can be set on top of the adhesive and VHB tape to bond PV module 1501 to pan 1520 at the desired height.

PV module-pan assembly 1560 can include one or more active or passive cooling or heat transfer features. In certain embodiments, the PV system includes one or more fans configured to provide airflow underneath PV modules 1501. In other embodiments, PV module-pan assemblies 1560 can include one or more heat sink features (e.g., fins), thermo-electric devices (e.g., materials for cooling), and/or layer or sheet of heat storage materials 1534 (e.g., phase change materials), where in many aspects, heat storage materials 1534 have a relatively high heat capacity as compared to other components of a BIPV system.

PV module-pan assemblies 1560 can include one or more electrical components for electrically connecting PV modules 1501 to an overall PV system, and further, for example, to a household electrical system to provide power to the home. The electrical components can include, but are not limited to, wires 1525, junction boxes 1538, and connectors 1526 (e.g., MC4 connectors). Many of these electrical components are located or pass under PV module 1501. Conventional PV electrical components can be rated or certified for eighty-five degrees centigrade (85° C.). In certain areas, due to increased ambient temperatures and/or operation of BIPV systems, the area under PV modules 1501 may approach and or even exceed this temperature. Therefore, improved heat transfer features can reduce the operating temperature to a desired level and result in improved safety and efficiency of PV modules 1501 (e.g., electrical components).

One or more layers or sheets of heat storage material 1534 can be positioned within recess portion 1528 of pans 1520. Heat storage material 1534 can be, for example, a phase change material such as BioPCM™. Such phase change materials can absorb heat and thereby transition between or change phases (e.g., when reaching or exceeding a melting or freezing temperature or boiling point) from a first phase to a second phase (e.g., from solid to liquid, from liquid to gas, from solid to gas) without raising a temperature of the air around the phase change material during the phase change. For example, heat storage material 1534 can absorb heat from operating PV modules 1501, electrical components, and/or the ambient environment temperature. As heat storage material 1534 reaches a characteristic melting or sublimation temperature (e.g., melting peak) as a result of absorbing heat, it undergoes a phase change. When the temperature of heat storage material 1534 is lowered or passively drops past the phase change temperature, the reverse occurs (e.g. solidification, condensation, or deposition). Further, heat from heat storage material 1534 can be released when phase change material returns to the first phase, for example, when a heat source is removed or ambient temperature decreases.

In addition or alternatively, phase change materials can also be wrapped around the electrical components (e.g., wires, cables, connectors, etc.) in place of or in addition to a phase change material layer placed in a pan.

During a phase change, phase change material remains at a steady or near constant temperature as the phase change material transitions between phases until the phase change material completes or substantially completes the phase transition. During the phase change material phase transition, the temperature of the space or air around the phase change material does not substantially raise even as the temperature of the space or air around it continues to absorb heat. The choice of heat storage material 1534 for any given implementation can be optimized based on expected temperatures from ambient environment, electrical components, and/or PV modules 1501. As the temperature of PV modules 1501 or ambient environment is lowered or removed (e.g., when the sun sets, in the evening), phase change material can return or transition back from the second phase to the first phase (e.g., releasing heat into the ambient air or surroundings when ambient temperature and temperature under the PV modules is lower). By returning to the first phase prior to the next day, when the temperature is once again expected to exceed a desired temperature (e.g., of PV modules 1501 or electrical components), phase change material is ready to absorb heat again and undergo the process (phase change) in response to increased heat so the cycle can be repeated.

As an example, during operation certain BIPV systems can result in an increase of up to or about fifty degrees centigrade (50° C.) over ambient (e.g., in areas under PV modules 1501). In certain locations, temperatures can approach about fifty degrees centigrade (50° C.) ambient or above, which can lead to a temperature of about one hundred degrees centigrade (100° C.) under PV modules 1501. As noted above, certain electrical components are generally rated for about eighty-five degrees centigrade (85° C.). Therefore, in this example, temperatures above about thirty-five degrees centigrade (35° C.) ambient can result in potentially reaching or exceeding the temperature rating on certain electrical components (e.g., in an area under PV modules 1501) during certain times of the day.

Generally, phase change material can return to the first phase after transitioning to the second phase (e.g., re-freeze or become solid or liquid again). In order for the phase change material to return to the first phase from the second phase, the material may need to have a characteristic melting or freezing temperature (e.g., from liquid to solid) above an expected evening or night temperature (highest) in a location where BIPV system is installed. For example, if the melting or freezing temperature of the phase change material is below that of the highest expected evening or night temperature, the phase change material may not be able to re-freeze or return to the first phase when ambient temperature exceeds the freezing temperature.

In certain embodiments, it can be desirable to choose a phase change material having a melting or freezing temperature that is closer to a maximum operating temperature of PV modules 1501 and/or electrical components (e.g., about 85° C.) than that of the highest expected ambient evening or night temperature where BIPV system is installed. For example, if the phase change material undergoes a phase change at a temperature of about forty degrees centigrade (40° C.) in a location where the ambient evening temperature is about thirty-five degrees centigrade (35° C.), then the transition from the first phase to the second phase can occur earlier in the day than desired, and consequentially reduce the amount or time of heat protection, relative to choosing a phase change material with a temperature closer to the maximum operating temperature. In other examples, heat storage materials 1534 can have characteristic phase change temperatures (e.g., melting points) from about sixty degrees centigrade (60° C.) to about eighty degrees centigrade (80° C.), from about sixty degrees centigrade (60° C.) to about seventy-five degrees centigrade (75° C.), about sixty degrees centigrade (60° C.) to about seventy degrees centigrade (70° C.), or about sixty-five degrees centigrade (65° C.) to about seventy degrees centigrade (70° C.). Such embodiments of heat storage materials 1534 can provide improved or increased heat transfer. In certain embodiments, the phase change temperatures can be lower or higher depending on the ambient temperature or maximum operating temperatures.

Further, in certain embodiments, the phase change materials can decrease the change in temperature between peak and minimum temperatures (e.g. the delta between expected maximum and minimum temperatures) of PV modules 1501 and electrical components. This can reduce the amount of cycling or maintain a more steady temperature, which in turn can improve reliability of the PV modules and electrical components, as well as increase efficiency.

Figure 15C:
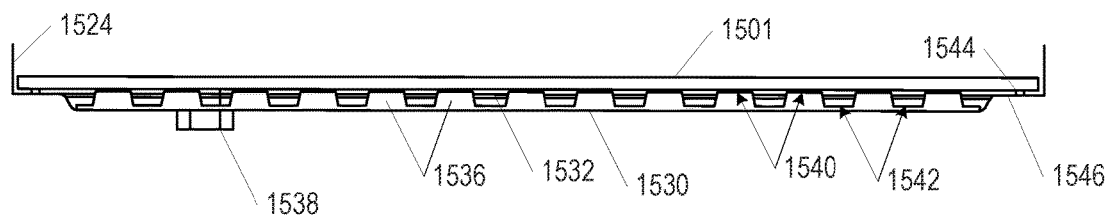
Figure 15D:
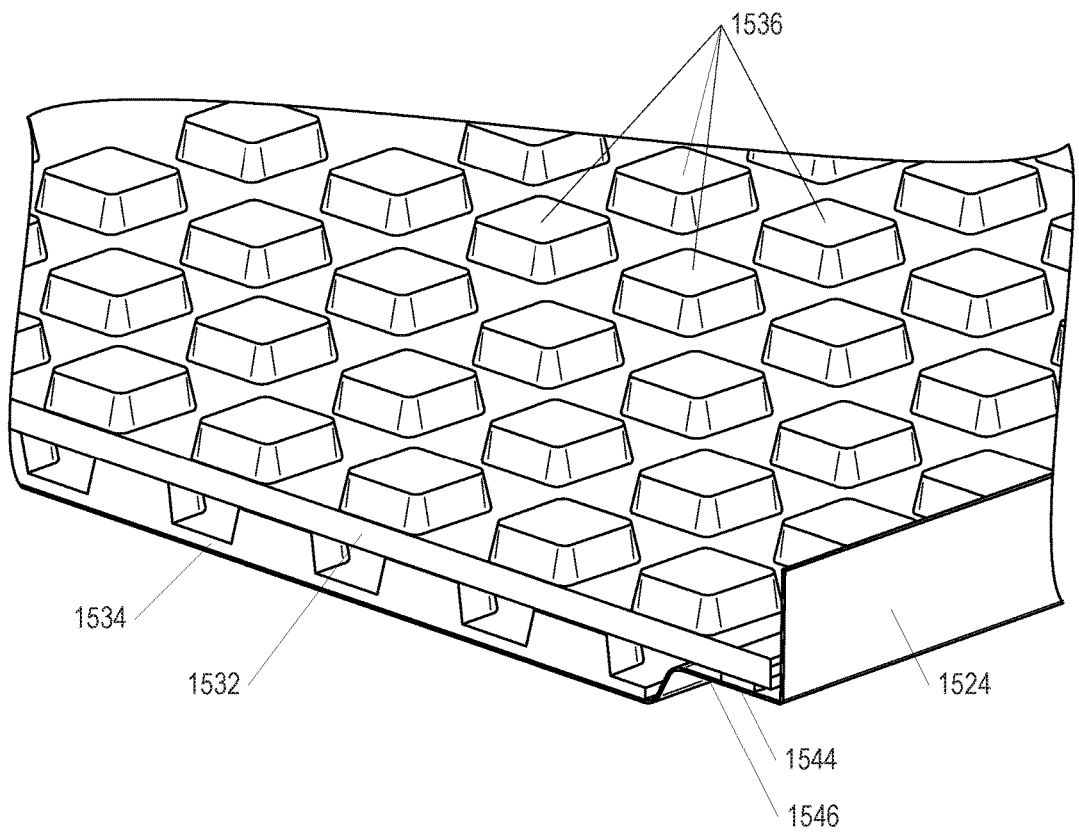

As shown in FIGS. 15B-15D, heat storage material 1534 (e.g., phase change material) can include pockets or pouches 1536 configured to hold the actual phase change material inside. Such pouches 1536 can hold phase change material such that when the material transitions, for example, from a solid to a liquid or liquid to a gas, the material remains contained within. Shown in FIG. 15C (a cross-sectional view taken along the line F15C in FIG. 15A), pouches 1536 can form series of peaks or ridges 1540 (e.g., bumps, projections) and valleys 1542. Such a structure can also provide channels through which air can flow under PV modules 1501 through heat storage material 1534 layer. Junction box 1538 can connect to PV modules 1501 through a hole or cutout region of heat storage material 1534.

In certain embodiments, shown in FIG. 15D, peaks of pouches 1536 can contact or further support PV modules 1501 above pan 1520 or roof surface. In other embodiments, a gap can be provided between underside of PV modules 1501 and layer of heat storage material 1534. In some embodiments, heat storage material 1534 layer can be inverted such that peaks 1536 are positioned against the second surface of pan 1520 or roof surface, and planar surface portion of heat storage material 1534 is oriented towards underside of PV module 1501.

Supplementary PV Array Variations

FIGS. 16A-16I are schematic diagrams showing wiring options for solar cell sections 1600 of a PV module accounting for shading caused by standing seams 1614. With standing seams 1614 extending upward above a substantively uniform plane of a PV module, at various times during the day, as the angle of incident sunlight changes (either or both of altitude and azimuth angles) standing seams 1614 can cast a shadow and shade a portion of solar cell sections 1600. The resulting power loss from a set of solar cell sections 1600 is proportional to the area under shade. Using conventional wiring techniques, when shading occurs even more power can be lost due to the shaded solar cell sections 1600 of a PV module limiting the overall current in the PV module, making the entire PV module less efficient. Accordingly, the manner in which solar cell sections 1600 can be set up to include bypass circuits such that solar cell sections 1600 which become shaded can be shunted or bypassed while under shade and not act as a power sink while shaded. These arrangements of solar cells are referred herein to as shade tolerant.

Figure 16A:
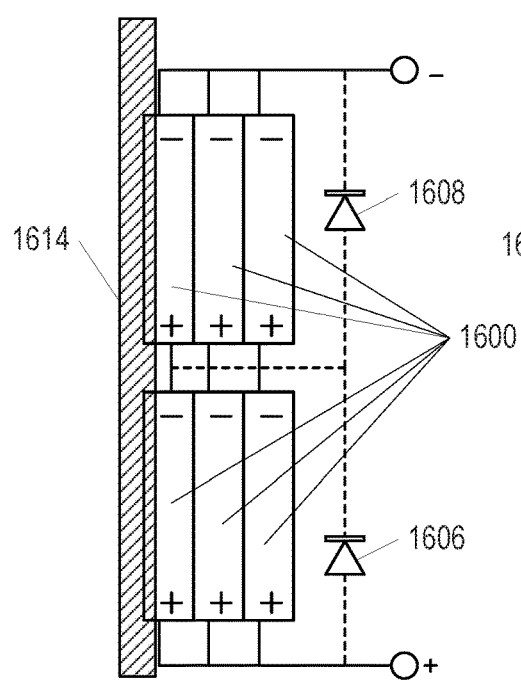

FIG. 16A shows a set of six solar cell sections 1600, in two sets of three wired in parallel and in series (referred to as a shingling arrangement), and with standing seam 1614 proximate to one side of the set of solar cell sections 1600. By orienting solar cell sections 1600 as shown, solar cell sections 1600 can be connected in series within one sub-string column and connected in parallel across adjacent sub-string columns. Solar cell sections 1600 closest to standing seam 1614 will tend to receive the most shading from standing seam 1614. When this occurs, first bypass diode 1606 and second bypass diode 1608 allow for bypassing of one or the other of the set of three solar cell sections, depending on which section is shaded. This arrangement can thereby limit loss of current to the shaded area only.

Figure 16B:
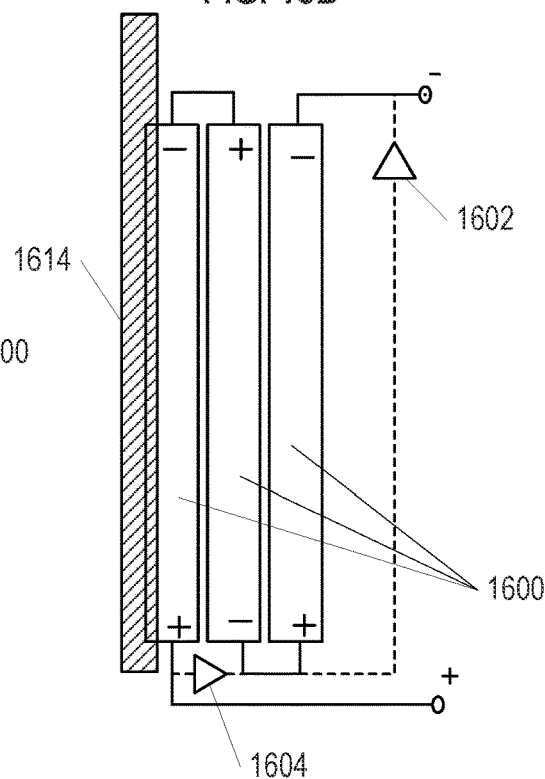

FIG. 16B shows a set of three solar cell sections 1600 wired in series, with panel diode 1602 in line with solar cell sections 1600 connecting to an electrical grid, and with standing seam 1614 proximate one side of the set of solar cell sections 1600. Solar cell section 1600 closest to standing seam 1614 will tend to receive the most of a shade pattern due to shadows cast by standing seam 1614. Bypass diode 1604 is positioned in-line between solar cell sections 1600 proximate to standing seam 1614, and can allow for the bypass of solar cell sections 1600 proximate to standing seam 1614 such that current loss is limited to one-third (⅓) of the power delivered by the overall module.

Figure 16C:
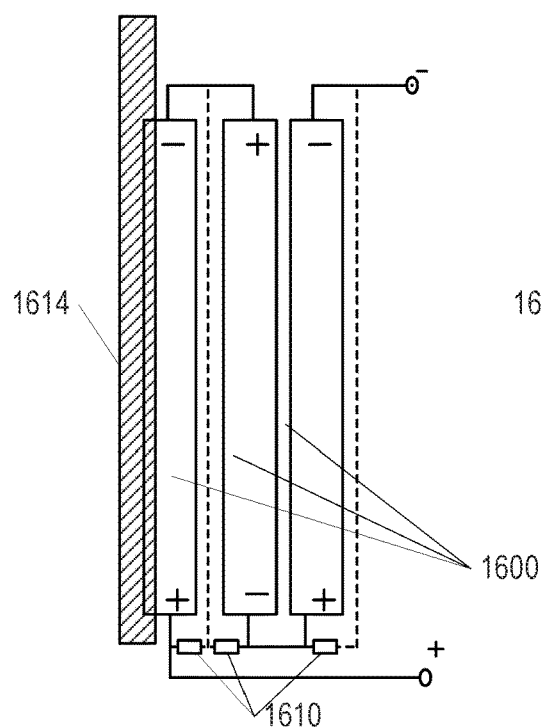
Figure 16D:
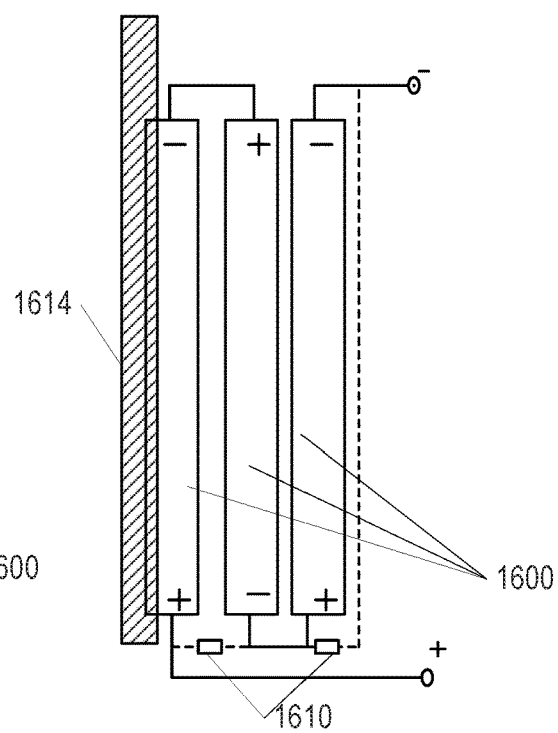

FIG. 16C and FIG. 16D show embodiments and arrangements applying cell string optimizers 1610 within the circuit of solar cell sections 1600. FIG. 16C shows an embodiment with one optimizer 1610 per solar cell sub-string and FIG. 16C shows an embodiment with one optimizer 1610 per every two solar cell sub-strings. Optimizers 1610 can be embedded within a solar panel module, either in a junction box or within the laminate. Optimizers 1610 help to limit the shading loss of shaded solar cell sections 1600 by maximizing performance of each sub-string with maximum power point tracking (MPPT). Optimizers 1610 can minimize or eliminate mismatch loss between sub-strings that are under a shade pattern and sub-strings that are not. In some aspects, a single optimizer can be used with a long solar cell sub-string (e.g. shown in FIG. 16B) or with a short solar cell sub-string (e.g. shown in FIG. 16A), depending on the operating voltage range of optimizer 1610.

FIGS. 16E, 16F, 16G, 16H, 16I, and 16J show various embodiments of solar cell section 1600 layouts that can mitigate loss due to shading, in situations where shade patterns on one or more sub-strings of solar cell sections 1600 turn on bypass diode(s) 1608. (Standing seams 1614 are not shown in these Figures for clarity.) FIG. 16E shows a three bypass diode 1608 configuration where solar cell sections 1600 (sub-strings) are connected to one junction box 1616 that is positioned close to an end of PV module. FIG. 16F shows a three bypass diode 1608 configuration where solar cell sections 1600 are connected to two junction boxes 1616 (where two diodes 1608 are directed toward one of junction boxes 1616) that are positioned at opposite ends of PV module respectively. FIG. 16G shows a three bypass diode 1608 configuration where solar cell sections 1600 are connected to one junction box 1616, all being positioned proximate to the middle of PV module. This arrangement can be more energy efficient than configurations with two sub-strings per diode installations.

FIG. 16H shows a two bypass diode 1608 configuration where solar cell sections 1600 (sub-strings) are connected to one junction box 1616 that is positioned close to an end of the PV module. FIG. 16I shows a two bypass diode 1608 configuration where solar cell sections 1600 are connected to two junction boxes 1616 positioned at respective opposite ends of the PV module. FIG. 16J shows a two bypass diode 1608 configuration where solar cell sections 1600 are connected to one junction box 1616, all being positioned proximate to the middle of PV module.

Figure 16K:
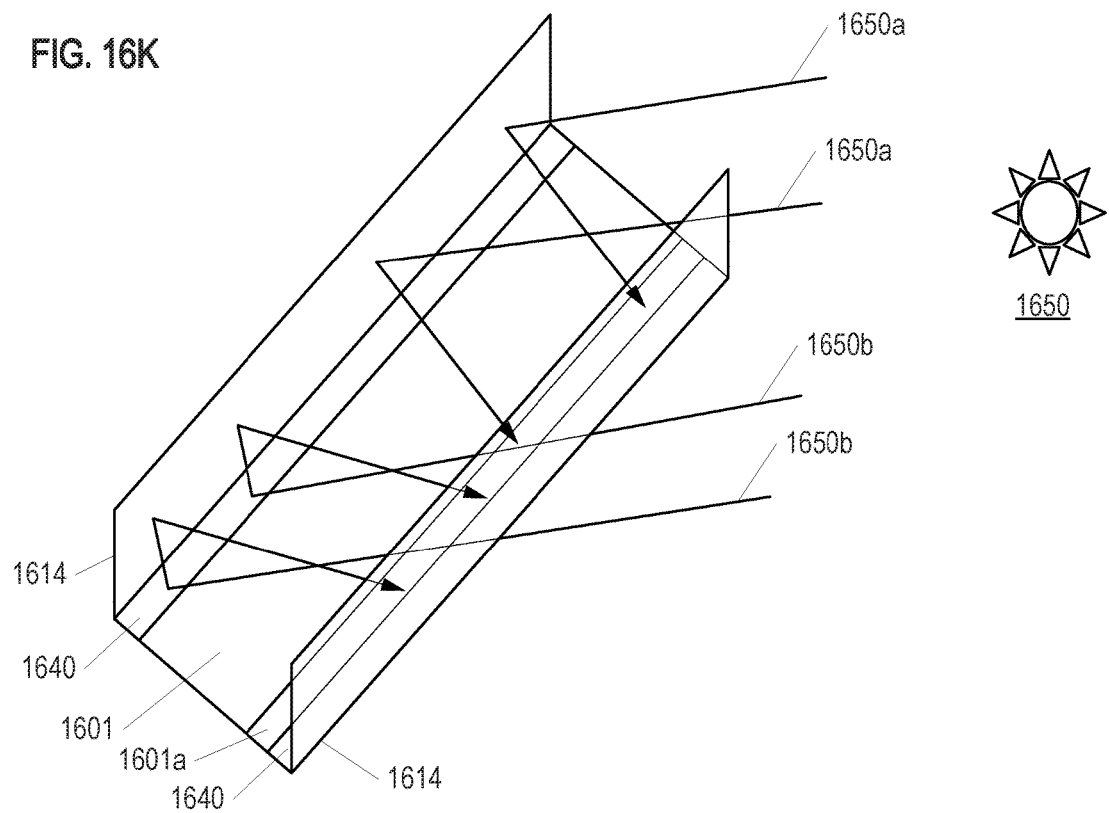
FIG. 16K shows incident solar energy on a photovoltaic panel and standing seam roof panel on the longitudinal sides thereof.

A further embodiment shown in FIG. 16K considers the use of laminated and reflective surfaces on standing seam 1614 in combination with optical texture film 1640 alongside both longitudinal edges of PV module 1601 surface. With sunrays 1650 at a given angle relative to surface of PV module 1601, shade region 1601*a* is created due to the relative height of standing seam 1614. As shown, the surface of standing seam 1614 can be reflective, due to either a light redirected film and/or texture of the seam, to redirect sun rays 1650*a*, 1650*b* to shaded region 1601*a* of PV module 1601. Specifically, rays 1650*a* can be directly incident on standing seam 1614 and then reflect or refract off of the surface of standing seam 1614 onto shade region 1601*a* of PV module 1601. Alternatively or additionally, rays 1650*b* can be directly incident on optical texture film 1640 and then reflect or redirect onto the surface of standing seam 1614, then further reflecting or refracting onto shaded region 1601*a* of PV module 1601.

Figure 17:
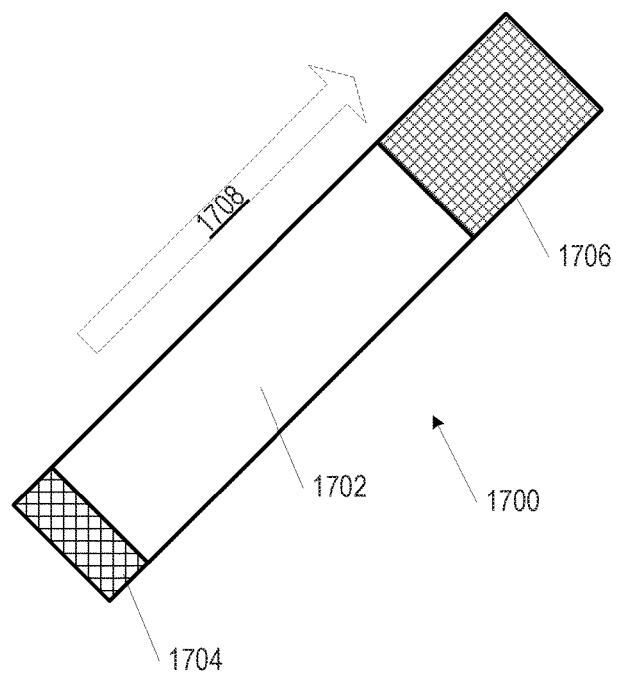
FIG. 17 shows an embodiment of a PV column of a solar panel array, where the PV column is configured to take advantage of convection and related heat transfer, in accordance with various embodiments of this technology.

FIG. 17 shows an embodiment of PV column 1700 of a solar panel array where the PV column is configured to take advantage of convection and related heat transfer. On any given roof or structure, one or more PV panels 1702 are positioned between lower transition pan 1704 and upper transition pan 1706. The surface of lower transition pan 1704 can be coated with a thin film or other material that has a high solar reflectance and a low thermal emittance, which can be referred to as a "cool coating" material. Solar energy incident on lower transition pan 1704 can convert to become about 50% heat reflecting from lower transition pan 1704, or in other words, absorbing about 50% of the heat from incident solar energy. PV panels 1702 have the primary function of converting incident solar energy into electricity, absorbing about 70% of the heat from incident solar energy. The surface of upper transition pan 1706 can be coated with a thin film or other material that has a low solar reflectance and a low thermal emittance, a selective coating similar to or the same as the coating of for a solar thermal collector. Thus, for solar energy incident on upper transition pan 1706, about 90% of the heat from incident solar energy can be absorbed.

The transition along the slope of the surface or roof on which PV column 1700 is installed can thereby create a temperature gradient, hotter toward the bottom and cooler toward the top, such that convective air motion 1708 is increased or supplemented. Convective air motion 1708 can aid in cooling the overall solar panel array of which PV column 1700 is a part of, as well as an underlying roofing surface.

Figure 18:
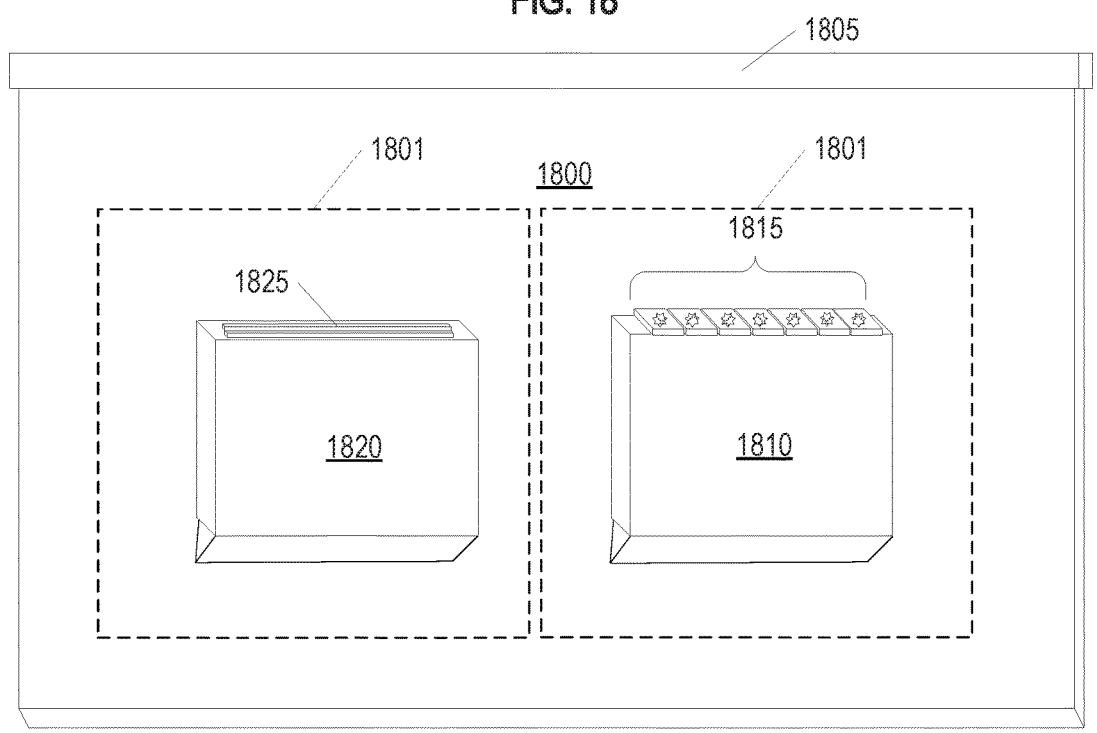
FIG. 18 shows a schematic representation of vent modules, in accordance with various embodiments of this technology.

FIG. 18 shows a schematic representation of a pair of vent modules according to embodiments. Two vent modules are shown in FIG. 18, active vent module 1810 and passive vent module 1820. Both versions are configured to draw air from underneath PV modules 1801 of a BIPV system without penetrating underlying roof 1800 or ventilating an attic beneath roof 1800. Either embodiment of the vent can be positioned at, along, or under top rows of roofing structures (e.g. underneath PV modules 1801) proximate to ridge 1805 of roof 1800 such that the air drawn by either active vent module 1810 or passive vent module 1820 exits underlying roof 1800 structure before reaching ridge 1805. Active vent module 1810 can include fans 1815 installed along its width to draw air into and through active vent module 1810. Passive vent module 1820 can include vent slots 1825, which can be either horizontal or vertical slots along width of passive vent module 1820.

In further aspects, either active vent module 1810 or passive vent module 1820 can be positioned toward the bottom or eave of roof 1800, to provide for an air inlet. Accordingly, air can be drawn into a space underlying PV modules 1801 by active vent modules 1810 or passive vent modules 1820 at bottom of roof 1800, generally cooling PV modules 1801. Similarly, heated or ambient hot air can egress through active vent modules 1810 or passive vent modules 1820 proximate to top of roof 1800, similarly cooling PV modules 1801.

On-Roof Embodiment

In several embodiments, photovoltaic modules and assemblies of photovoltaic modules and supporting structural pans for photovoltaic modules can be constructed to be elevated from the surface of a roof as part of a solar panel array—in other words, as part of an "on-roof" photovoltaic system. As used herein, on-roof systems are a type of BIPV in which the PV portion of the system resides outside the building envelope. Non-PV components such as metal support pans still make up the roof, but the PV modules are installed on top of those components. In such on-roof systems, water may in some embodiments be able to pass under the PV modules while remaining above the support pans.

As with other BIPV systems according to the various embodiments, on-roof solar panel arrays and systems provide the advantage of being capable of being installed on a wide variety of pre-existing roofs or other surfaces, with flexibility and modularity in application. Also, electrical connections, junction boxes, and wiring can be generally housed underneath photovoltaic modules of such photovoltaic assemblies, optionally within spaces between a photovoltaic modules and a supporting structural pan, protecting such components from precipitation, wind, and excess heat, and further hiding such components from an observer so as to make the overall photovoltaic system visually attractive or uniform. One advantage of this is that wiring that is outside the building envelope (i.e., above the support pans) does not have to be enclosed in conduit, which may simplify wire management as well as reduce costs. In some embodiments, supporting structural pans for such on-roof installations can be corrugated metal pans, where the spaces provided within the corrugations can be efficiently used for wiring connections and other components of a solar panel array. As with other embodiments, photovoltaic modules used for on-roof installations considered herein may use crystalline photovoltaic laminates, then film, perskovite, or other photovoltaic technology.

Figure 19A:
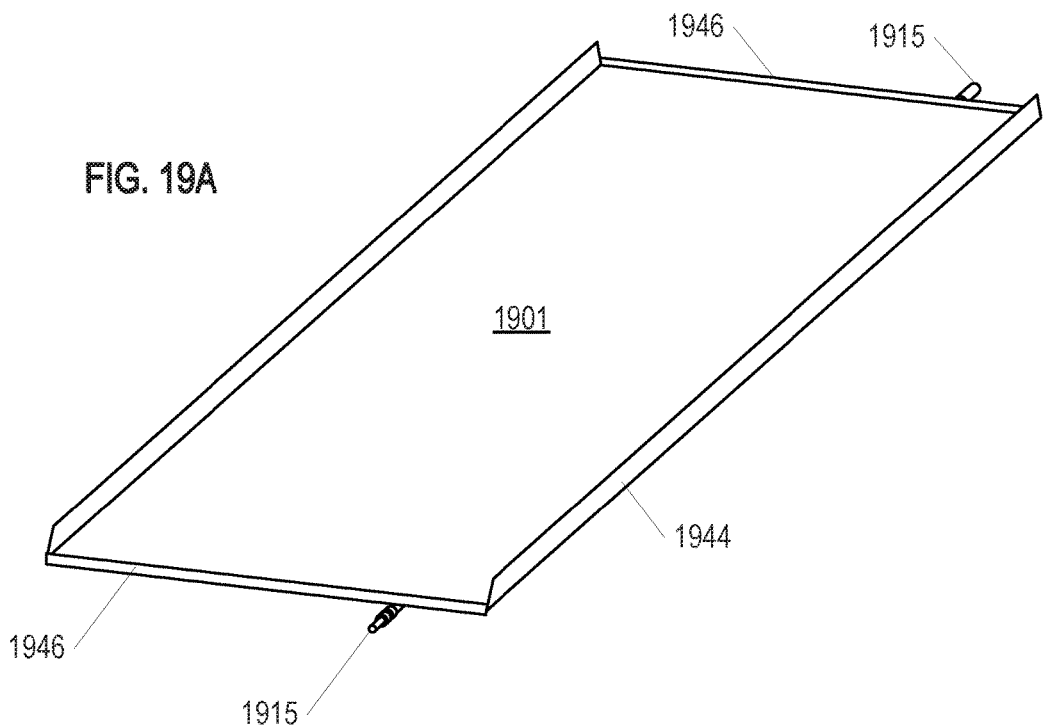
FIG. 19A shows a perspective view of a PV module with attached rails, in accordance with certain embodiments.
Figure 19B:
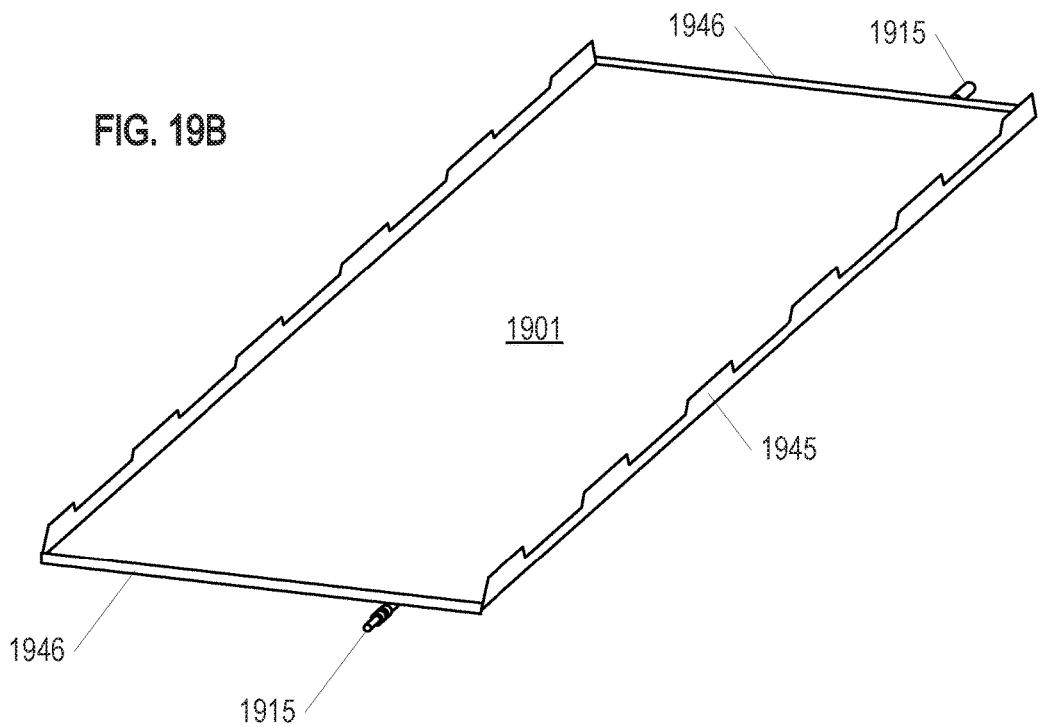
FIG. 19B shows a perspective view of another PV module with attached rails, in accordance with certain embodiments.

According to certain embodiments, as is described with respect to FIGS. 19A-24C, PV modules 1901 can include standing rails (e.g., metal "wings", brackets, seams, or tabs) bonded or otherwise attached to opposing sides of PV modules 1901 (e.g., backsheet of the modules, laminate) along either long edge of the module. FIG. 19A shows a perspective view of PV module 1901 with attached rails 1944. Alternatively, FIG. 19B shows a perspective view of PV module 1901 with attached turreted rails 1945. PV module 1901 shown in FIG. 19A and FIG. 19B has trim 1946 on both end edges and electrical connections 1915 extending from underneath.

FIG. 19C shows an exploded view, illustrating certain components of PV module 1901 with respect to certain embodiments. Either continuous rails 1944 or turreted rails 1945 can be used with module 1901 and mechanically fastened or coupled to the corresponding standing seams of a PV pan to attach PV module 1901 to PV pan 1920. In many embodiments, PV module 1901 will have standing rails on either longitudinal side of PV module 1901. In alternative embodiments, PV module 1901 can have a standing rail on one side be continuous the standing rail on the opposing side is turreted. In some embodiments, PV modules 1901 can further include end edge trims 1946 (e.g., gasket or sealing member made of rubber or other suitable materials) attached to top and/or bottom edges of the PV module as seen in FIG. 19C. Trims 1946 can protect PV modules 1901 during transport, installation, and assembly, as well as preventing the ingress of dust and debris when the module is installed end-to-end against another PV module in a column. As described above, thin pads can be attached to the backside of PV module 1901 such that PV module 1901 is not in direct contact with an upper surface of PV pan 1920 supporting PV module 1901, for example, with a ridge surface of a corrugated PV pan, when installed.

As shown in FIGS. 20A-24C, seam clips 1932 can secure the corresponding seams of adjacent pans together (in these Figures, only one pan seam is shown for clarity) as described above with respect to the embodiment of FIGS. 4A-4G. As shown, FIG. 20A shows a perspective view of PV pan 1920, specifically a corrugated support pan, with seam clips 1932 alongside standing PV seams 1914 on both longitudinal sides of PV pan 1920. FIG. 20B shows a cross-sectional view of the left side of FIG. 20A, illustrating the interface between seam claim 1932, bottom surface 1924 of PV pan 1920, top surface 1922 of PV pan 1920, and seam 1914. FIG. 20C shows a detail perspective view of first tab 1932C and second tab 1932D of seam clip 1932 alongside seam 1914, where both first tab 1932C and second tab 1932D are unbent and not yet interlocked with seam 1914.

FIG. 21A shows a perspective view of PV pan 1920, with PV module 1901 resting on top of the peaks forming top surface 1922 of PV pan 1920. PV module 1901 is also shown with continuous rails 1944 attached along its length, protruding slightly above PV pan seams 1914 due to tabs 1932C and 1932D. FIG. 21B shows a partial detail view of FIG. 21A, further showing pads 1942 between top surface 1922 of PV pan 1920 and the underside of PV module 1901, positioned to both adjust the height of PV module 1901 as it rests on PV pan 1920 and to optionally protect PV module 1901 from potential damage at the interface of PV module 1901 and the metal support pan. Additionally, junction box 1917, affixed to the backside of module 1901 is shown with electrical connection 1915 extending therefrom, being electrically coupled with the photovoltaic cells of PV module 1901 for the collection and transmission of electricity.

FIG. 22A shows a perspective view of PV pan 1920, with PV module 1901 resting and locked into place on top of the corrugation peaks forming top surface of PV pan 1922. Seam clips 1932 alongside standing PV pan seams 1914 and continuous rails 1944 on both longitudinal sides of PV pan 1920 are in a bent configuration so as to lock PV module 1901 into a mounted position with PV pan 1920. FIG. 22B shows a cross-section view of the left side of FIG. 22A, illustrating the interface between seam slip 1932, particularly first tab 1932C bent over both PV pan seam 1914 and continuous rail 1944, thereby locking into place PV module 1901 onto PV pan 1920 (with padding 1942 in between). FIG. 22C shows a detail perspective view of first tab 1932C bent over continuous rail 1944 in a locking configuration, and second tab 1932D of seam clip 1932 bent in the opposite direction where (not shown) second tab 1932D could lock an adjacent PV module and PV pan assembly into place or a non-PV or dummy pan.

FIG. 23A shows a cross-sectional view of PV module 1901, seam clips 1932, and PV pan 1920 interlocked together, further including seam cover 1936 fitting over interlocked PV pan seam 1914 and continuous rail 1944 as secured by first tab 1932C. FIG. 23B shows a detail view of the same at the left side the structure shown in FIG. 23A. As shown, seam cover 1936 fits over both PV pan seam 1914 and continuous rail 1944, providing additional structural strength to the interlocked assembly and also additional protection from precipitation, wind, or other debris in the environment from fitting into, past, or under the assembly. Further, seam cover 1936 has engagement portions 1938 at the distal end on either side configured to interface with both of first tab 1932C and second tab 1932D of seam clip 1932.

Further shown are thin pads 1942 (e.g., VHB tape, rubber, foam) that can be attached to the backside (e.g., backsheet) of PV module 1901 such that PV module 1901 is not in direct contact with an upper surface (e.g., ridge surfaces 1922) of PV pan 1920 (e.g., a corrugated support pan) when installed onto PV pan 1920. In some embodiments, pads 1942 can be attached to upper surfaces 1922 rather than the underside of PV module 1901. As noted above, pads 1942 can also help set the height of PV module 1901. As further shown, lower surface 1924 of PV pan 1920 forms a corner or bend with seam clip 1932 and PV pan seam 1914. The surface can be substantially flat and lay on top of the roof surface, forming planar foot portion 1948. Planar foot portion 1948, the bottom of the far right corner of PV pan 1920, can provide support for a standing seam against a roof surface, for example, when an installer steps on an installed module or pan. Further, a bent or hooked portion (e.g., hemmed portion) of PV pan 1920 or other structure (e.g., curled or angled clip) at the top and/or bottom edge of a column can be used to secure the pan to, or "catch", for example, a flashing, another pan, or other roof surface to maintain the vertical or North-South position of PV module 1901 and/or non-PV modules 1910 (e.g. dummy modules) in the column. Other suitable mounting portions or feet can also be integrated with the PV pan 1920 for mounting PV pan 1920 to a roof as described above.

In some embodiments, after standing seams (either non-PV pan seams 1912 or PV pan seams 1914) have been interlocked with seam clips 1932, further PV modules 1901 with rails can be installed or laid onto PV pans 1920, forming a column or row of PV modules 1901. Similarly, non-PV modules 1910 (e.g. dummy modules, transition pans, standard roof pans) can be laid down as part of a row or column of structural elements proximate to, and/or in in line with, PV modules 1901. Seam cover 1936 can be attached as described above over rail surfaces and seam clips 1932 of such PV modules 1901 and non-PV pan 1910 components, using a snap-fit, rivets, screws, bolts or other fasteners as appropriate. Seam cover 1936 not only helps secure the PV pan seams 1914 and/or non-PV pan seams 1912 together and block out water or other precipitation (e.g., from flowing over tops of standing seams), but also substantially maintains the horizontal or side-to-side (e.g., East-West) position of PV module 1901 within PV pan 1920 and adds to the overall aesthetic by providing a uniform finish that conceals the intersection of seams 1912, 1914 and clips 1932. In other embodiments, seam clips 1932 can be folded over to couple both the respective seams of adjacent pans to each other as well as rail portions of PV modules 1901 to PV pan seams 1914 while simultaneously maintaining the position of PV module 1901 within PV pan 1920. Although shown in the Figures as having a substantially L-shaped cross section, rails 1944 can have other suitable cross sectional shapes, including one dimensional strips that are affixed to only to the sides of PV modules 1901.

As shown in FIGS. 24A and 24B, for some embodiments non-PV pans 1910, specifically dummy modules 1905 (e.g., glass, non-PV, roof pans, sheet metal, etc.) can also be installed on PV pans 1920 in the same column as PV modules 1901, for example and the top and bottom of each column of PV modules. In certain embodiments, dummy modules 1905 can be roof pans with pre-formed seams as described above. Non-PV (roof) pans 1910 or dummy modules 1905 can be laid down or positioned onto PV pan 1920—in other words, non-PV pans 1910 and dummy modules 1905 do not necessarily need to be mounted on battens, but rather can also make use of the structure and support provided by PV pans 1920. The seams of non-PV pan 1910 can be secured to the seams of PV pan 1920 with one or more seam clips 1932. Spacer strips of padding 1942 (e.g., foam, rubber) can be adhered to the upper ridge surfaces of non-PV pan 1920, configured to lay out so as to elevate non-PV pan 1910 to a uniform height substantially level with PV module 1901. In columns of roof where no PV module is desired, PV pan 1920 (e.g. corrugated pan) and non-PV pan 1910 (e.g. roof pan or dummy pan 1905) can still be installed together. In other embodiments, non-PV pans 1910 can be installed onto battens as described above so that they are at substantially the same height above the roof as the PV modules 1901 on PV pans 1920.

FIG. 24C shows a perspective view of a portion of a column of a BIPV system including two or more modules (e.g., two PV modules 1901, one PV module 1901 and one dummy module 1905, one PV module 1901 and one roof pan 1910, etc.). As shown, a plurality of modules (e.g., PV modules with rails or roof pans with seams) can be positioned onto pans 1920 and secured to a roof via clips 1932 and cover 1936 to form a column of PV modules and/or non-PV pans. Multiple columns can be installed side-by-side to cover a portion of or the entire roof surface. Seams clips 1932 can secure PV modules 1901 or non-PV pans 1910 to PV pans 1920. Seam cap or cover 1936 can then be secured over and to clips 1932, standing seams, and rails coupled to PV modules 1901. Where appropriate and/or necessary, trim 1946 can be positioned between adjacent PV modules 1901 or non-PV pans 1910 within the same column as defined by PV pan 1920.

FIGS. 24A-24C further show that the mounting arrangement of PV modules 1901, dummy modules 1905, and non-PV pans 1910 on or above PV pans 1920 or other structural support pans can allow for all panels or modules of a mounted array system to have a substantively uniform, planar surface. In other words, through the various embodiments of the disclosure, each of PV modules 1901, dummy modules 1905, and non-PV pans 1910 can be set at a uniform height across the area of the array system, such that the appearance of the array is aesthetically pleasing and such that the energy-collecting members of the array are positioned in efficient orientations.

Figure 25:
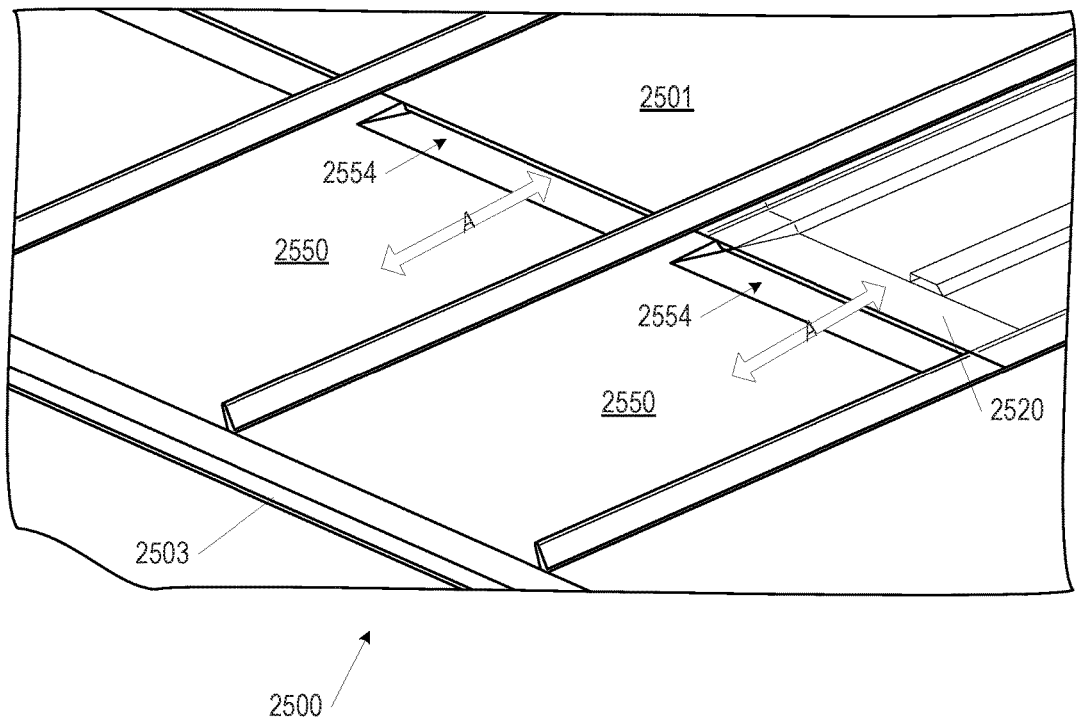
FIG. 25 and FIG. 26 show transition pans forming openings within a photovoltaic array configured for the passage of precipitation and airflow, according to various embodiments.
Figure 26:
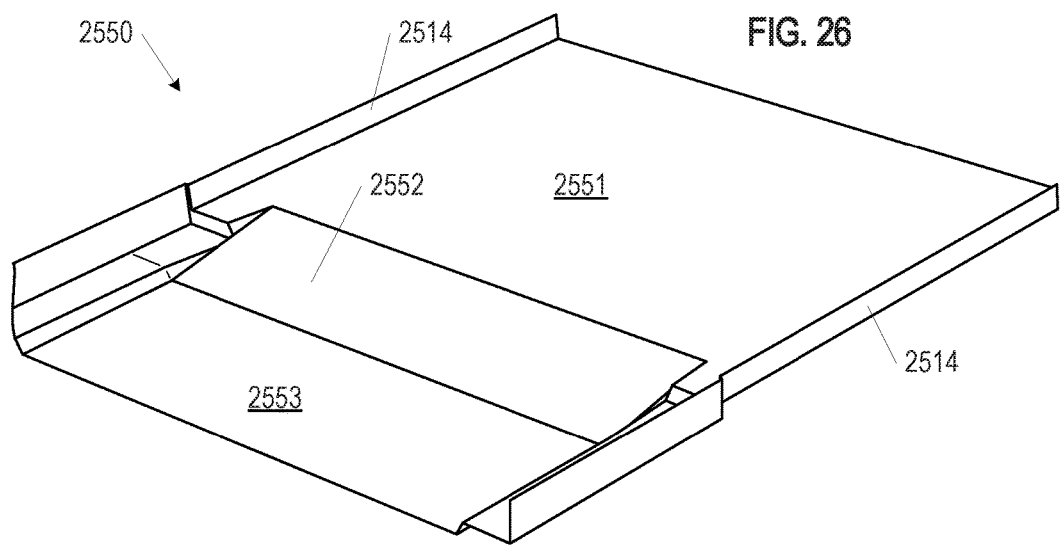

FIG. 25 is a perspective view of a portion of BIPV system 2500 that includes transition or adapter pans 2550, and FIG. 26 is a perspective view of transition pan 2550 according to various embodiments. Transition pan 2550 can be used with the various systems as described herein. Transition pan 2550 includes ramped (e.g., inclined, sloped) surface 2552 that is tilted at an angle relative to the roof surface that BIPV system 2500 is positioned on. Transition pan 2550 can be positioned in columns having PV modules 2501, for example, proximate to a bottom edge of pan 2520 at a down-roof portion of BIPV system 2500 relative to PV module 2501 near roof eave 2503. (In FIG. 25, the rightmost PV module 2501 is removed so as to more clearly show underlying PV pan 2520.) In various embodiments, ramped surface 2552 forms or creates opening 2554 between PV module 2501 and transition pan 2550. Opening 2554 allows air A to enter or exit and flow under the column of PV modules 2501 attached to pans 2520. Airflow through the column can exit, for example, through openings in a ridge cap or ridge vent at the top of the array. Additionally, water running down upper surface of pans 2520 (e.g., along the roof from ridge to eave or down-roof in the downward direction of arrows A, opposite of airflow up-roof through the column) under module 2501 can exit out opening 2554. For example, if PV modules 2501 are adhered to pans 2520 of the BIPV systems 2500 described herein with a non-water tight seal (e.g., hook and loop), water that flows under PV module 2501 can flow down a column in between the PV module 2501 and pan 2520 and exit out through the transition pans 2550 under the pull of gravity.

Transition pan 2550 can include step portions, upper step portion 2551 and lower step portion 2553, on opposing sides of ramped surface 2552. A front or down-roof portion of PV module 2550 or pan 2520 can be positioned at or about step 2552 portion such that a top of PV module 2501 is uniform or substantially uniform (e.g., coplanar) in elevation with the top of step portion 2551. As seen, in several aspects, PV module 2501 can lap or overlap a portion of transition pan 2550. Further, transition pan 2550 can also include standing seam portions 2514 configured to be secured to standing seams of other PV pans, standing seams of non-PV pans, and/or rails of photovoltaic modules. In various embodiments, such standing seams 2514 of transition pan 2550 can be positioned laterally outward, or on exterior sides of, the corresponding seams of lapped pan 2520.

Transition pans 2550 can be used in BIPV systems having either built-in PV module-pan assemblies or on-roof PV modules 2501 and pans 2520 as shown. In particular, for on-roof embodiments, transition pans 2550 and openings 2554 formed by transition pans 2550 can reduce the effect of wind uplift on BIPV system 2500. By allowing air flow to enter opening 2254 and pass under PV modules 2501 upward and out of up-roof vent(s), the wind is not trapped beneath any particular column or region of PV module-pan assemblies or roof pans, and thus uplift strain is reduced on BIPV system 2500. This will also allow wind to remove heat from under the array. Similarly, allowing for precipitation to pass out from under PV modules 2501 through openings 2554 formed by transition pans 2550 can reduce the amount of water or pooling on any given PV module 2501, thereby minimizing water damage to BIPV system 2500 and/or to the roof.

Transition pan 2550 can also be positioned by an upper edge of a PV pan or column at an up-roof portion of the system near the roof ridge if oriented so that ramp 2552 points down-roof. Such a transition pan can be configured similarly to a substantially flat or planar roof pan with standing seams that can be secured to seams of a PV pan as noted above. A portion of transition pan 2550 (e.g., a down-roof portion) can be lapped over a portion of the down-roof PV module pan. In certain embodiments, the seams of the up-roof or ridge transition pan are positioned on laterally inward or interior sides of the corresponding seams of the PV pan to prevent water from reaching the roof surface.

FIGS. 27A-29G show other various embodiments of on-roof photovoltaic assemblies having PV modules and PV pans that can be provided with systems as described herein. In some embodiments, such assemblies can allow water to flow between PV modules and PV pans and exit out, for example, through transition pans at the eave of the roof. In some embodiments, PV modules may be attached to PV pans in non-water tight or sealed manners.

FIGS. 27A-27E show photovoltaic assemblies including columns of PV panels according to various embodiments. PV pans 2720 can be pre-installed or mounted to the roof surface before installing PV modules 2701. In some embodiments, PV pans 2720 can have mounting portions 2762A, 2762B on opposing lateral side portions of PV pan 2720 for supporting and securing PV modules 2701. In such embodiments, PV modules 2701 can be provided with mounting clips 2763A, 2763B (e.g. hinge clips, latch clips) configured to secure PV module 2701 to corresponding mounting portions 2762A, 2762B of PV pans 2720.

Standing seams 2714 can rise between columns of PV modules 2701 mounted to PV pans 2720, as described above. Such standing seams 2714 can include seam covers 2736 that can connect to other structural elements of various PV pans 2720 or non-PV pans 2710, as well as provide protection from precipitation or wind from getting underneath PV pans 2701. In various embodiments, standing seams 2714 are only on PV pans 2720, non-PV pans and transition pans, but not on modules 2701, because they are secured to pans 2720 with clips 2763A/B and 2762A/B. However, seam covers 2736 may further secure PV modules 2701 to pans 2720 by preventing them from moving upwards away from pans 2720.

Figure 27A:
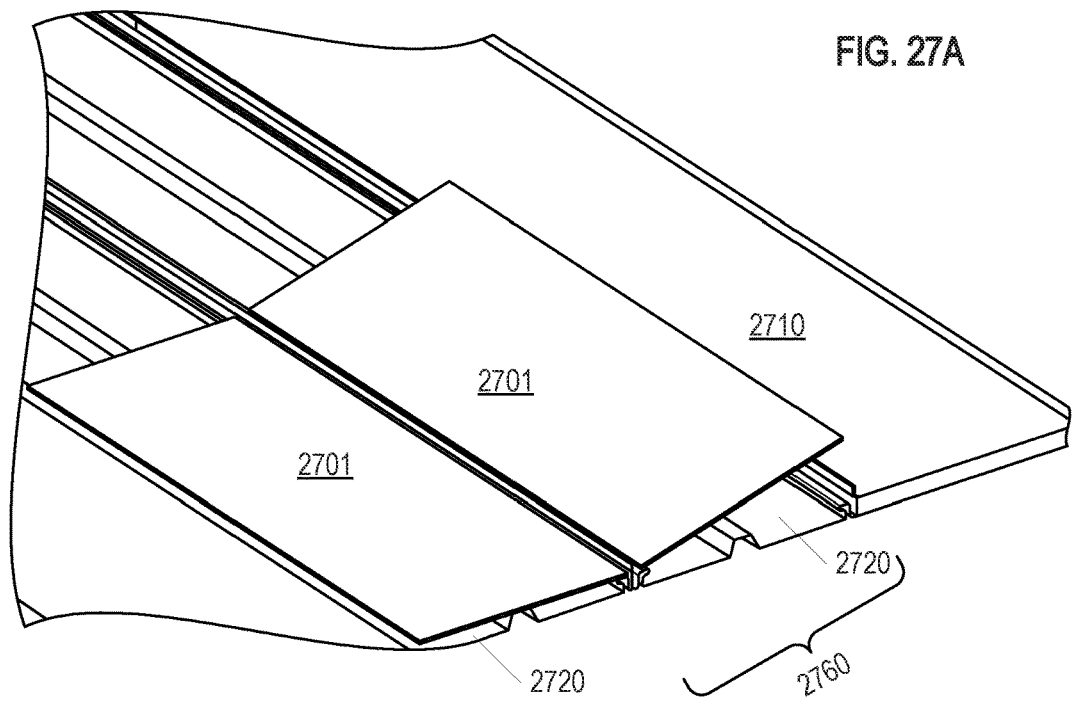
Figure 27B:
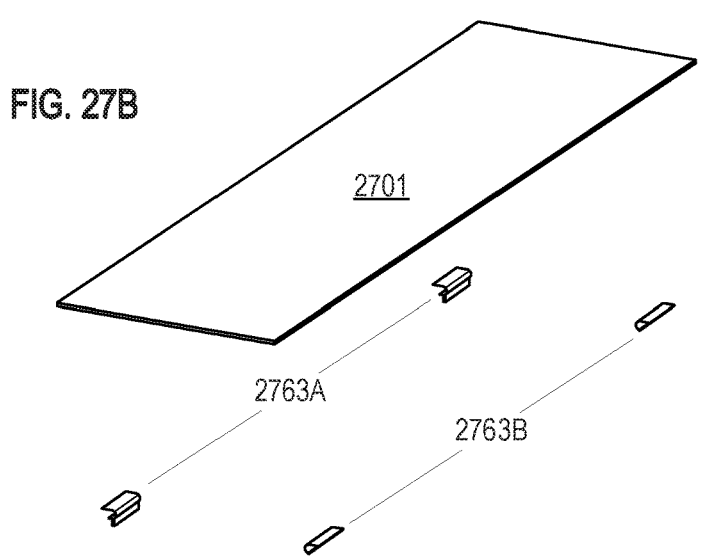
Figure 27C:
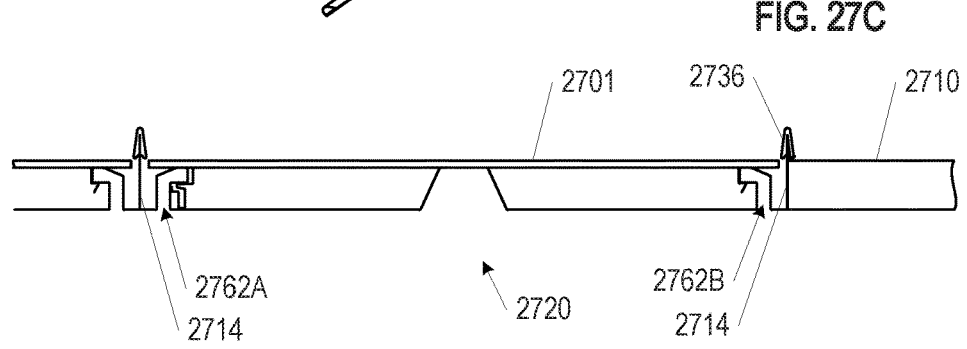

In certain embodiments, underside of PV module 2701 includes first mounting clip 2763A on one edge of the underside, clip 2763A being a hinge clip and PV module 2701 includes second mounting clip 2763B on the opposite edge of the underside, clip 2763B being a latch clip (see, e.g., FIGS. 27B-27C). PV modules 2701 can be dropped in (e.g., rotated or pivoted) to PV pan 2720 mounting portions 2762A/B. For example, first side of PV module 2701 with first mounting clip 2763A can be secured to first mounting portion 2762A of pan 2770. An installer can push PV module 2701 in a first direction towards the corresponding first side of pan 2720 such that first mounting clip 2763A (hinge clip) is secured to first mounting portion 2762A of pan 2720. Next, the installer can drop in second side of PV module 2701 such that second mounting clip 2763B (latch clip) is secured to second mounting portion 2762B of pan 2720 to couple PV module 2701 to PV pan 2720. FIG. 27D shows a stage of assembly of PV module 2701 to PV pan 2720, in a secured configuration, with a space between first mounting clip 2763A and first mounting portion 2762A and with second mounting portion 2762B being effectively flush with second mounting portion 2762B.

In order to remove PV module 2701 (e.g., for repair or replacement), PV module 2701 can be pushed in first direction identified by the arrow A in FIG. 27E. The installer can then lift second side of PV module 2710 and then first side of PV module 2710. FIG. 27D shows a stage of disassembly of PV module 2701 from PV pan 2720, with a space between second mounting portion 2762B and second mounting portion 2763B and with first mounting portion 2762A being effectively flush with first mounting clip 2763A.

FIGS. 28A-28H show another embodiment of photovoltaic assembly 2860 as part of solar panel system 2800 according to other embodiments of the disclosure. Both PV pans 2820 and PV modules 2801 include structural rails, pan rails 2822 and module rails 2802, respectively. PV pans 2820 include pan rails 2822 attached to upper surface of PV pans, which are configured to be oriented toward PV module 2801 when coupled to PV pan 2820. PV module 2801 includes module rails 2802 attached to lower surface of PV module 2801 that are oriented towards PV pan 2820 when PV module 2801 is mounted onto PV pan 2820. Pan rails 2822 and module rails 2802 an be glued or otherwise adhered or secured to pan 2820 and PV module 2801 surfaces, respectively. In some embodiments, module rails 2802 and pan rails 2820 pan can be set on or mounted on each other. In other embodiments, module rails 2802 and pan rails 2820 pan can run parallel alongside or be mounted next to each other. In various embodiments, solar panel system 2800 can include non-PV modules 2810 laid alongside photovoltaic assemblies 2860 on a roof.

Figure 28A:
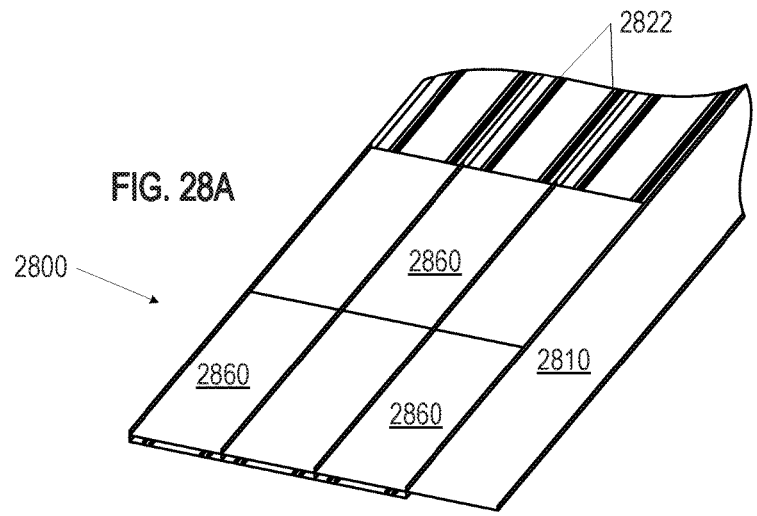
FIGS. 28A-28H show rail mounted assembly features for photovoltaic module assemblies according to various embodiments.
Figure 28B:
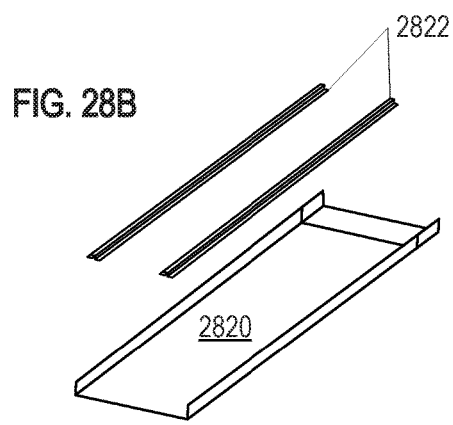
Figure 28C:
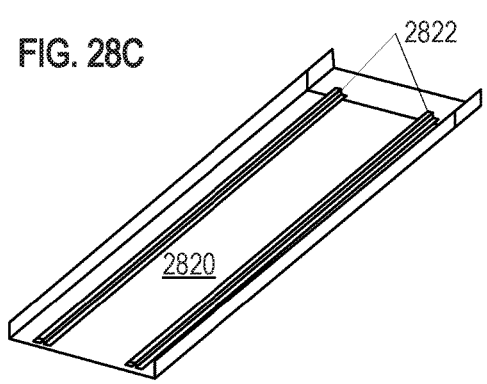
Figure 28D:
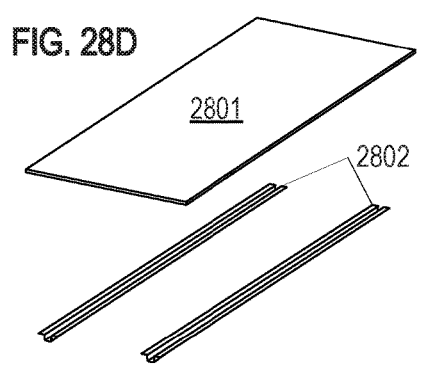
Figure 28E:
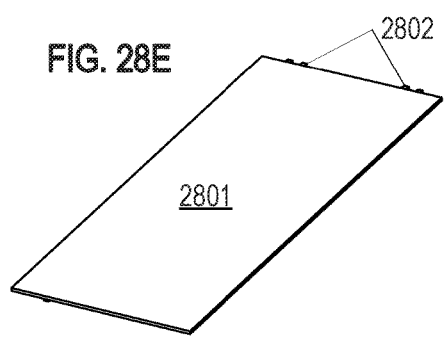
Figure 28F:
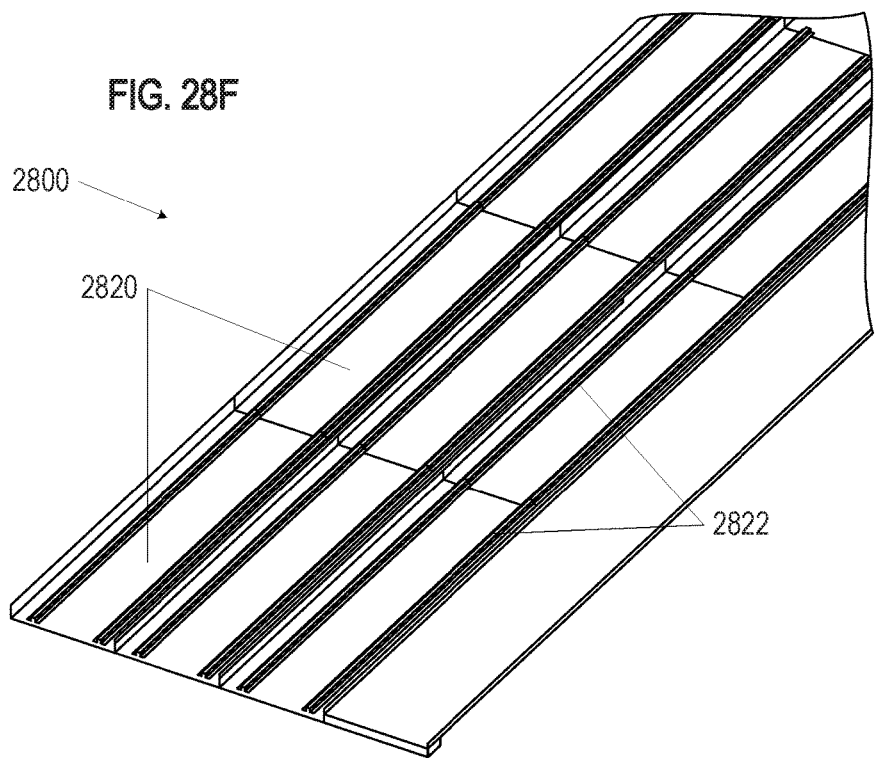
Figure 28G:
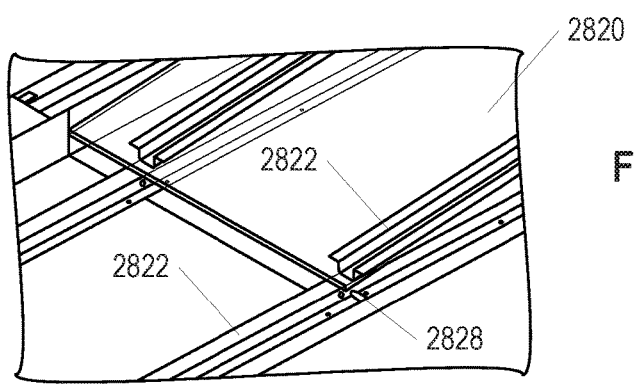
Figure 28H:
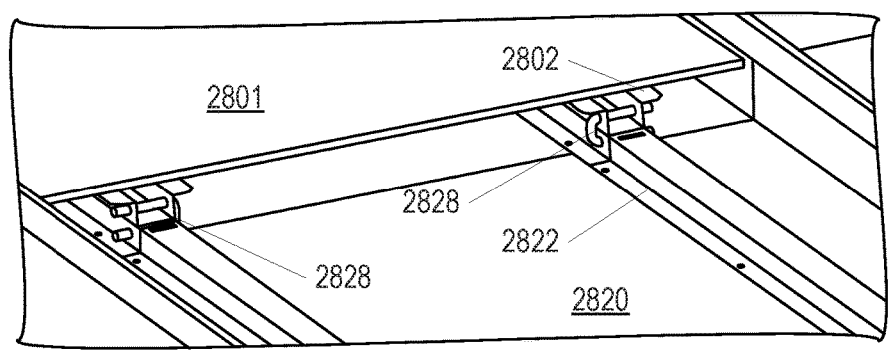

In some aspects, down-roof end portion of pan rails 2802 can have tabs or other male coupling portions (e.g., hook, projection) configured to be inserted into slots or other female coupling portions (e.g., hole, recess). Up-roof portions of PV module 2801 and up-roof end portions of pan rails 2802 can have female coupling portions configured to receive both male coupling portions and fastener 2828 (e.g. pins). As seen in FIGS. 28F-28H, when pan rails 2822 are bonded to PV pan 2820 and module rails 2802 are bonded to PV module 2801, PV module 2801 and PV pan 2520 can be secured together with fasteners 2828 mechanically coupling male coupling portions and female coupling portions of either or both of pan rails 2802 and module rails 2802, forming complete photovoltaic assembly 2860. In other embodiments, coupling positions can be reversed. As noted above, PV pans 2820 can be tiled and secured onto roof surface prior to installation of PV modules 2801 onto PV pans 2820.

Figure 29A:
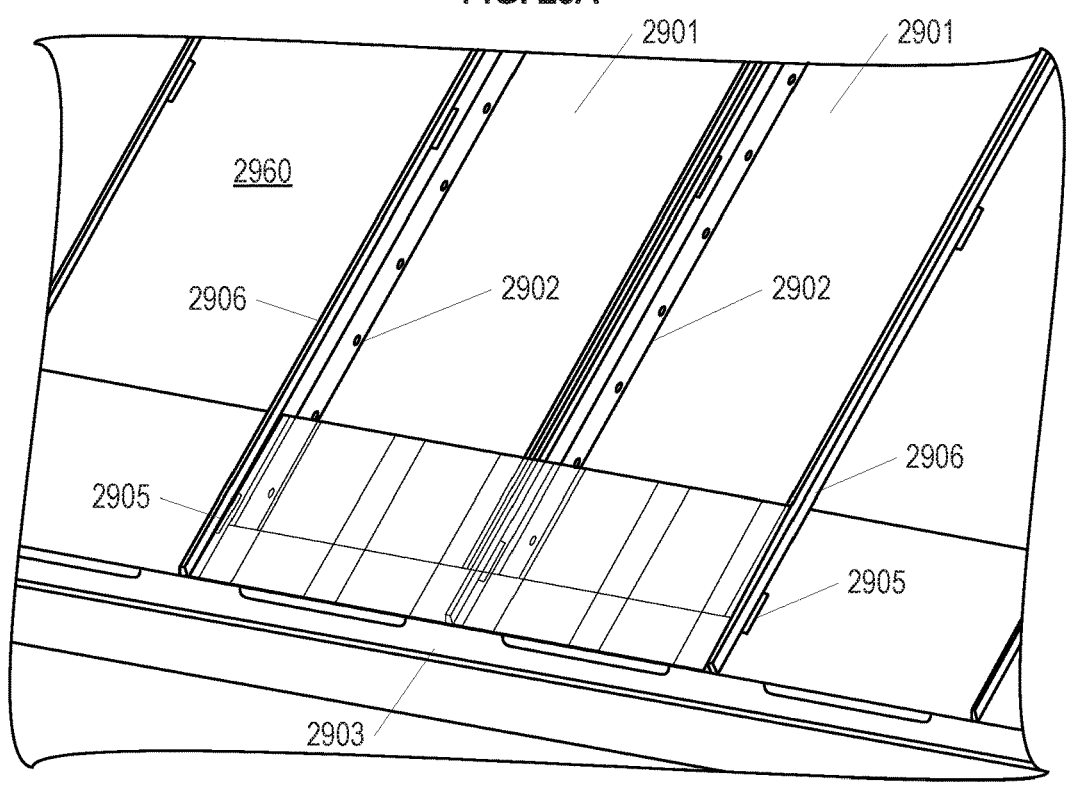
FIGS. 29A-29B show assembly features for photovoltaic module assemblies mounted without support pan structures according to various embodiments.
Figure 29B:
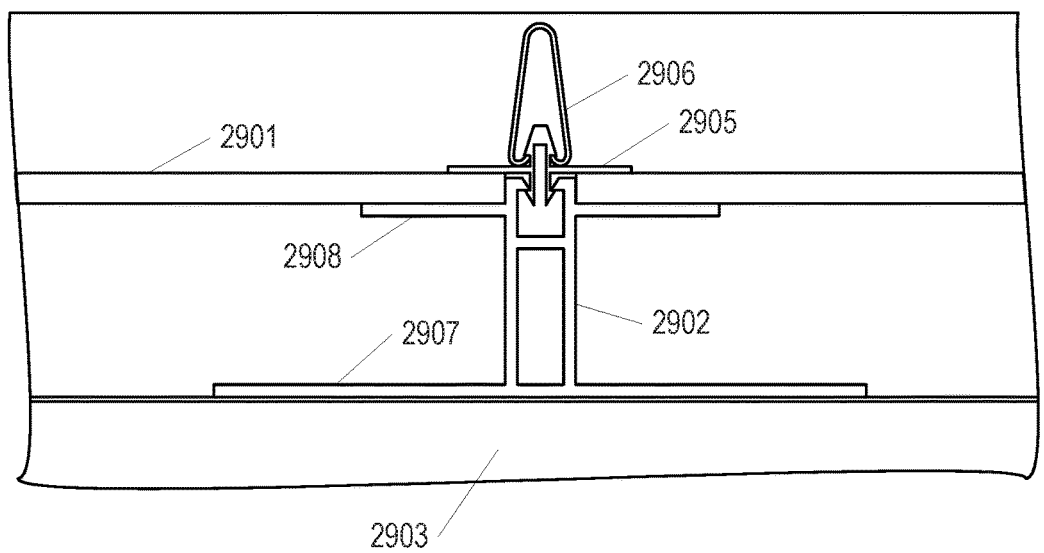

FIGS. 29A and 29B show another embodiment of PV pan assembly 2960 for on-roof installations. In this embodiment, instead of dedicated photovoltaic support pans, columns of mounting rails 2902 can be secured directly to roof surface 2903. Mounting rails 2902 can have substantially I-shaped cross-sections. Base portion 2907 of mounting rail 2902 can be mounted or otherwise secured to roof surface 2903. Upper portion 2908 of mounting rail 2902 can receive lateral side portions of PV modules 2901 in adjacent columns. Panel clip 2905 or other suitable fastener can secure PV module 2901 to mounting rails 2902 (PV modules 2901 being represented as transparent so as to view underlying mounting rails 2902). Seam cap 2906 can be received by or secured to panel clip 2905 further securing modules 2901 in place. Accordingly, in such embodiments, a support pan may not be provided.

Figure 30:
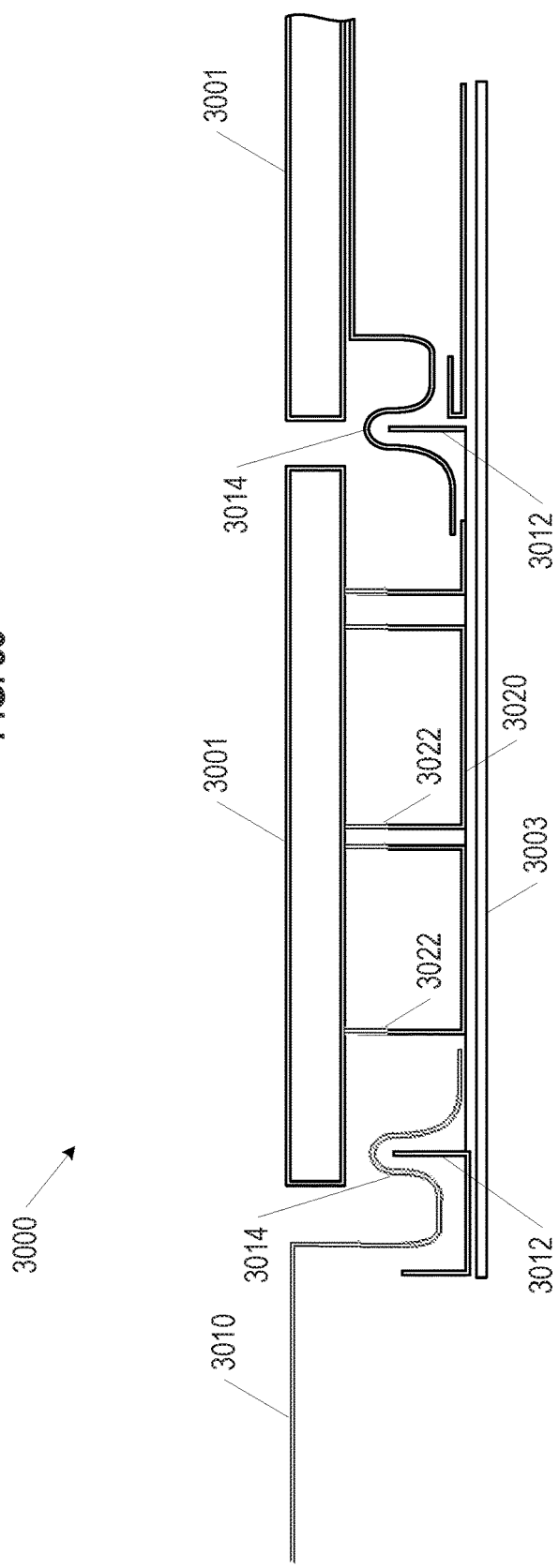
FIG. 30 shows a PV module-pan assembly using inverted seam structures according to various embodiments.

In another embodiment, shown in detail in FIG. 30, rather than a standing seam, the system relies on inverted seams, in other words, seams that point downward toward the roof surface. For purposes of this disclosure and claims, inverted seams 3014 can be understood as seams that extend below PV module 3001. In various embodiments, inverted seams may be used with PV pans 3020. As shown schematically in FIG. 30, inverted seams 3014 do not extend above PV module 3001 or the planar surface of roof pan 3010 (and thus are not called "standing" seams). PV modules 3001 can be positioned on discrete mounting feet 3022 (e.g., posts, projections, Z-shaped mounts, spacers, stand-offs) coupled or extending from planar roof mounting surface portion (e.g., PV pan 3020). Mounting surface portions 3012 (e.g., seams, tabs) can be coupled (e.g., interlocked) to seams of adjacent roof pan 3010 or PV pan 3020. Inverted seams 3014 of PV module 3001 can be positioned on supporting PV pans 3020, covering adjacent mounting surface portions 3012 of PV pans 3020, and optionally roof pan portions 3010. In other words, inverted seams 3014 can be understood as analogous to seam covers, but positioned below the substantively planar surface of overall solar panel array 3000 or system. Accordingly, the structure and appearance of solar panel array 3000 can be generally planar and uniform, without seams rising up above the surface of PV module 3001 surfaces or roof pan 3010 surfaces. In some aspects, inverted seams 3014 can rise up into gaps between PV modules 3001 and/or roof pans 3010, level with those structures, filling intermediate spaces. In other aspects, inverted seams 3014 can have a maximum height that remains below the surface of PV modules 3001 and/or roof pans 3010, and other spacers or gap fillers (not shown) can fill in any gaps between PV modules 3001 or roof panels 3010 as needed.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A solar roof assembly, comprising:
   a support material covering a portion of a roof surface;
   a plurality of standing seam metal roof pans arranged in columns on the roof surface over the support material such that a top surface of each of the metal roof pans is elevated at a first height above the roof surface;
   a plurality of support pans arranged in columns on the roof surface adjacent to at least one column of standing seam metal roof pan, each support pan comprising a pair of standing seams running a length of each side edge thereof and having a plurality of ridges and valleys and between each side edge;
   a plurality of photovoltaic modules arranged end to end in columns over the plurality of support pans on the plurality of ridges such that the plurality of photovoltaic modules covers the plurality of ridges and valleys of the underlying plurality support pans, wherein each of the plurality of photovoltaic modules comprises an electrical connection that is disposed within a valley of an underlying support pan;
   at least one transition pan in each column of photovoltaic modules down-roof from the last photovoltaic module, the at least one transition pan comprising a pair of standing seams running a length of each side edge and a lapping portion extending under the corresponding up-roof support pan; and
   a seam cap covering all standing seam portions of adjacent pans,
   wherein each of the support pans elevates a top surface of a respective photovoltaic module thereon to the first height above the roof surface.

2. The solar roof assembly of claim 1, wherein the plurality of standing seam metal roof pans comprise one or more of non-photovoltaic pans, dummy pans, or roof pans.

3. The solar roof assembly of claim 1, further comprising at least a first seam clip and a second seam clip attached to the photovoltaic modules, configured to mechanically couple with a first standing seam portion and a second standing seam portion, of the metal roof pans or the support pans.

4. The solar roof assembly of claim 3, wherein the seam clips include tab portions configured to bend away from each other and to cover metal roof pan portions or support pan portions on either side of the seam clips.

5. The solar roof assembly of claim 4, further comprising module rails bonded to the bottom surface of each of the photovoltaic modules, and pan rails bonded to the upper surface of each of the support pans.

6. The solar roof assembly of claim 1, further comprising a heat storage material positioned between at least one pairing of the photovoltaic modules and support pans, wherein the heat storage material comprises at least one compartment having a phase change material can transition from a first phase to a second phase at a transition temperature.

7. The solar roof assembly of claim 6, wherein the support pan further comprises stand-off sections forming one or more wells in which pouches of heat storage material are contained.

8. The solar roof assembly of claim 1, further comprising at least one transition pan in each column of photovoltaic modules up-roof from the photovoltaic module closest to a roof ridge, the at least one up-roof transition pan comprising a pair of standing seams running a length of each side edge and a lapping portion extending under the corresponding down-roof support pan, wherein up-roof transition are configured to form openings to allow heat to escape from underneath the plurality of photovoltaic modules.

9. The solar roof assembly of claim 1, wherein the transition pans in each column of photovoltaic modules down-roof from the last photovoltaic module further comprise down-roof transition pans proximate the roof eave, the down-roof transition pans configured to form openings to allow for precipitation drainage and airflow underneath the photovoltaic module.

10. The solar roof assembly of claim 1, further comprising one or more non-photovoltaic modules within one or more of the columns photovoltaic modules, the one or more non-photovoltaic modules being configured to mimic the appearance of the photovoltaic modules.

11. The solar roof assembly of claim 1, wherein the seam covers, the photovoltaic modules, the standing seam metal roof pans, and the transition pans form a surface with a generally uniform appearance.

12. The solar roof assembly of claim 1, further comprising grounding clips configured to engage with and electrically ground one or more of the photovoltaic modules and the standing seam metal roof pans.

13. The solar roof assembly of claim 1, wherein each photovoltaic module further comprises bypass diodes configured to bypass one or more solar cell sub-strings affected by a shade pattern of one or more of the standing seams.

14. The solar roof assembly of claim 1, wherein the plurality of photovoltaic modules comprise crystalline-based solar cells.

15. A solar roof assembly for mounting on a roof surface comprising:
  a plurality of standing seam metal roof pans configured for mounting in columns on the roof surface such that a top surface of each of the metal roof pans is elevated at a first height above the roof surface;
  a plurality of support pans configured for mounting in columns on the roof surface adjacent to at least one column of metal roof pans, each support pan comprising a pair of standing seams running a length of each side edge thereof and having a plurality of ridges and valleys and between each side edge; and
  a plurality of photovoltaic modules configured for mounting end to end in columns over the plurality of support pans on the plurality of ridges such that the plurality of photovoltaic modules covers the plurality of ridges and valleys of the underlying plurality of support pans, wherein each of the plurality of photovoltaic modules comprises an electrical connection that is disposed within a valley of an underlying support pan;
  wherein each of the support pans elevates a top surface of a respective photovoltaic module thereon to the first height above the roof surface.

16. The solar roof assembly of claim 15, wherein the plurality of metal roof pans comprise one or more of non-photovoltaic pans, dummy pans, or roof pans.

17. The solar roof assembly of claim 15, further comprising at least a first seam clip and a second seam clip attached to the photovoltaic modules, configured to mechanically couple with a first seam portion and a second seam portion, of the metal roof pans or the support pans.

18. The solar roof assembly of claim 17, wherein the seam clips include tab portions configured to bend away from each other and to cover metal roof pan portions or support pan portions on either side of the seam clips.

19. The solar roof assembly of claim 18, further comprising module rails bonded to the bottom surface of each of the photovoltaic modules, and pan rails bonded to the upper surface of each of the support pans.

20. The solar roof assembly of claim 15, wherein the plurality of photovoltaic modules comprise crystalline-based solar cells.

* * * * *